US010056399B2

(12) United States Patent
Costa et al.

(10) Patent No.: US 10,056,399 B2
(45) Date of Patent: Aug. 21, 2018

(54) THREE-DIMENSIONAL MEMORY DEVICES CONTAINING INTER-TIER DUMMY MEMORY CELLS AND METHODS OF MAKING THE SAME

(71) Applicant: SANDISK TECHNOLOGIES LLC, Plano, TX (US)

(72) Inventors: Xiying Costa, San Jose, CA (US); Daxin Mao, Cupertino, CA (US); Christopher Petti, Mountain View, CA (US); Dana Lee, Saratoga, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/445,579

(22) Filed: Feb. 28, 2017

(65) Prior Publication Data

US 2018/0182771 A1 Jun. 28, 2018

Related U.S. Application Data

(60) Provisional application No. 62/437,944, filed on Dec. 22, 2016.

(51) Int. Cl.
*H01L 27/115* (2017.01)
*H01L 27/11524* (2017.01)
(Continued)

(52) U.S. Cl.
CPC .... *H01L 27/11524* (2013.01); *H01L 27/1157* (2013.01); *H01L 27/11519* (2013.01);
(Continued)

(58) Field of Classification Search
CPC ......... H01L 27/11524; H01L 27/11565; H01L 27/11519; H01L 27/1157; H01L 27/11556; H01L 27/11582
See application file for complete search history.

(56) References Cited

U.S. PATENT DOCUMENTS 5,387,530 A 2/1995 Doyle et al.
5,915,167 A 6/1999 Leedy
(Continued)

FOREIGN PATENT DOCUMENTS

EP 1398831 A2 3/2004
WO WO2002/015277 A2 2/2002
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Bitew Dinke
(74) *Attorney, Agent, or Firm* — The Marbury Law Group PLLC

(57) ABSTRACT

A three-dimensional memory device includes a first alternating stack of first insulating layers and first electrically conductive layers, a first memory opening fill structure extending through the first alternating stack and including a first memory film and a first vertical semiconductor channel, a joint-level electrically conductive layer overlying the first alternating stack, at least one joint-level doped semiconductor portion contacting a top surface of the first vertical semiconductor channel and located within, and electrically isolated from, the joint-level electrically conductive layer, a second alternating stack of second insulating layers and second electrically conductive layers located over the joint-level electrically conductive layer, and a second memory opening fill structure extending through the second alternating stack and including a second memory film and a second vertical semiconductor channel that is laterally surrounded by the second memory film and vertically extends into the at least one joint-level doped semiconductor portion.

20 Claims, 54 Drawing Sheets

(51) Int. Cl.
*H01L 27/11556* (2017.01)
*H01L 27/1157* (2017.01)
*H01L 27/11582* (2017.01)
*H01L 27/11519* (2017.01)
*H01L 27/11565* (2017.01)

(52) U.S. Cl.
CPC .. *H01L 27/11556* (2013.01); *H01L 27/11565* (2013.01); *H01L 27/11582* (2013.01)

(56) References Cited

U.S. PATENT DOCUMENTS

| | | |
|---|---|---|
| 7,005,350 B2 | 2/2006 | Walker et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,821,058 B2 | 10/2010 | Kidoh et al. |
| 7,848,145 B2 | 12/2010 | Mokhlesi et al. |
| 7,851,851 B2 | 12/2010 | Mokhlesi et al. |
| 7,867,822 B2 | 1/2011 | Lee |
| 7,983,084 B2 | 7/2011 | Tokiwa et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,828,884 B2 | 9/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 9,230,987 B2 | 1/2016 | Pachamuthu et al. |
| 9,449,982 B2 | 9/2016 | Lu et al. |
| 9,449,987 B1 | 9/2016 | Miyata et al. |
| 9,490,262 B1 | 11/2016 | Pang et al. |
| 9,490,371 B2 | 11/2016 | Noh et al. |
| 9,490,429 B2 | 11/2016 | Sasago et al. |
| 9,502,471 B1 | 11/2016 | Lu et al. |
| 9,515,080 B2 | 12/2016 | Takahashi et al. |
| 9,520,406 B2 | 12/2016 | Makala et al. |
| 9,570,463 B1 * | 2/2017 | Zhang ............... H01L 29/66666 |
| 2006/0001073 A1 | 1/2006 | Chen et al. |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0026561 A1 | 1/2009 | Reichenbach et al. |
| 2009/0090965 A1 | 4/2009 | Kito et al. |
| 2009/0097309 A1 | 4/2009 | Mizukami et al. |
| 2009/0108333 A1 | 4/2009 | Kito et al. |
| 2009/0121271 A1 | 5/2009 | Son et al. |
| 2009/0146206 A1 | 6/2009 | Fukuzumi et al. |
| 2009/0224309 A1 | 9/2009 | Kidoh et al. |
| 2009/0230458 A1 | 9/2009 | Ishiduki et al. |
| 2009/0242967 A1 | 10/2009 | Katsumata et al. |
| 2009/0294844 A1 | 12/2009 | Tanaka et al. |
| 2010/0019310 A1 * | 1/2010 | Sakamoto ......... H01L 27/11578 257/324 |
| 2010/0044778 A1 | 2/2010 | Seol |
| 2010/0059811 A1 | 3/2010 | Sekine et al. |
| 2010/0072538 A1 | 3/2010 | Kito et al. |
| 2010/0109065 A1 | 5/2010 | Oh et al. |
| 2010/0112769 A1 | 5/2010 | Son et al. |
| 2010/0117137 A1 | 5/2010 | Fukuzumi et al. |
| 2010/0120214 A1 | 5/2010 | Park et al. |
| 2010/0123202 A1 | 5/2010 | Hofmann |
| 2010/0155810 A1 | 6/2010 | Kim et al. |
| 2010/0155818 A1 | 6/2010 | Cho |
| 2010/0163968 A1 | 7/2010 | Kim et al. |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0213537 A1 | 8/2010 | Fukuzumi et al. |
| 2010/0320528 A1 | 12/2010 | Jeong et al. |
| 2011/0002178 A1 | 1/2011 | Hwang et al. |
| 2011/0049607 A1 | 3/2011 | Yahashi |
| 2011/0049608 A1 | 3/2011 | Kidoh et al. |
| 2011/0057251 A1 | 3/2011 | Higashi |
| 2011/0065270 A1 | 3/2011 | Shim et al. |
| 2011/0076819 A1 | 3/2011 | Kim et al. |
| 2011/0133606 A1 | 6/2011 | Yoshida et al. |
| 2011/0151667 A1 * | 6/2011 | Hwang ............. H01L 27/11551 438/667 |
| 2011/0163449 A1 | 7/2011 | Kelly et al. |
| 2011/0266606 A1 | 11/2011 | Park et al. |
| 2011/0287612 A1 | 11/2011 | Lee et al. |
| 2011/0312174 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0003800 A1 | 1/2012 | Lee et al. |
| 2012/0049268 A1 | 3/2012 | Chang et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0100700 A1 | 4/2012 | Kim |
| 2012/0104484 A1 * | 5/2012 | Lee ................... H01L 27/11582 257/324 |
| 2012/0140562 A1 | 6/2012 | Choe et al. |
| 2012/0153376 A1 | 6/2012 | Alsmeier et al. |
| 2012/0170369 A1 | 7/2012 | Kim et al. |
| 2012/0241842 A1 | 9/2012 | Matsuda |
| 2012/0256247 A1 | 10/2012 | Alsmeier et al. |
| 2012/0261638 A1 | 10/2012 | Sills et al. |
| 2012/0267701 A1 | 10/2012 | Chae et al. |
| 2012/0276719 A1 | 11/2012 | Han et al. |
| 2012/0327715 A1 | 12/2012 | Lee et al. |
| 2013/0044531 A1 | 2/2013 | Baek et al. |
| 2013/0059422 A1 | 3/2013 | Lee et al. |
| 2013/0189444 A1 | 7/2013 | Kub et al. |
| 2013/0207178 A1 | 8/2013 | Lee et al. |
| 2013/0237025 A1 | 9/2013 | Yang |
| 2013/0248974 A1 | 9/2013 | Alsmeier |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0008714 A1 | 1/2014 | Makala et al. |
| 2014/0016408 A1 * | 1/2014 | Lee ................... H01L 27/11551 365/185.2 |
| 2014/0264525 A1 * | 9/2014 | Takahashi ............ H01L 27/115 257/314 |
| 2014/0273373 A1 | 9/2014 | Makala et al. |
| 2015/0294978 A1 | 10/2015 | Lu et al. |
| 2016/0005760 A1 * | 1/2016 | Lee ................... H01L 27/11582 257/324 |
| 2016/0190155 A1 * | 6/2016 | Lee ................... H01L 27/11582 438/268 |
| 2016/0204117 A1 * | 7/2016 | Liu ................... H01L 29/66825 257/324 |
| 2016/0322378 A1 | 11/2016 | Ito et al. |
| 2016/0322381 A1 | 11/2016 | Liu et al. |
| 2016/0322382 A1 | 11/2016 | Lee |
| 2017/0062454 A1 | 3/2017 | Lu et al. |

(56) References Cited

U.S. PATENT DOCUMENTS

2017/0154892 A1* 6/2017 Oh .................... H01L 27/11556
2017/0162592 A1* 6/2017 Nishikawa ........ H01L 27/11573

FOREIGN PATENT DOCUMENTS

| WO | WO2008/118433 A1 | 10/2008 |
|---|---|---|
| WO | WO2009/085078 A1 | 7/2009 |
| WO | WO2012/003301 A2 | 1/2012 |

OTHER PUBLICATIONS

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Invitation to Pay Additional Fees, International Application No. PCT/US2016/047397, dated Dec. 8, 2016.

U.S. Appl. No. 15/071,575, Office Action dated Nov. 16, 2016, 13pgs.

U.S. Appl. No. 15/183,195, Office Action dated Feb. 21, 2017, 15pgs.

U.S. Appl. No. 14/585,912, Office Action dated Apr. 7, 2016, 30pgs.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

International Search Report and Written Opinion, International Application No. PCT/US2014/023276, dated Jun. 30, 2014 (13 pages).

International Search Report and Written Opinion, International Application No. PCT/US2014/020290, dated Jun. 25, 2014.

Invitation to Pay Additional Search Fees, International Application No. PCT/US2013/024638, dated Apr. 24, 2013.

Boogaard et al., "Net negative charge in low-temperature SiO2 gate dielectric layers," Microelectronic Engineering, vol. 86, Issues 7-9, Jul.-Sep. 2009, pp. 1707-1710.

U.S. Appl. No. 13/933,743, Office Action dated Apr. 21, 2014, 29pgs.

U.S. Appl. No. 14/219,161, Office Action dated Jul. 28, 2014, 18pgs.

U.S. Appl. No. 14/207,012, Office Action dated Nov. 9, 2015, 36pgs.

U.S. Appl. No. 15/015,190, filed Feb. 4, 2016, SanDisk Technologies Inc.

U.S. Appl. No. 15/049,444, filed Feb. 22, 2016, SanDisk Technologies Inc.

U.S. Appl. No. 15/071,575, filed Mar. 16, 2016, SanDisk Technologies Inc.

U.S. Appl. No. 15/183,195, filed Jun. 15, 2016, SanDisk Technologies LLC.

U.S. Appl. No. 15/186,768, filed Jun. 20, 2016, SanDisk Technologies LLC.

U.S. Appl. No. 15/243,260, filed Aug. 22, 2016, SanDisk Technologies LLC.

U.S. Appl. No. 15/292,548, filed Oct. 13, 2016, SanDisk Technologies LLC.

U.S. Appl. No. 15/335,850, filed Oct. 27, 2016, SanDisk Technologies LLC.

U.S. Appl. No. 15/347,101, filed Nov. 9, 2016, SanDisk Technologies LLC.

* cited by examiner

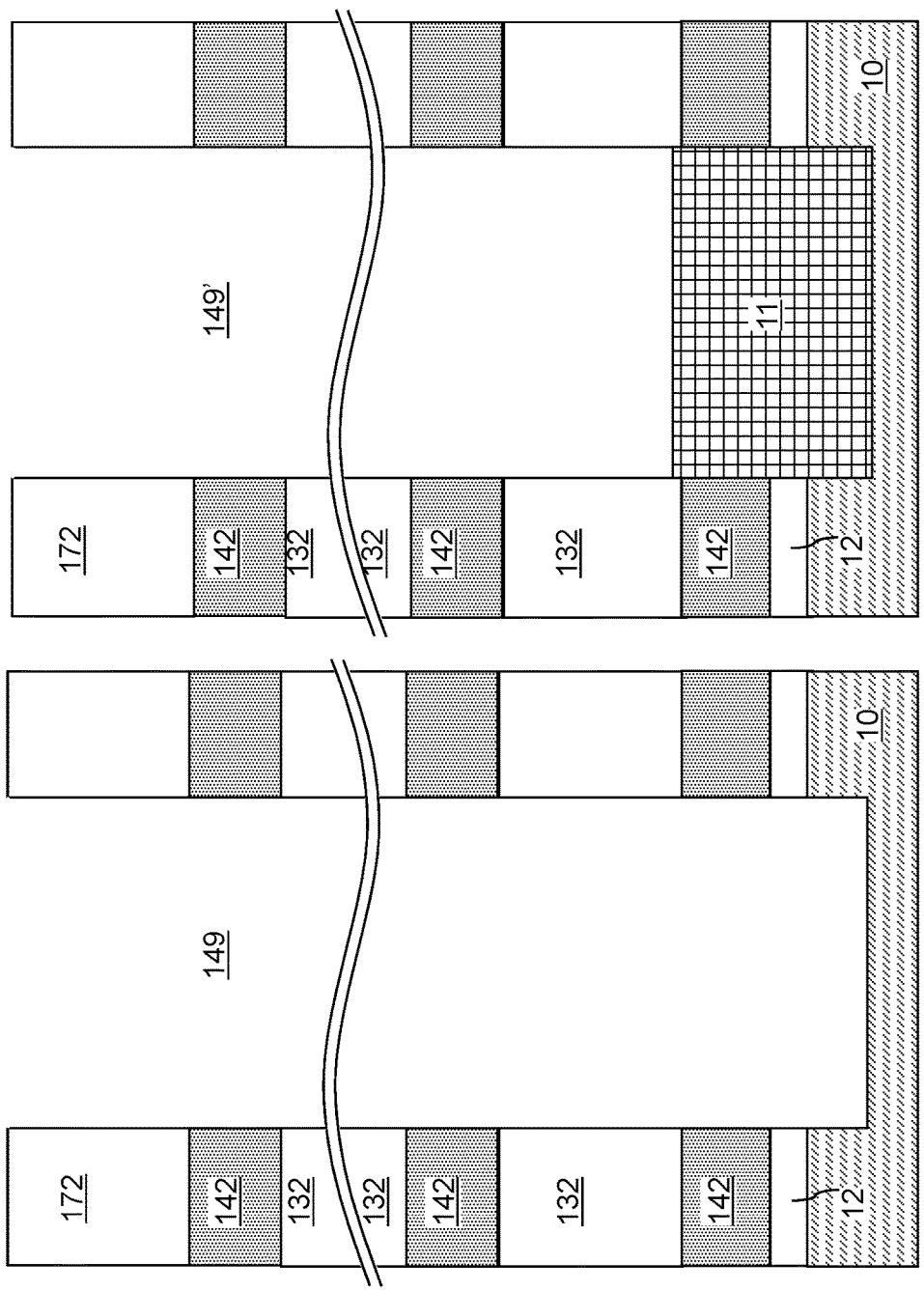

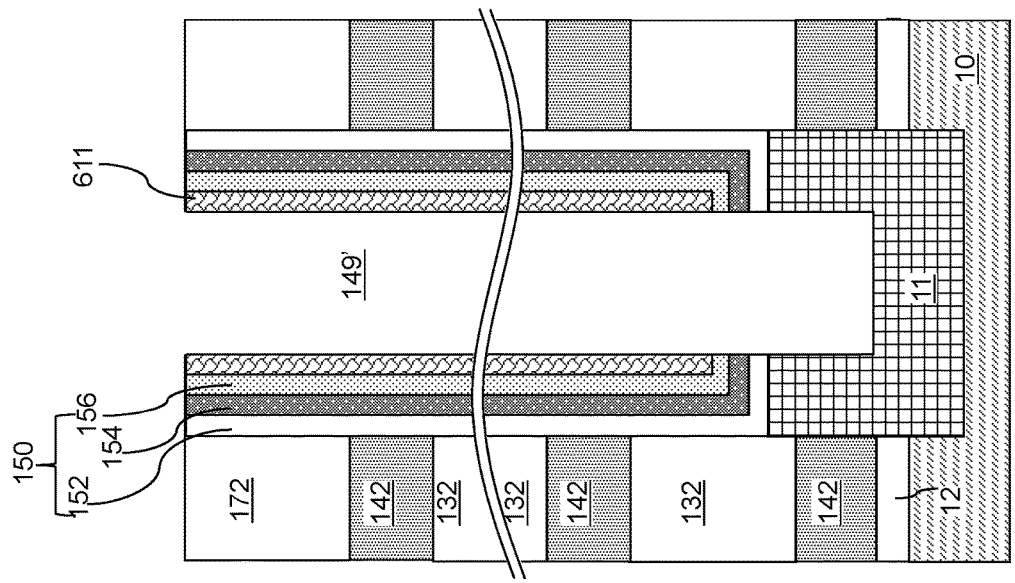
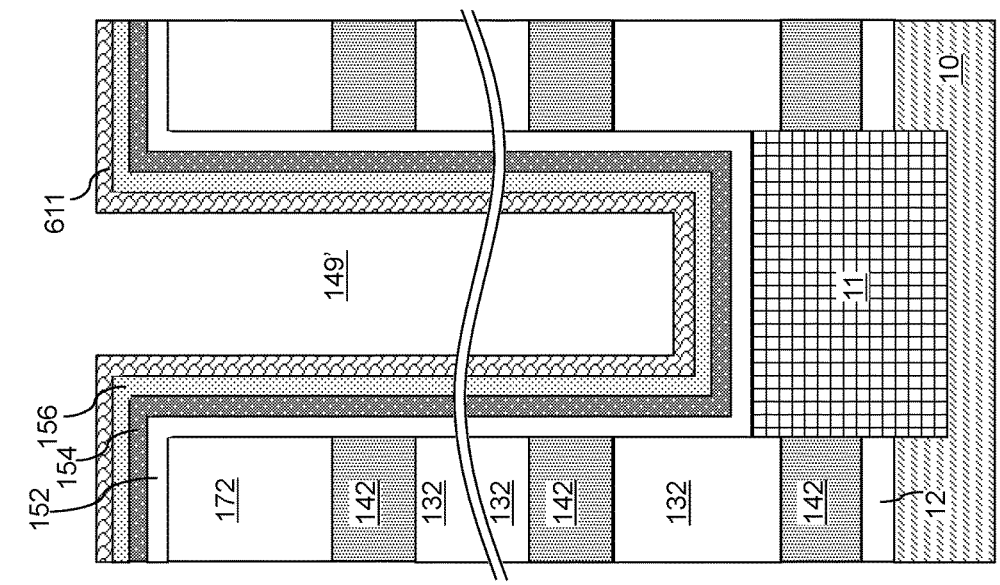

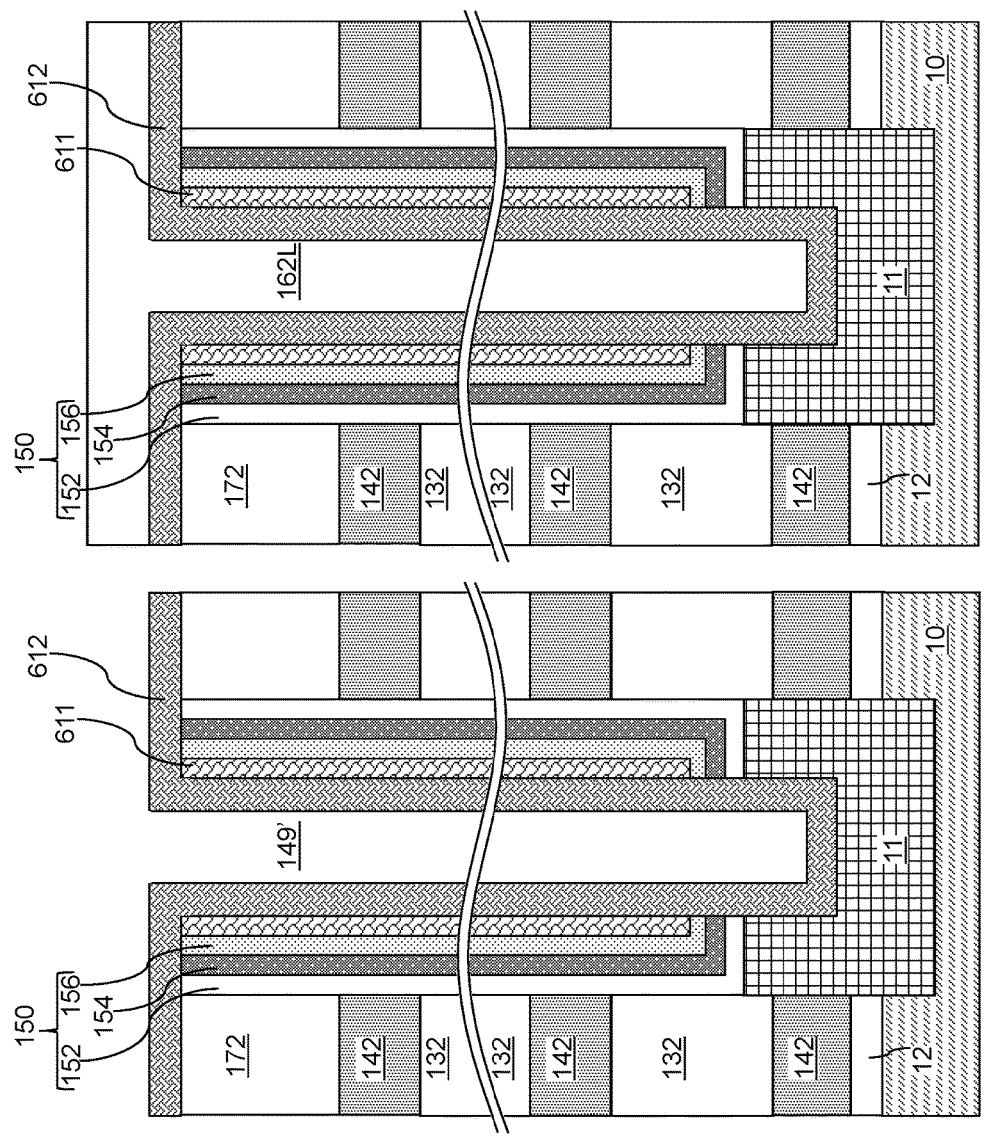

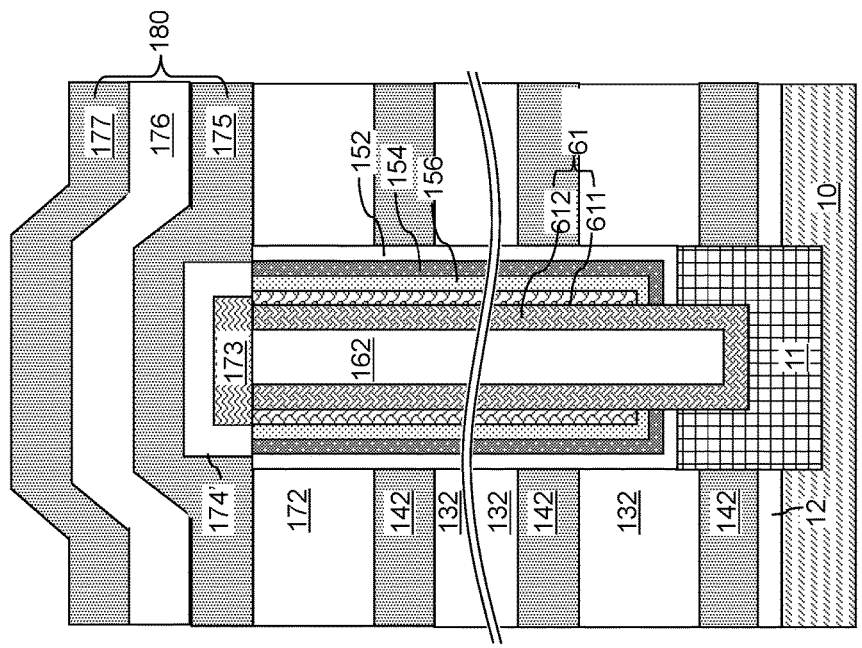
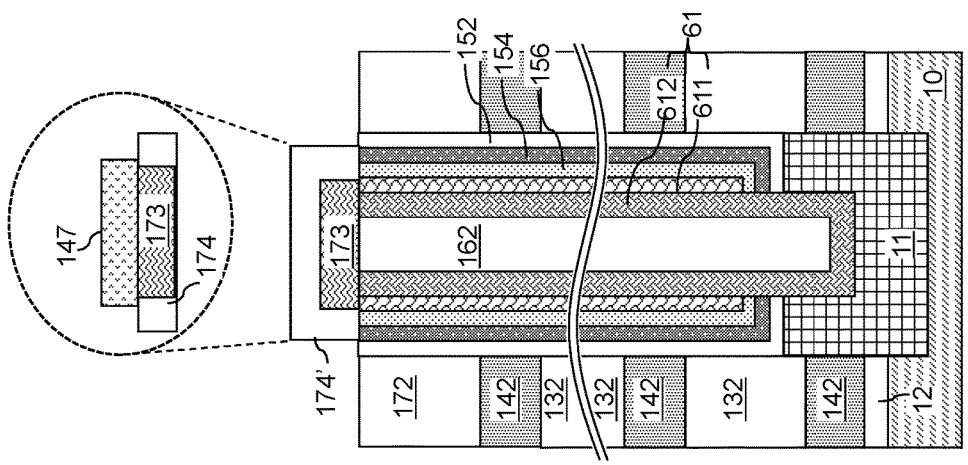
FIG. 6D
FIG. 6C

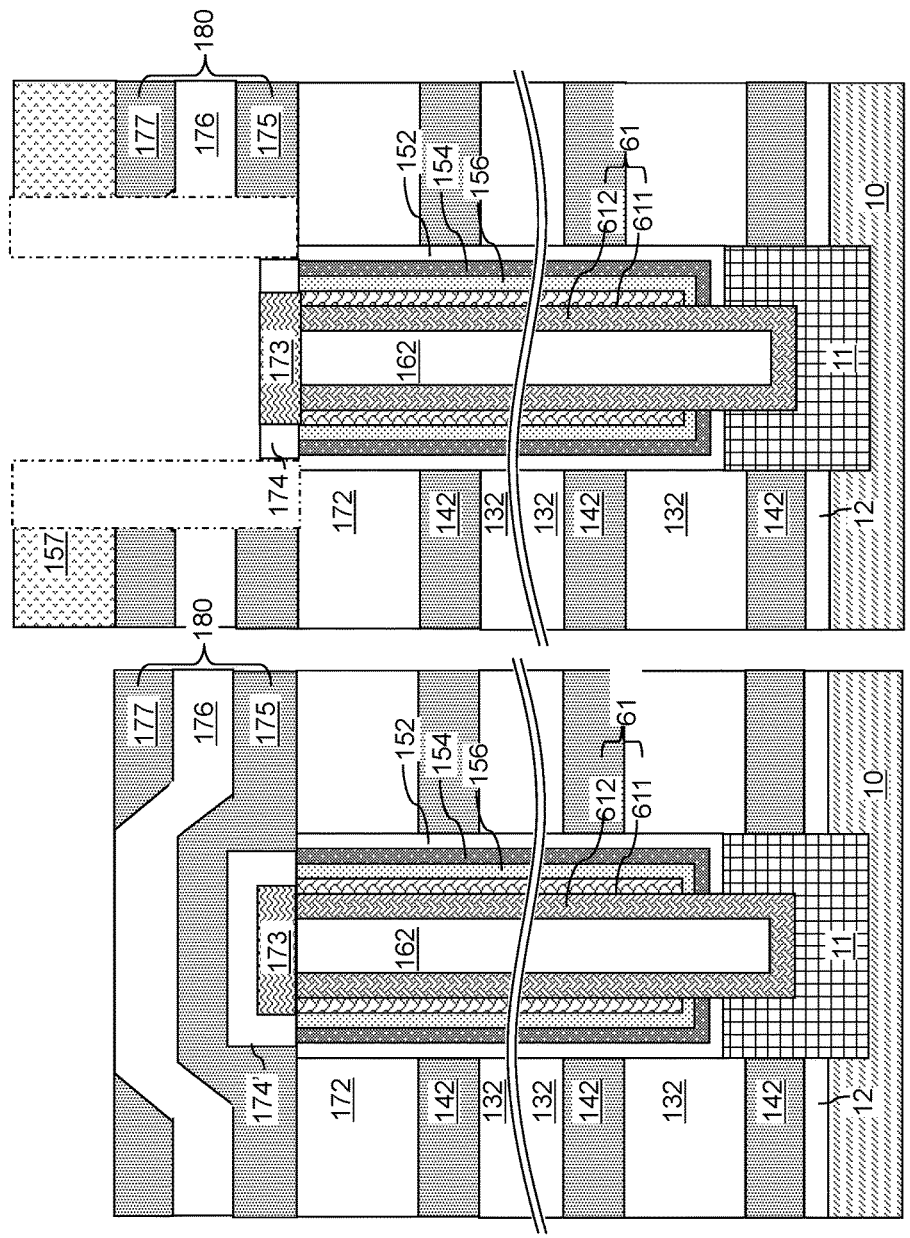

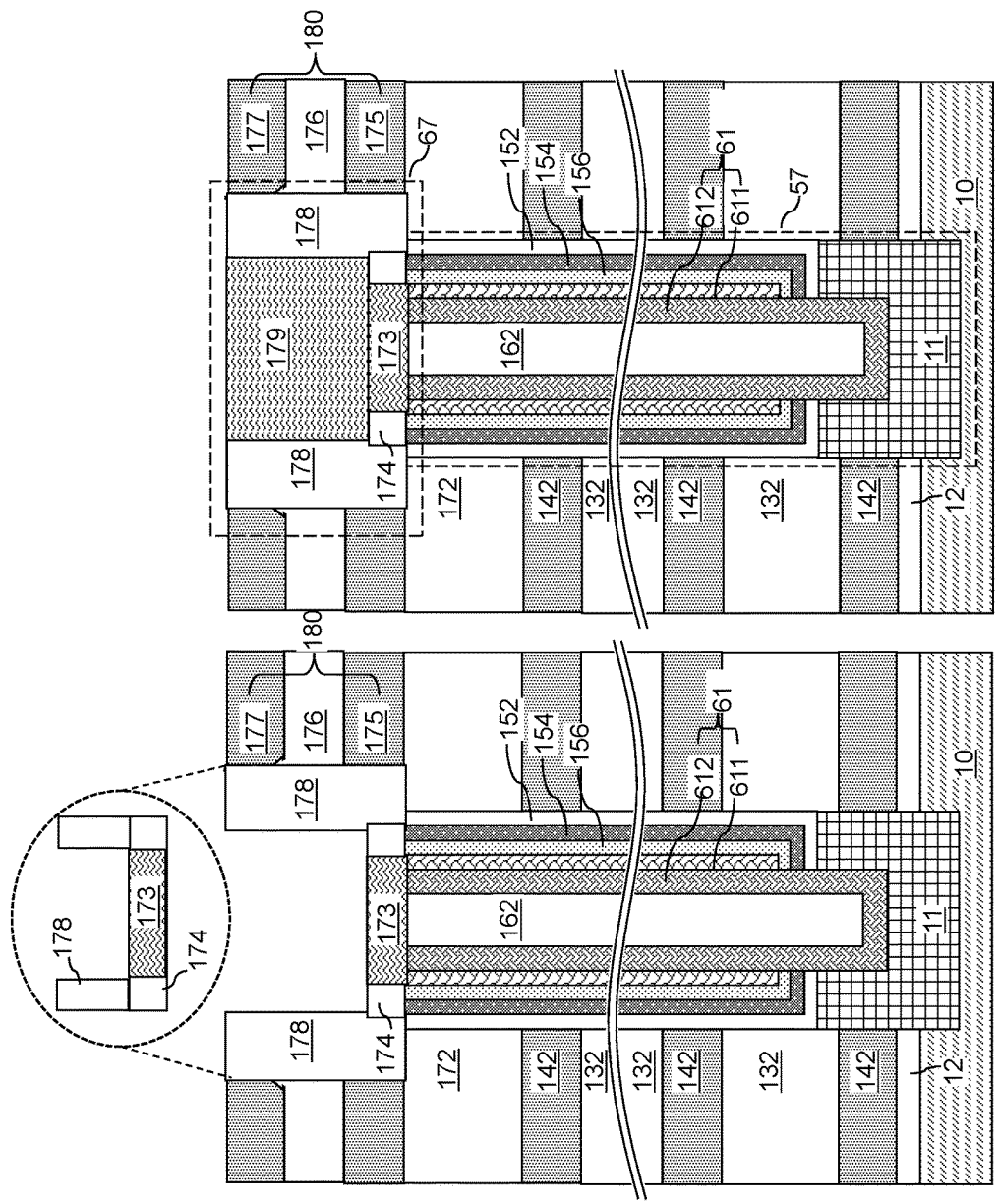

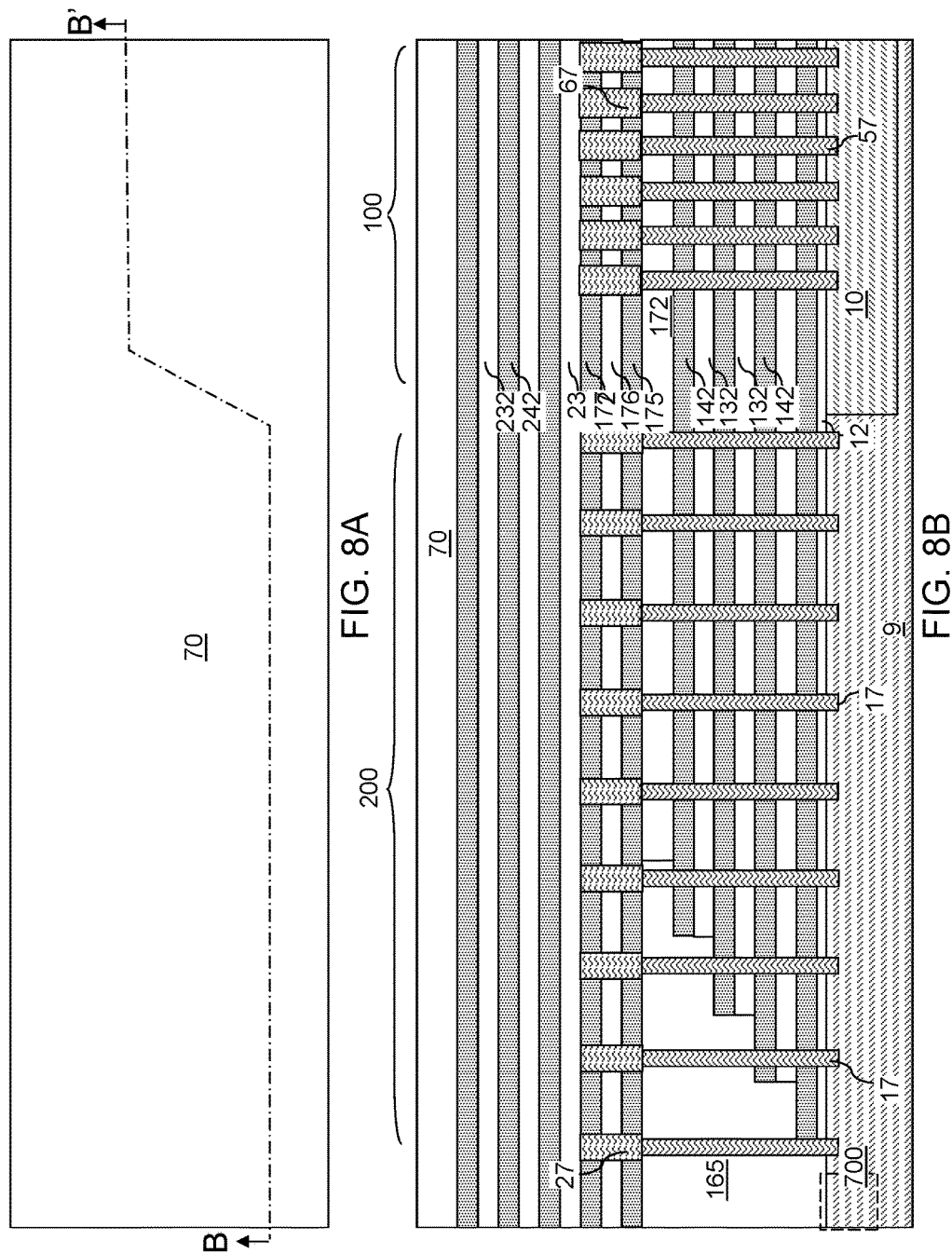

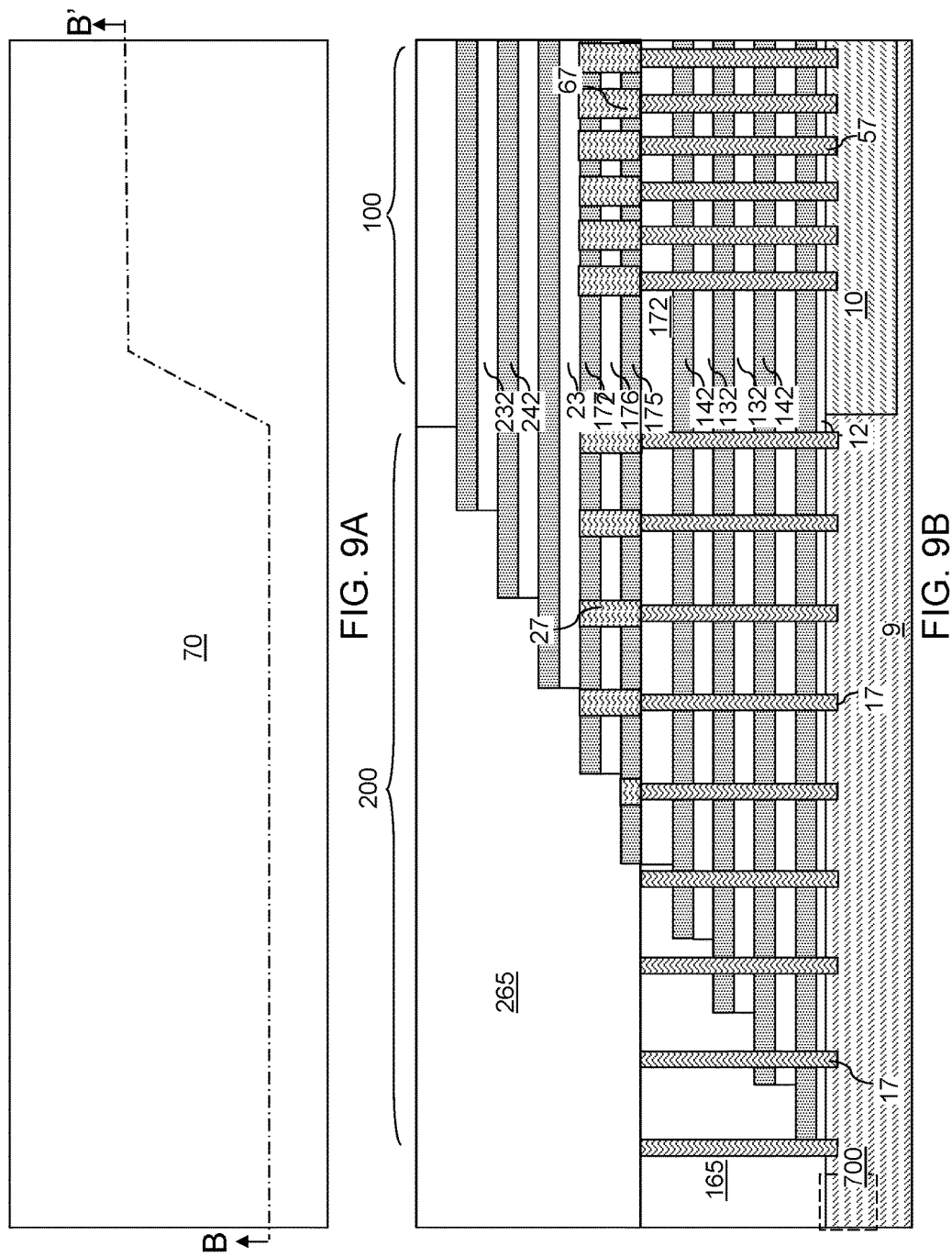

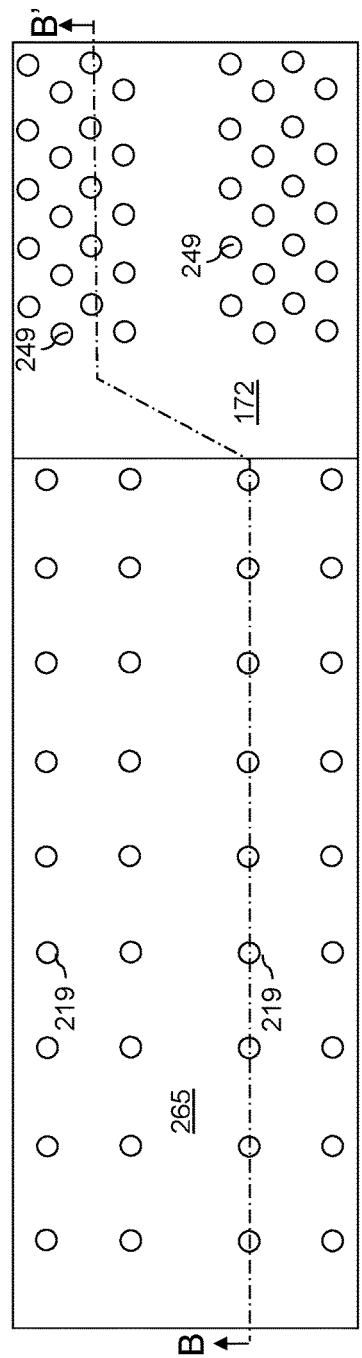
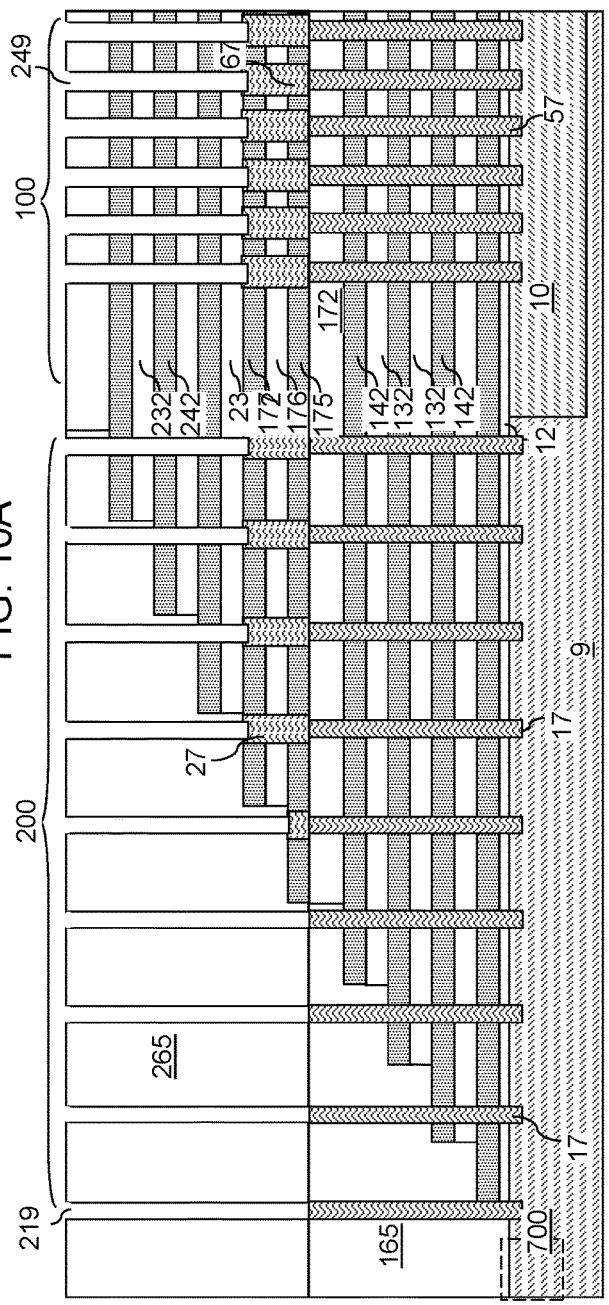
FIG. 10A
FIG. 10B

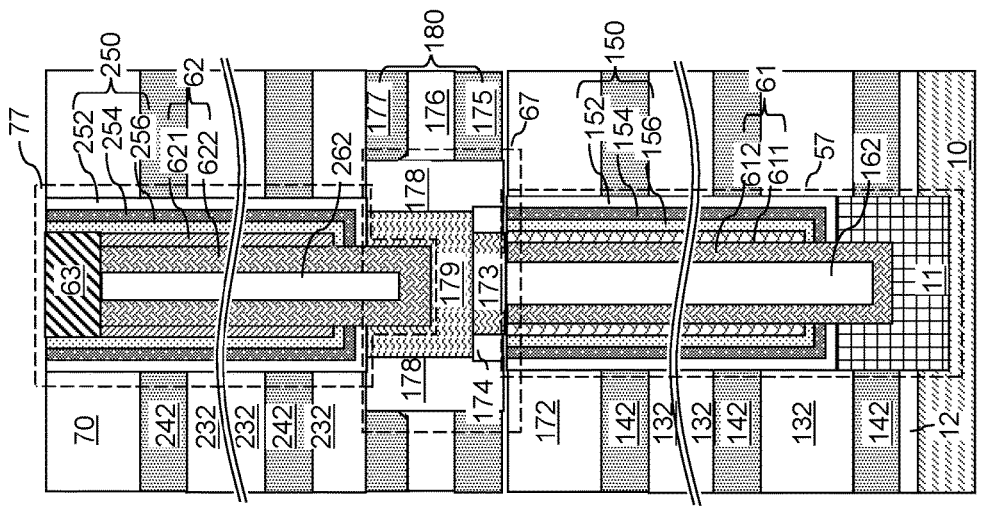
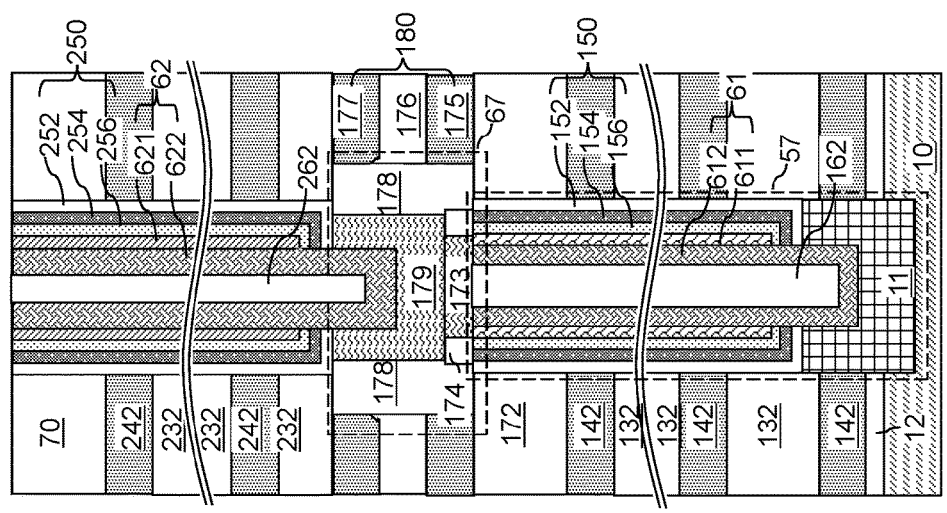

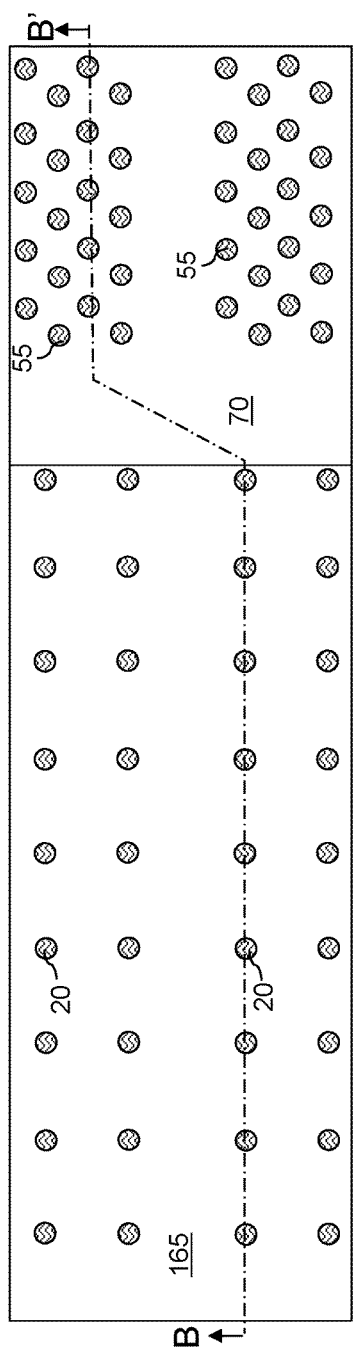
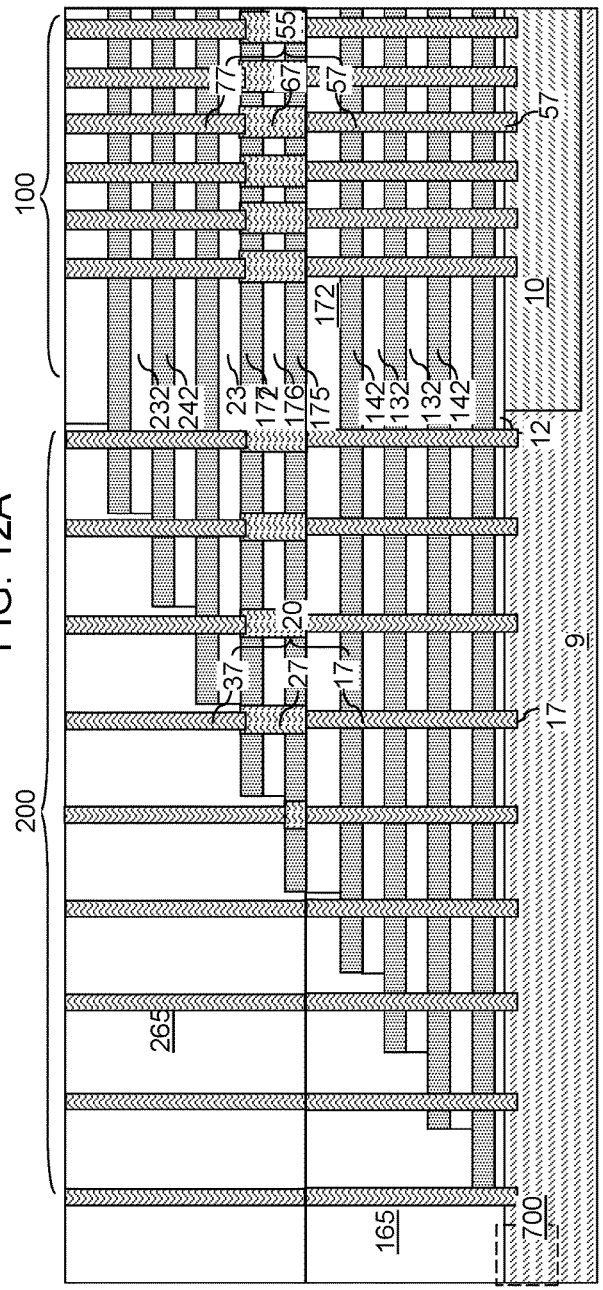
FIG. 12A
FIG. 12B

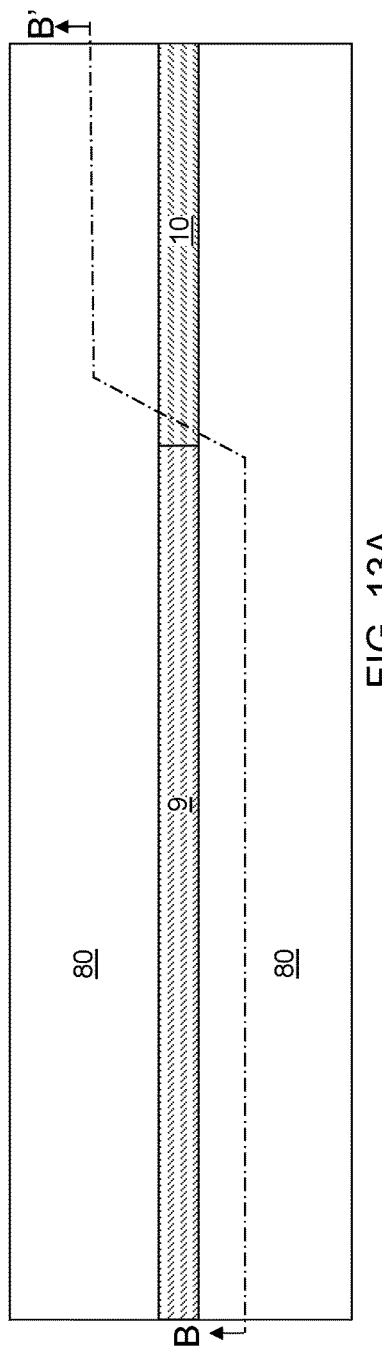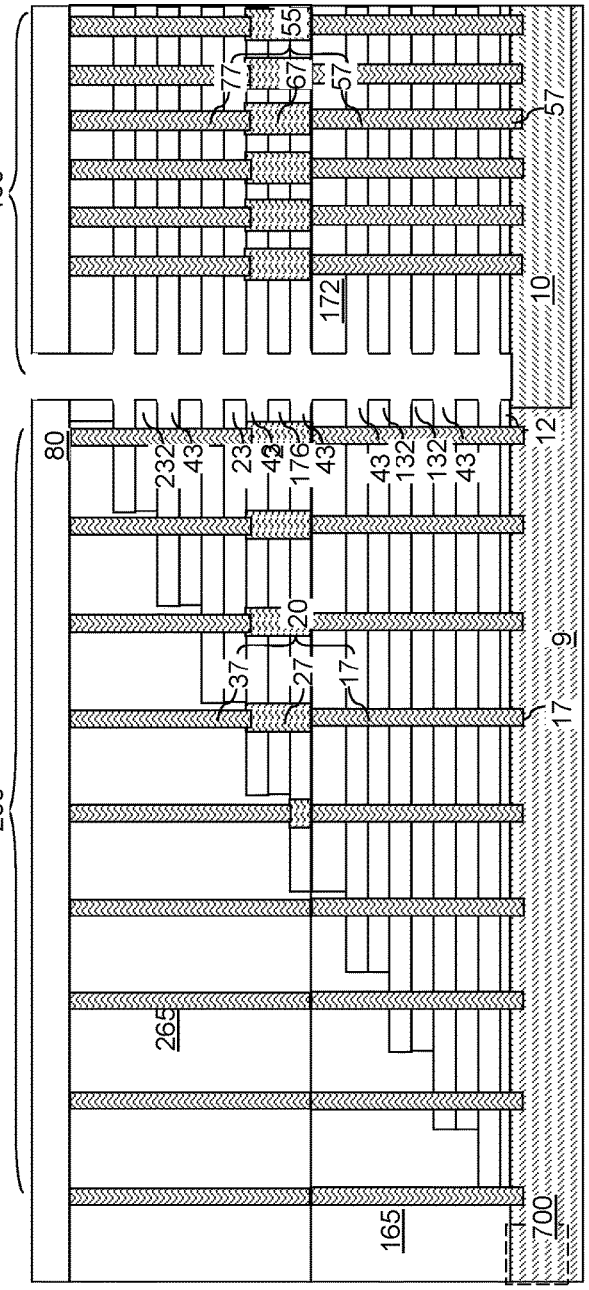
FIG. 13A
FIG. 13B

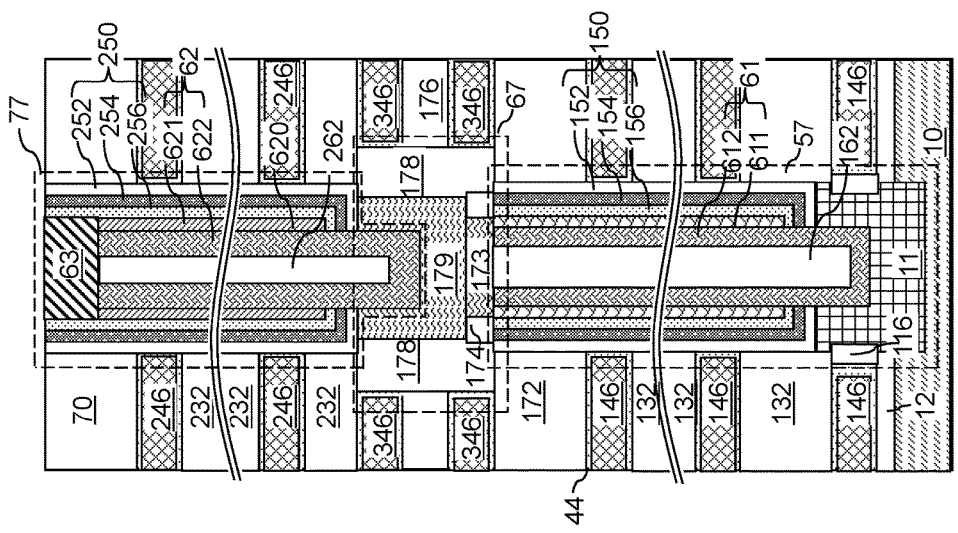
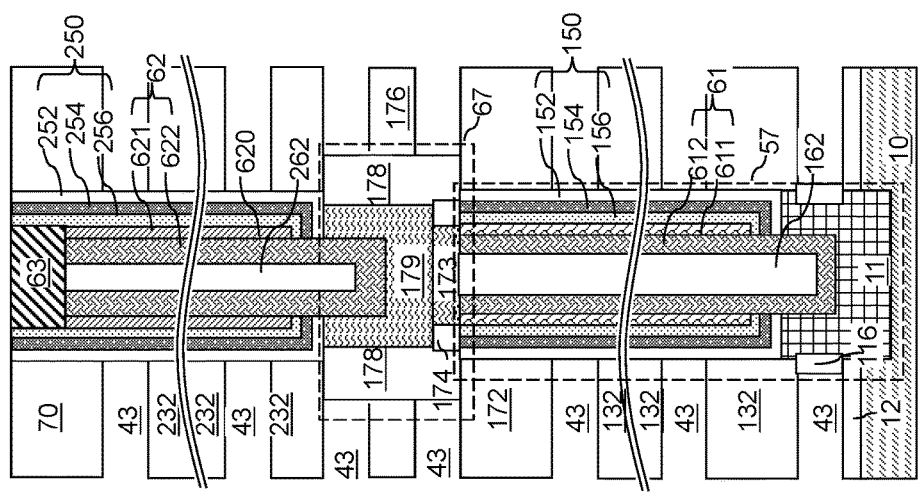
FIG. 14A
FIG. 14B

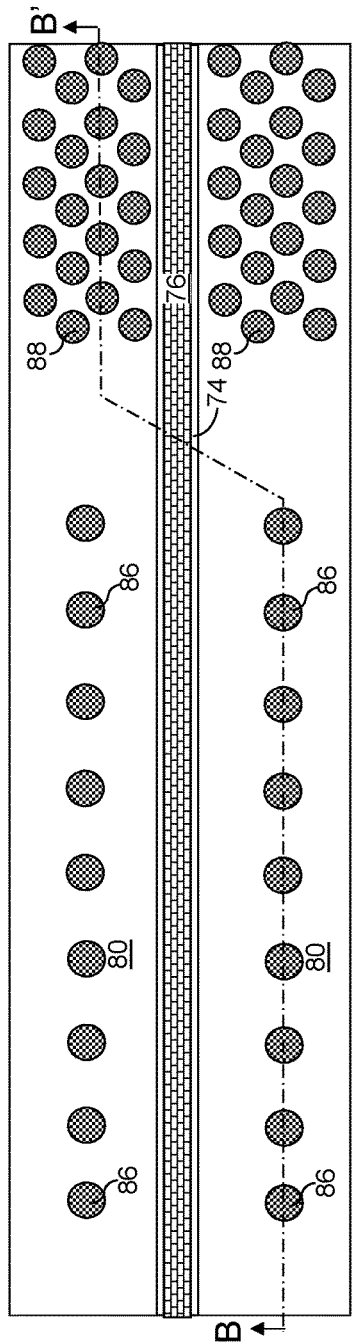
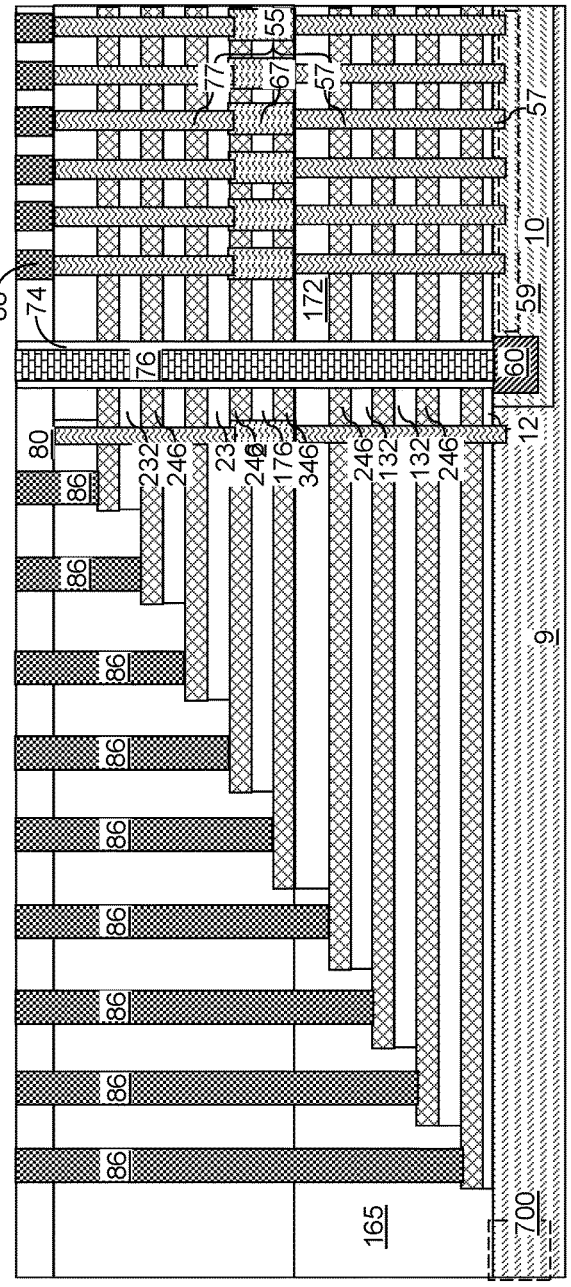
FIG. 17A
FIG. 17B

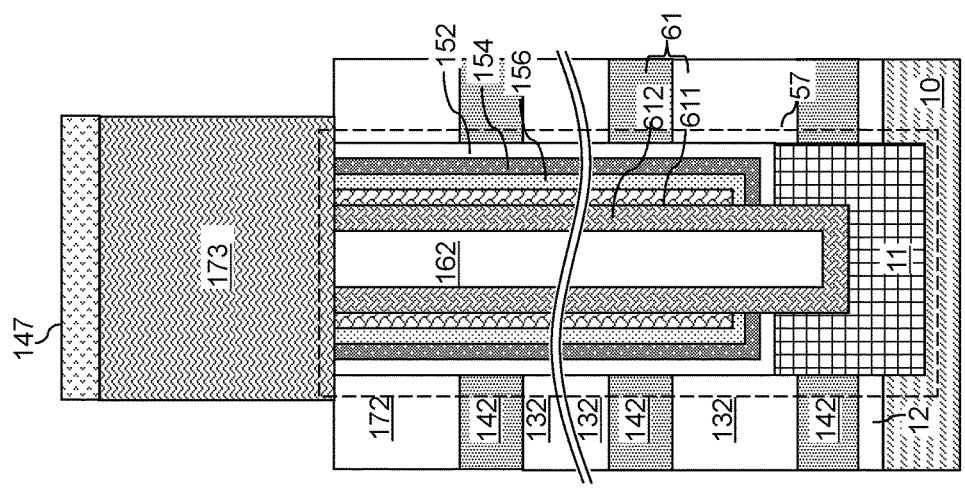
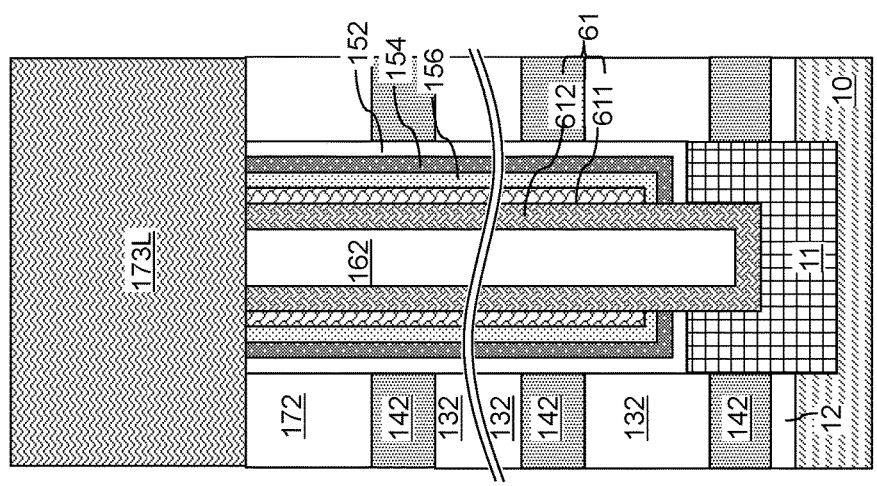
FIG. 20B
FIG. 20A

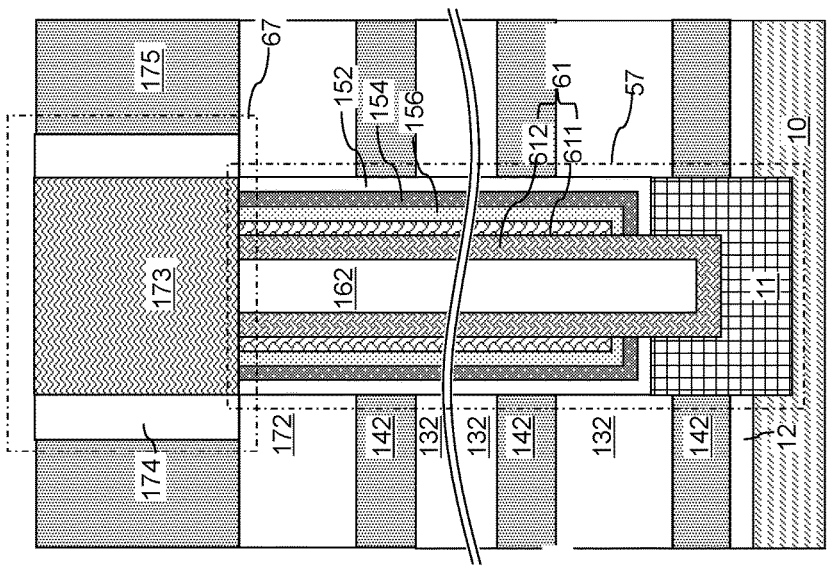
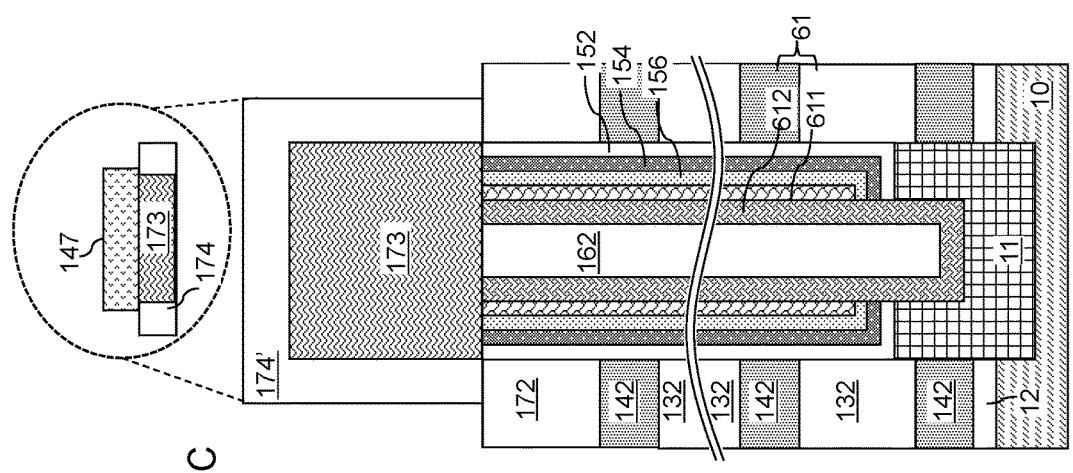
FIG. 20D
FIG. 20C

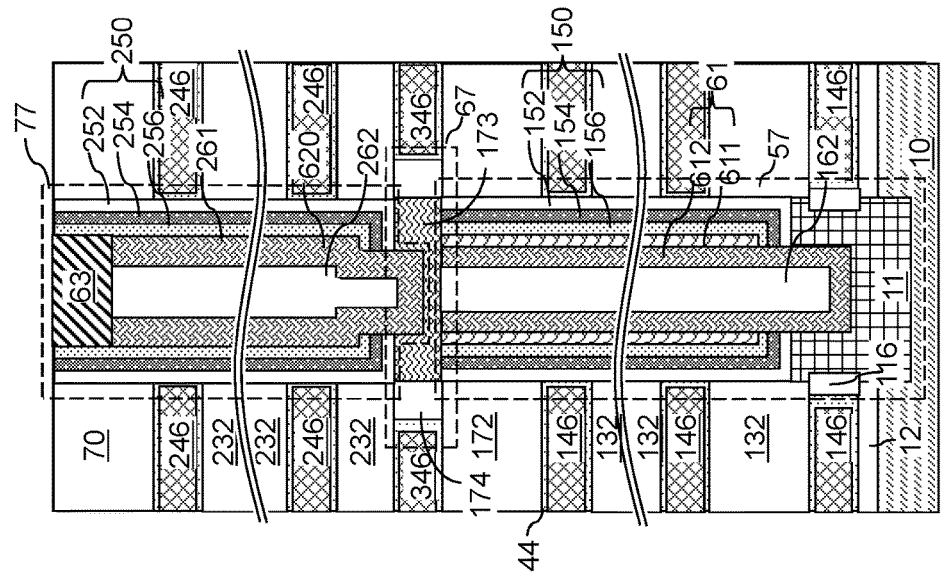
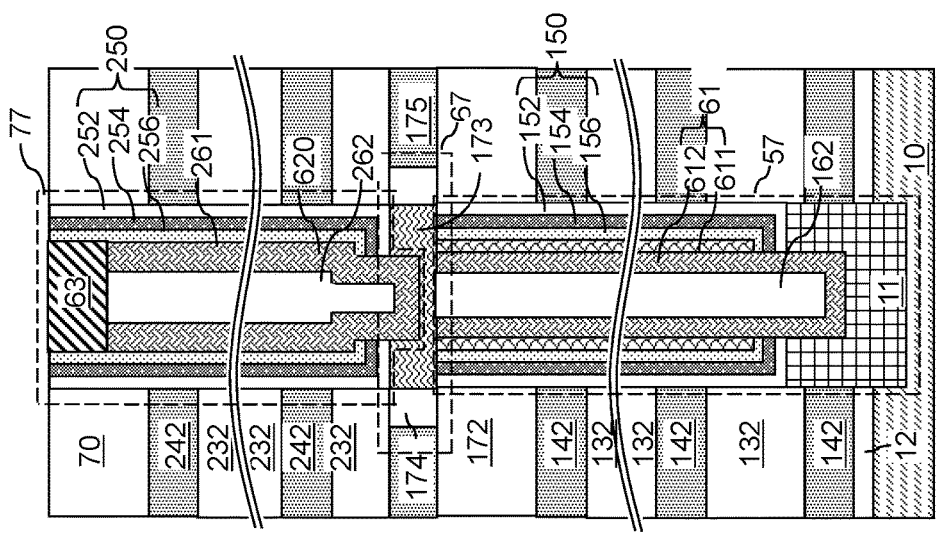
FIG. 22A
FIG. 22B

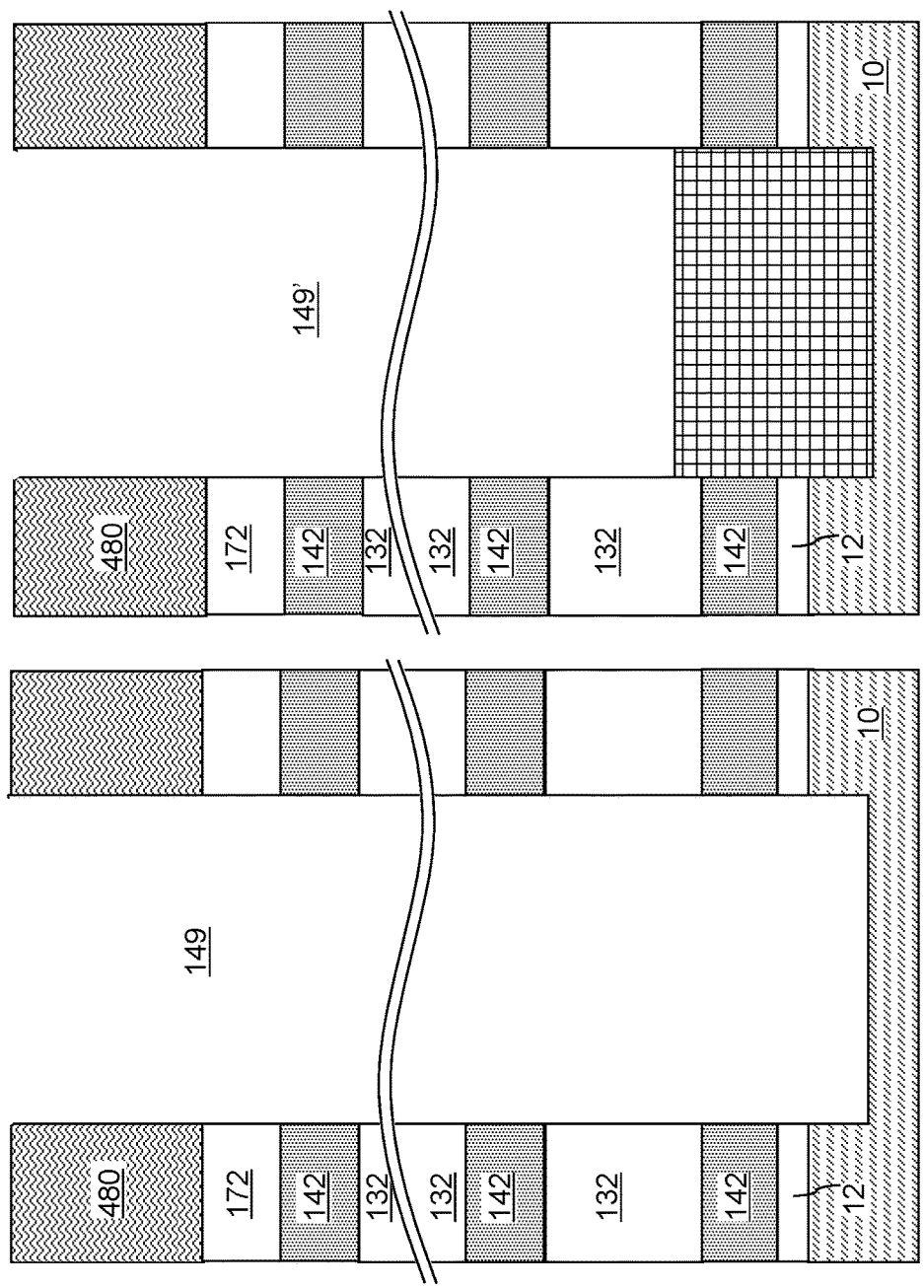

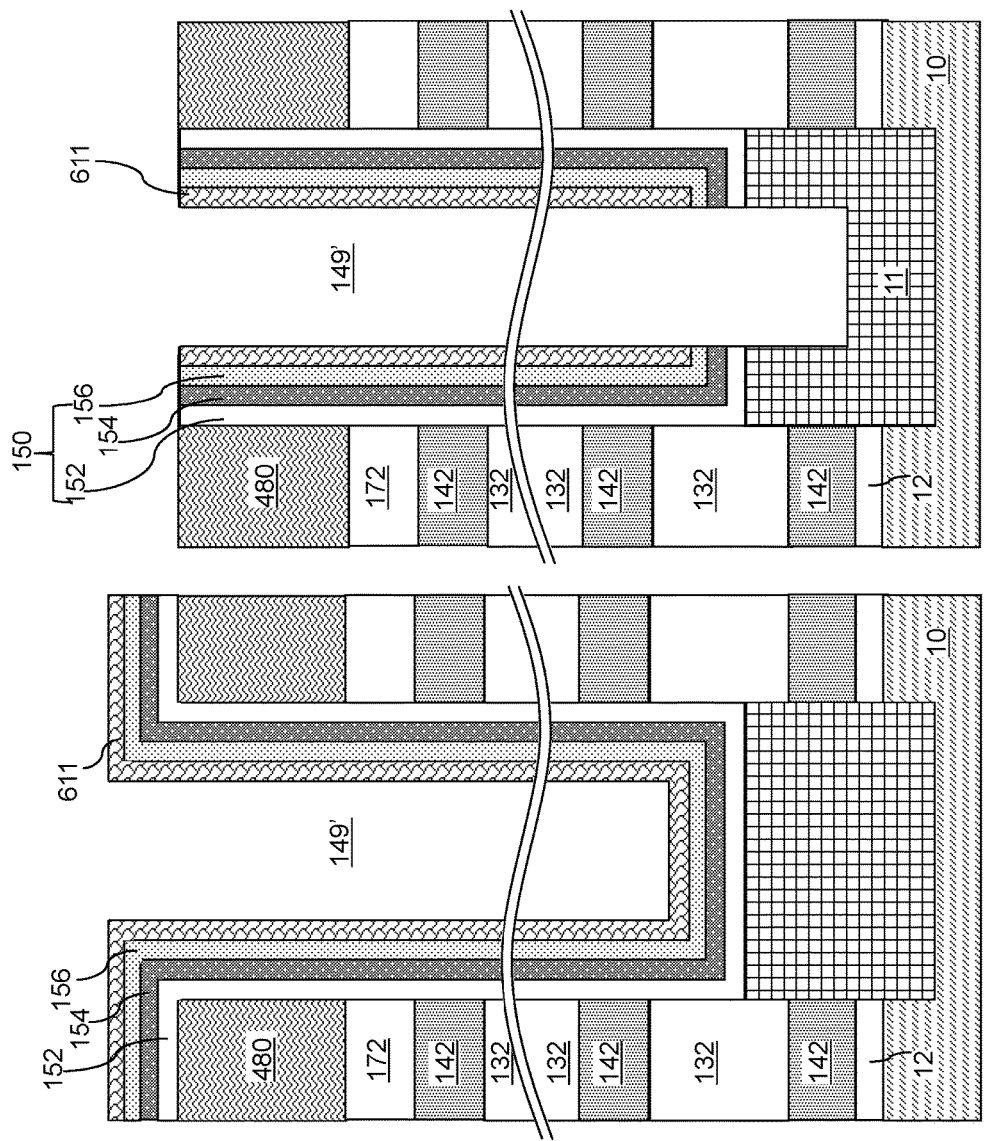

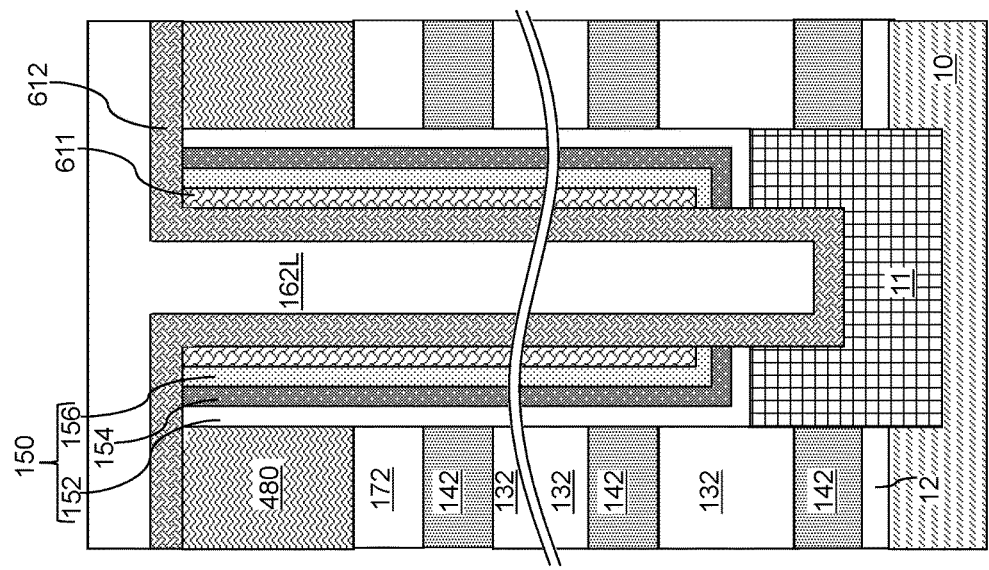
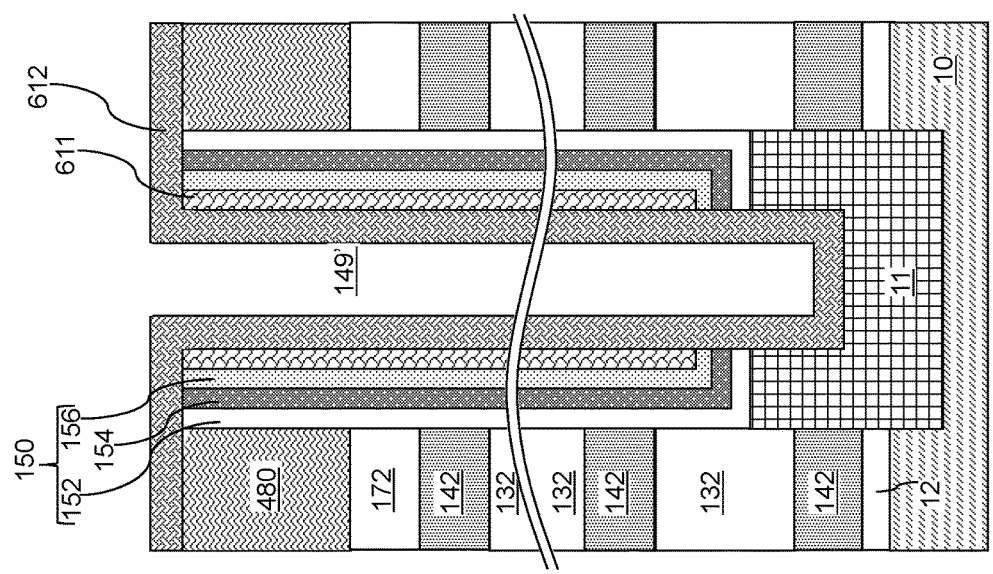

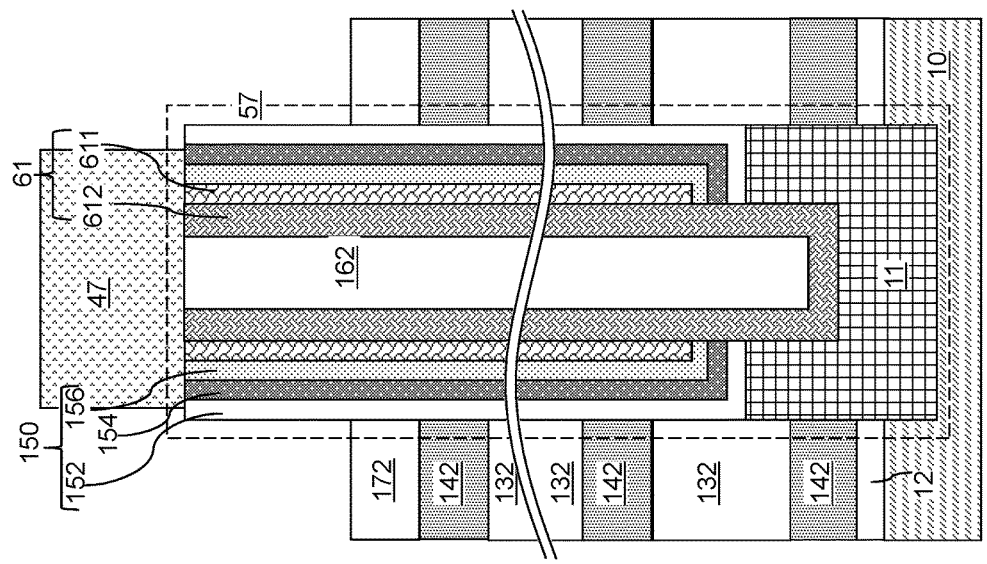
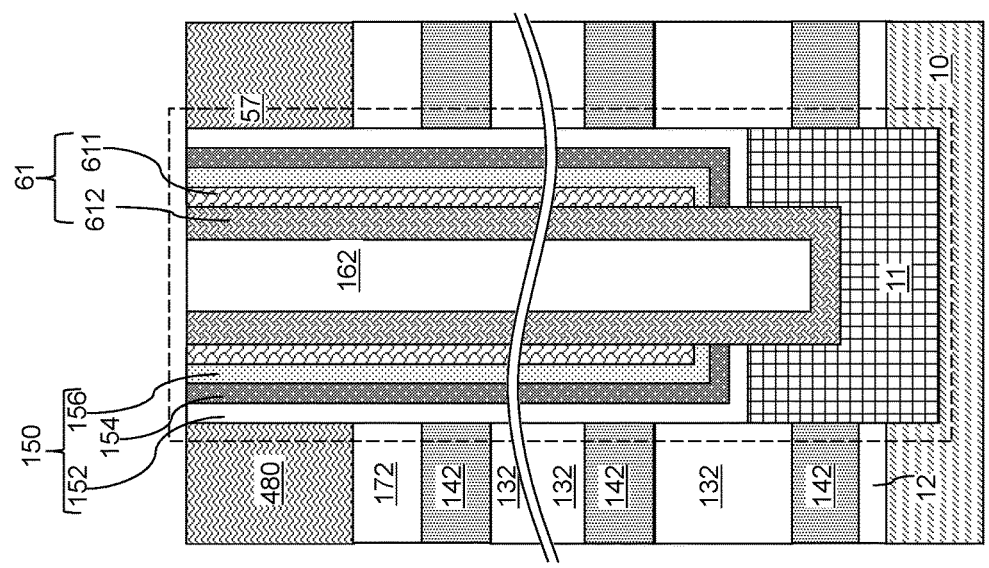

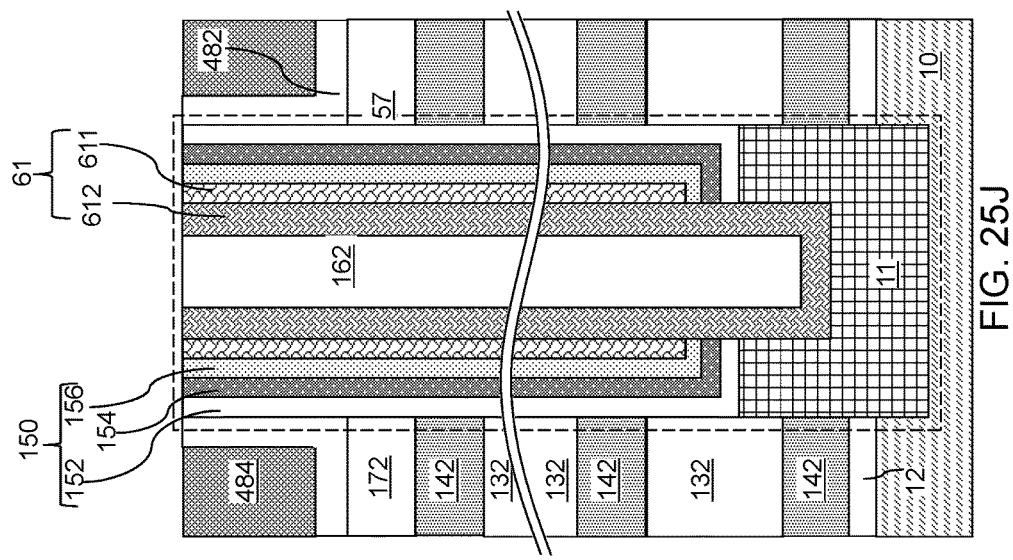
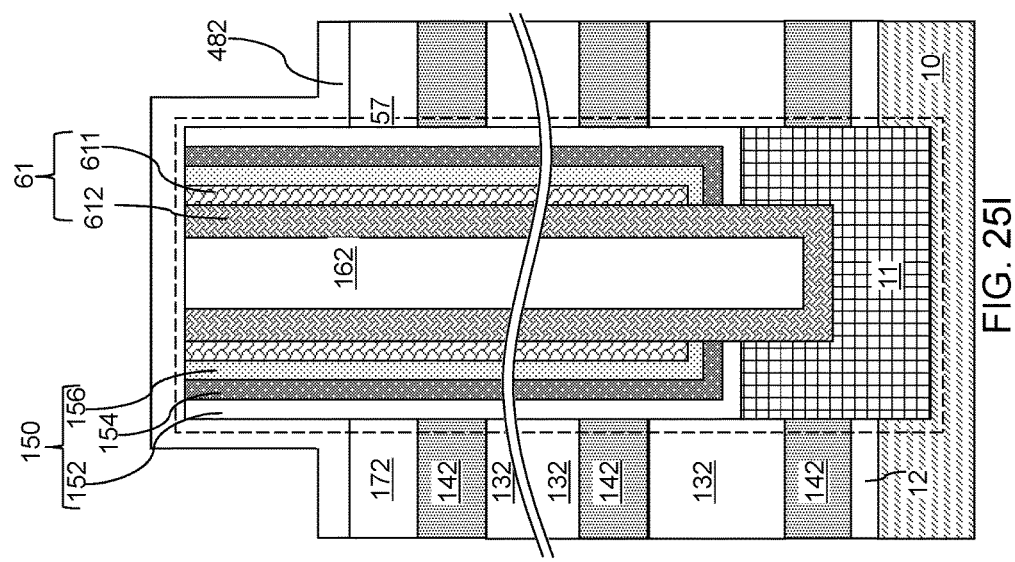

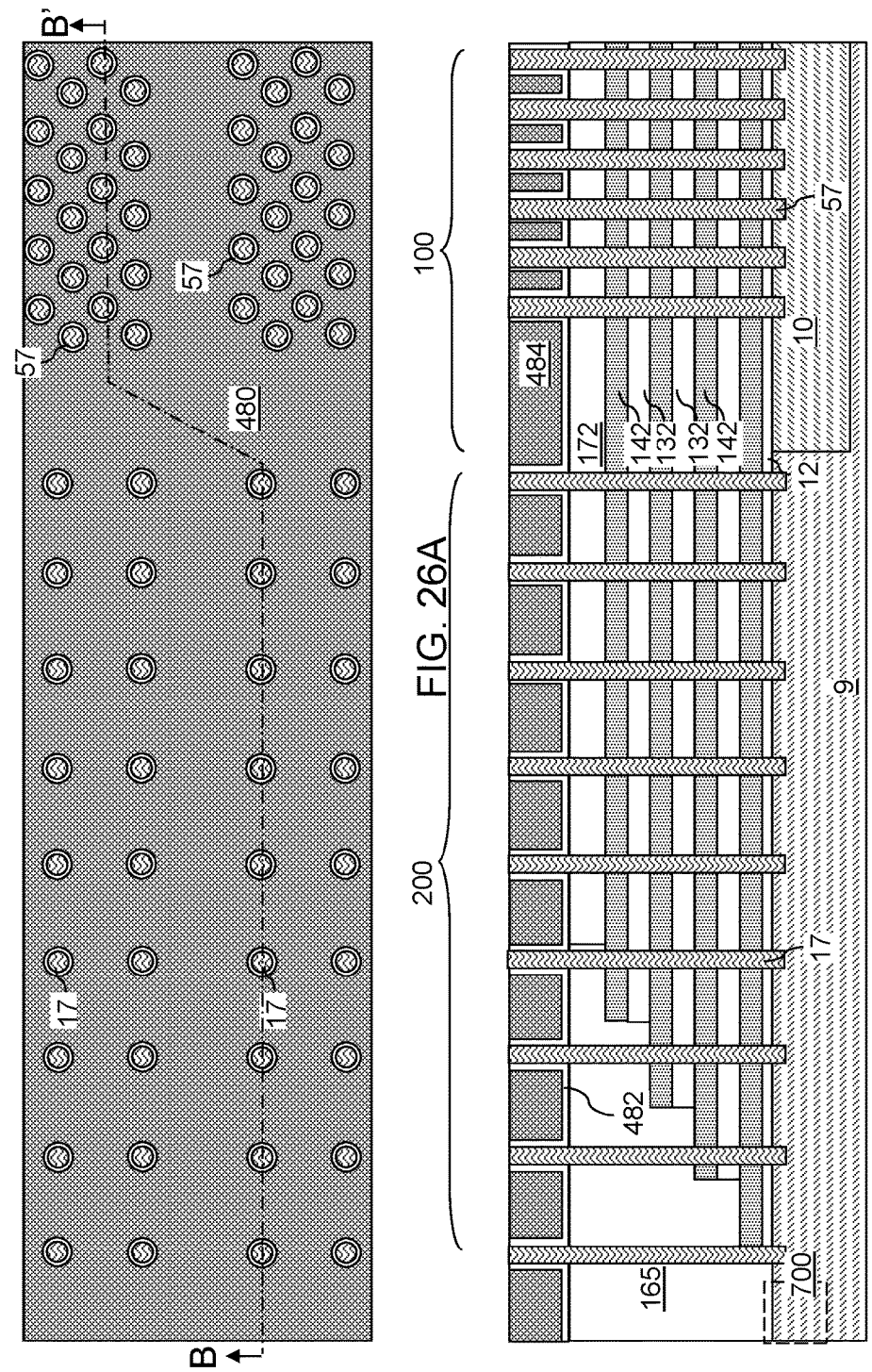

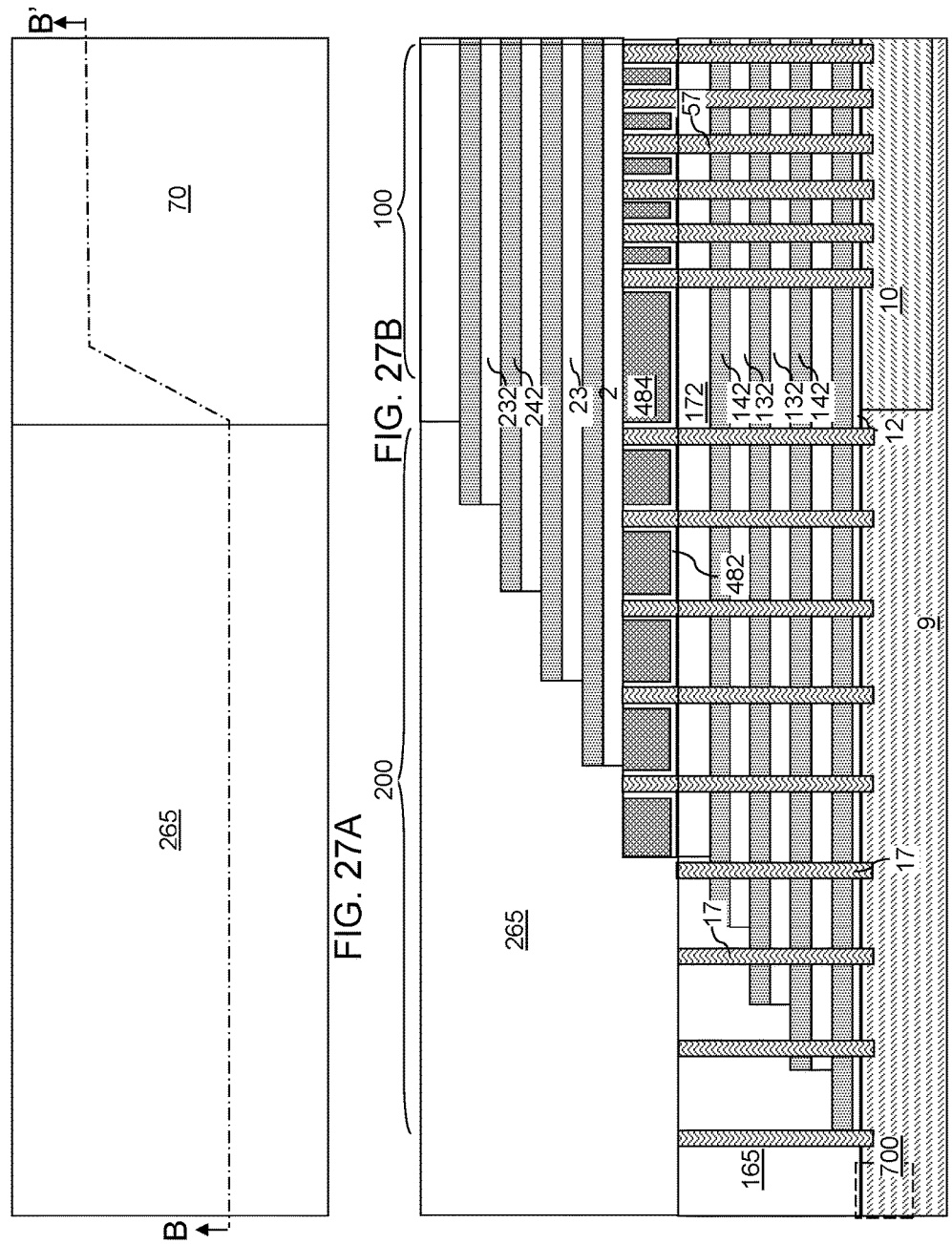

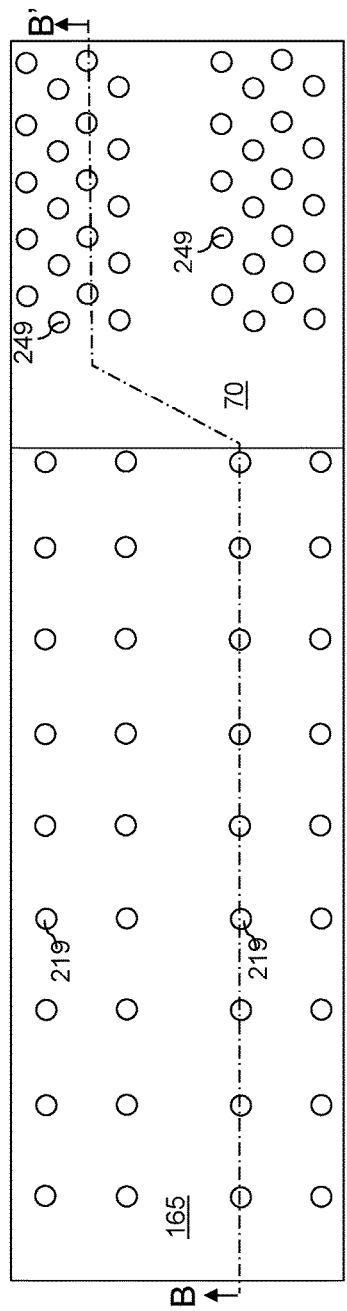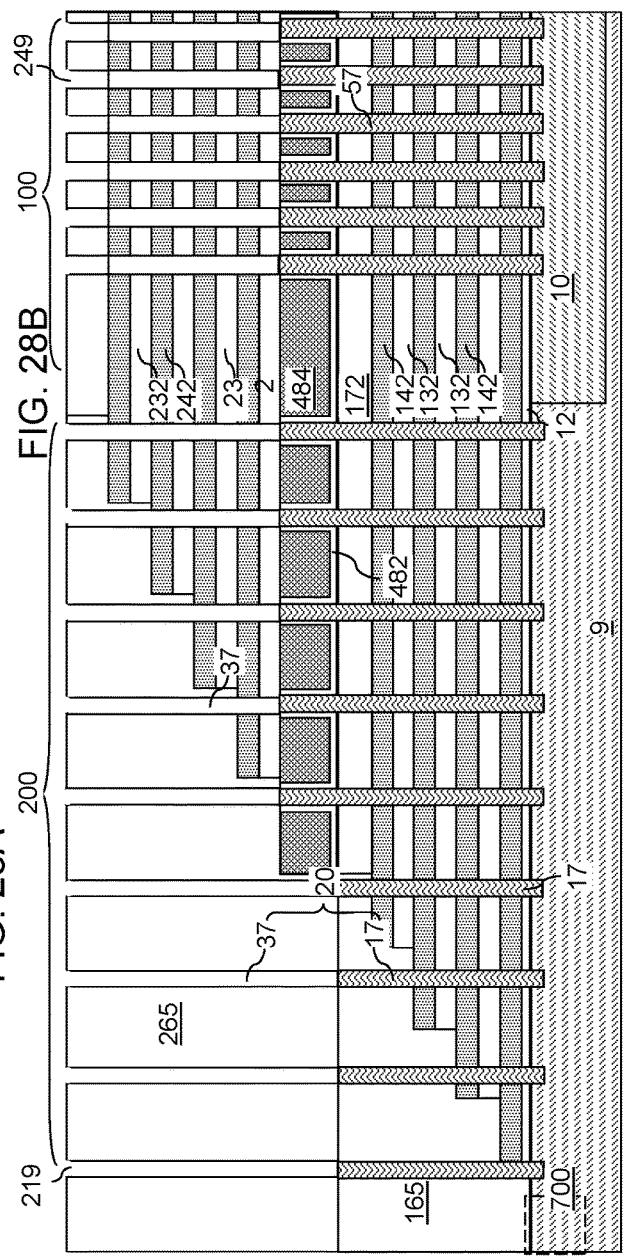

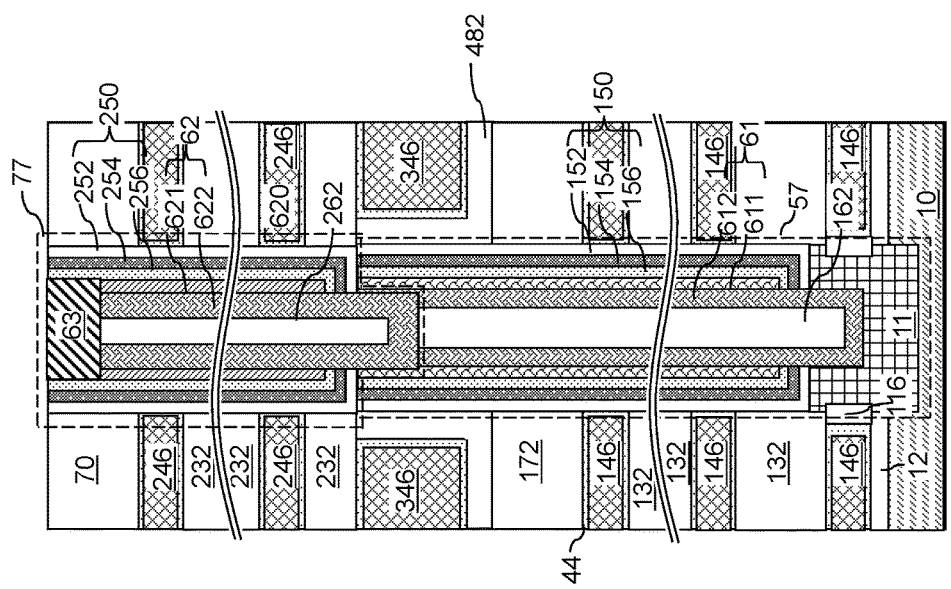

THREE-DIMENSIONAL MEMORY DEVICES CONTAINING INTER-TIER DUMMY MEMORY CELLS AND METHODS OF MAKING THE SAME

RELATED APPLICATIONS

The present application claims the benefit of priority of U.S. Provisional Application Ser. No. 62/437,944 filed on Dec. 22, 2016, the entire contents of which are incorporated herein by reference.

FIELD

The present disclosure relates generally to the field of three-dimensional memory devices and specifically to multi-tier three-dimensional memory devices containing dummy memory cells for providing inter-tier connection and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Some of the challenges for fabricating a multi-tier memory stack structure include formation of memory openings having high aspect ratios and alleviation of effects of misalignment of tier-level memory openings formed in different tier structures. Thus, methods are desired for providing a reliable connection between vertically neighboring memory stack structures.

SUMMARY

According to an aspect of the present disclosure, a three-dimensional memory device is provided, which comprises: a first alternating stack of first insulating layers and first electrically conductive layers located over a substrate; a first memory opening fill structure extending through the first alternating stack and comprising a first memory film and a first vertical semiconductor channel that is laterally surrounded by the first memory film; a joint-level electrically conductive layer overlying the first alternating stack; at least one joint-level doped semiconductor portion contacting a top surface of the first vertical semiconductor channel and located within, and electrically isolated from, the joint-level electrically conductive layer; a second alternating stack of second insulating layers and second electrically conductive layers located over the joint-level electrically conductive layer; and a second memory opening fill structure extending through the second alternating stack and comprising a second memory film and a second vertical semiconductor channel that is laterally surrounded by the second memory film and vertically extends into the at least one joint-level doped semiconductor portion. The first memory film and the second memory film are vertically spaced from each other by the at least one joint-level doped semiconductor portion.

According to another aspect of the present disclosure, a three-dimensional memory device is provided, which comprises: a first alternating stack of first insulating layers and first electrically conductive layers located over a substrate; a joint-level electrically conductive layer overlying the first alternating stack; a first memory opening fill structure extending through the first alternating stack and the joint-level electrically conductive layer and comprising a first memory film and a first vertical semiconductor channel that is laterally surrounded by the first memory film; a dielectric liner layer including a horizontal portion that overlies the first alternating stack and underlies the joint-level electrically conductive layer, and a cylindrical vertical portion that laterally surrounds an upper portion of the first memory opening fill structure, wherein the joint-level electrically conductive layer is laterally spaced from the first memory opening fill structure by the cylindrical vertical portion of the dielectric liner layer; a second alternating stack of second insulating layers and second electrically conductive layers located over the joint-level electrically conductive layer and the dielectric liner layer; and a second memory opening fill structure comprising a second memory film and a second vertical semiconductor channel that is laterally surrounded by the second memory film and extends through the second alternating stack and contacting the first vertical semiconductor channel.

According to yet another aspect of the present disclosure, a method of forming a three-dimensional memory device is provided, which comprises the steps of: forming a first alternating stack of first insulating layers and first spacer material layers located over a substrate; forming a first memory opening fill structure through the first alternating stack, wherein the first memory opening fill structure comprises a first memory film and a first vertical semiconductor channel that is laterally surrounded by the first memory film; forming at least one joint-level doped semiconductor portion on a top surface of the first vertical semiconductor channel; forming at least one annular dielectric spacer around the at least one joint-level doped semiconductor portion; forming a joint-level spacer material layer over the first alternating stack and around the at least one joint-level doped semiconductor portion; forming a second alternating stack of second insulating layers and second spacer material layers over the joint-level spacer material layer; and forming a second memory opening fill structure through the second alternating stack, wherein the second memory opening fill structure comprises a second memory film and a second vertical semiconductor channel that is laterally surrounded by the second memory film and contacts the at least one joint-level doped semiconductor portion. The first and second spacer material layers and the joint-level spacer material layers are formed as, or are replaced with, first and second electrically conductive layers and a joint-level electrically conductive layer, respectively.

According to still another aspect of the present disclosure, a method of forming a three-dimensional memory device is provided, which comprises the steps of: forming a first alternating stack of first insulating layers and first spacer material layers over a substrate; forming a joint-level sacrificial planarization layer over the first alternating stack; forming a first memory opening fill structure through the first alternating stack and the joint-level sacrificial planarization layer, wherein the first memory opening fill structure comprises a first memory film and a first vertical semiconductor channel that is laterally surrounded by the first memory film; removing the joint-level sacrificial planarization layer selective to the first memory opening fill structure and the first alternating stack; forming a dielectric liner layer and a joint-level spacer material layer over the first memory opening fill structure and the first alternating stack, wherein the dielectric liner layer includes a horizontal portion that overlies the first alternating stack and underlies the joint-level spacer material layer, and a cylindrical vertical portion that laterally surrounds an upper portion of the first memory opening fill structure, wherein the joint-level spacer material layer is laterally spaced from the first memory opening fill structure by the cylindrical vertical portion of the dielectric liner layer; forming a second alternating stack of second insulating layers and second spacer material layers over the joint-level spacer material layer and the dielectric liner layer; and forming a second memory opening fill structure through the second alternating stack, wherein the second memory opening fill structure comprises a second memory film and a second vertical semiconductor channel that is laterally surrounded by the second memory film and contacts the first vertical semiconductor channel. The first and second spacer material layers and the joint-level spacer material layers are formed as, or are replaced with, first and second electrically conductive layers and a joint-level electrically conductive layer, respectively.

BRIEF DESCRIPTION OF THE DRAWINGS

FIG. 4A is a vertical cross-sectional view of a region including a first-tier memory opening at the processing steps of FIGS. 3A and 3B.

FIG. 4B is a vertical cross-section of the region of the first exemplary structure after formation of an epitaxial channel portion according to the first embodiment of the present disclosure.

FIG. 4C is a vertical cross-sectional view of the region of the first exemplary structure after formation of a memory film and a first outer vertical semiconductor channel according to the first embodiment of the present disclosure.

FIG. 4D is a vertical cross-sectional view of the region of the first exemplary structure after an anisotropic etch that removes horizontal portions of the first outer vertical semiconductor channel and the memory film according to the first embodiment of the present disclosure.

FIG. 4E is a vertical cross-sectional view of the region of the first exemplary structure after formation of a second vertical semiconductor channel according to the first embodiment of the present disclosure.

FIG. 4F is a vertical cross-sectional view of the region of the first exemplary structure after deposition of a dielectric core layer according to the first embodiment of the present disclosure.

FIG. 6C is a vertical cross-sectional view of the region of the first exemplary structure after oxidation of surface portions of the first joint-level doped semiconductor portion according to the first embodiment of the present disclosure.

FIG. 6D is a vertical cross-sectional view of the region of the first exemplary structure after formation of a first joint-level spacer material layer, a joint-level insulating layer, and a second joint-level spacer material layer according to the first embodiment of the present disclosure.

FIG. 6E is a vertical cross-sectional view of the region of the first exemplary structure after optional planarization of the second joint-level spacer material layer according to the first embodiment of the present disclosure.

FIG. 6F is a vertical cross-sectional view of the region of the first exemplary structure after patterning an opening through the joint-level spacer material layers and the joint-level insulating layer and formation of a first annular dielectric spacer according to the first embodiment of the present disclosure.

FIG. 6G is a vertical cross-sectional view of the region of the first exemplary structure after formation of a second annular dielectric spacer according to the first embodiment of the present disclosure.

FIG. 6H is a vertical cross-sectional view of the region of the first exemplary structure after formation of a second joint-level doped semiconductor portion according to the first embodiment of the present disclosure.

FIG. 8A is a top-down view of the first exemplary structure after formation of a second alternating stack of second insulating layers and second sacrificial material layers according to an embodiment of the present disclosure.

FIG. 8B is a vertical cross-sectional view of the first exemplary structure of FIG. 8A along the vertical plane B-B'.

FIG. 9A is a top-down view of the first exemplary structure after formation of second stepped surfaces and a second retro-stepped dielectric material portion according to an embodiment of the present disclosure.

FIG. 9B is a vertical cross-sectional view of the first exemplary structure of FIG. 9A along the vertical plane B-B'.

FIG. 10A is a top-down view of the first exemplary structure after formation of second memory openings and second support openings according to an embodiment of the present disclosure.

FIG. 10B is a vertical cross-sectional view of the first exemplary structure of FIG. 10A along the vertical plane B-B'.

FIG. 11E is a vertical cross-sectional view of the region of the first exemplary structure after formation of a second dielectric core layer according to the first embodiment of the present disclosure.

FIG. 11F is a vertical cross-sectional view of the region of the first exemplary structure after formation of a drain region according to the first embodiment of the present disclosure.

FIG. 12A is a top-down view of the first exemplary structure after formation of second memory stack structures, second dielectric cores, drain regions, and second support pillar structures according to the first embodiment of the present disclosure.

FIG. 12B is a vertical cross-sectional view of the first exemplary structure of FIG. 12A along the vertical plane B-B'.

FIG. 13A is a top-down view of the first exemplary structure after formation of a contact level dielectric layer and a backside contact trench according to an embodiment of the present disclosure.

FIG. 13B is a vertical cross-sectional view of the first exemplary structure of FIG. 13A along the vertical plane B-B'.

FIG. 14A is a vertical cross-sectional view of a region of the first exemplary structure that includes a stack of a first memory stack structure, a joint-level memory opening fill structure, and a second memory stack structure according to the first embodiment of the present disclosure.

FIG. 14B is a vertical cross-sectional view of the region of the first exemplary structure after formation of a tubular dielectric spacer, a backside blocking dielectric layer, and electrically conductive layers according to the first embodiment of the present disclosure.

FIG. 17A is a top-down view of the first exemplary structure after formation of additional contact via structures according to an embodiment of the present disclosure.

FIG. 17B is a vertical cross-sectional view of the first exemplary structure of FIG. 17A along the vertical plane B-B'.

FIG. 20A is a vertical cross-section of a region of a third exemplary structure after formation of a joint-level doped semiconductor layer according to a third embodiment of the present disclosure.

FIG. 20B is a vertical cross-sectional view of the region of the third exemplary structure after patterning the joint-level doped semiconductor layer into a joint-level doped semiconductor portion according to the third embodiment of the present disclosure.

FIG. 20C is a vertical cross-sectional view of the region of the third exemplary structure after oxidation of surface portions of the joint-level doped semiconductor portion according to the third embodiment of the present disclosure.

FIG. 20D is a vertical cross-sectional view of the region of the third exemplary structure after formation of a joint-level spacer material layer and planarization of a top portion of a semiconductor oxide portion according to the third embodiment of the present disclosure.

FIG. 22A is an alternative embodiment of a region of the third exemplary structure at the processing step of FIG. 21F according to the third embodiment of the present disclosure.

FIG. 22B is an alternative embodiment of the region of the third exemplary structure at the processing step of FIG. 21G according to the third embodiment of the present disclosure.

FIG. 25A is a vertical cross-sectional view of a region including a first-tier memory opening at the processing steps of FIGS. 24A and 24B.

FIG. 25B is a vertical cross-section of the region of the fourth exemplary structure after formation of an epitaxial channel portion according to the fourth embodiment of the present disclosure.

FIG. 25C is a vertical cross-sectional view of the region of the fourth exemplary structure after formation of a memory film and a first outer vertical semiconductor channel according to the fourth embodiment of the present disclosure.

FIG. 25D is a vertical cross-sectional view of the region of the fourth exemplary structure after an anisotropic etch that removes horizontal portions of the first outer vertical semiconductor channel and the memory film according to the fourth embodiment of the present disclosure.

FIG. 25E is a vertical cross-sectional view of the region of the fourth exemplary structure after formation of a second vertical semiconductor channel according to the fourth embodiment of the present disclosure.

FIG. 25F is a vertical cross-sectional view of the region of the fourth exemplary structure after deposition of a dielectric core layer according to the fourth embodiment of the present disclosure.

FIG. 25G is a vertical cross-sectional view of the region of the fourth exemplary structure after formation of a first dielectric core according to the fourth embodiment of the present disclosure.

FIG. 25H is a vertical cross-sectional view of the region of the fourth exemplary structure after removal of the joint-level sacrificial planarization layer according to the fourth embodiment of the present disclosure.

FIG. 25I is a vertical cross-sectional view of the region of the fourth exemplary structure after formation of a dielectric liner layer according to the fourth embodiment of the present disclosure.

FIG. 25J is a vertical cross-sectional view of the region of the fourth exemplary structure after formation of a joint-level spacer material layer according to the fourth embodiment of the present disclosure.

FIG. 26A is a top-down view of the fourth exemplary structure after the processing steps of FIG. 25J according to the fourth embodiment of the present disclosure.

FIG. 26B is a vertical cross-sectional view of the fourth exemplary structure of FIG. 26A along the vertical plane B-B'.

FIG. 27A is a top-down view of the fourth exemplary structure after formation of a second alternating stack of second insulating layers and second sacrificial material layers, second stepped surfaces, and a second retro-stepped dielectric material portion according to the fourth embodiment of the present disclosure.

FIG. 27B is a vertical cross-sectional view of the fourth exemplary structure of FIG. 27A along the vertical plane B-B'.

FIG. 28A is a top-down view of the fourth exemplary structure after formation of second memory openings and second support openings according to the fourth embodiment of the present disclosure.

FIG. 28B is a vertical cross-sectional view of the fourth exemplary structure of FIG. 28A along the vertical plane B-B'.

FIG. 29G is a vertical cross-sectional view of the region of the fourth exemplary structure after processing steps corresponding to the processing steps of FIG. 14B according to the fourth embodiment of the present disclosure.

DETAILED DESCRIPTION

Figure 1:
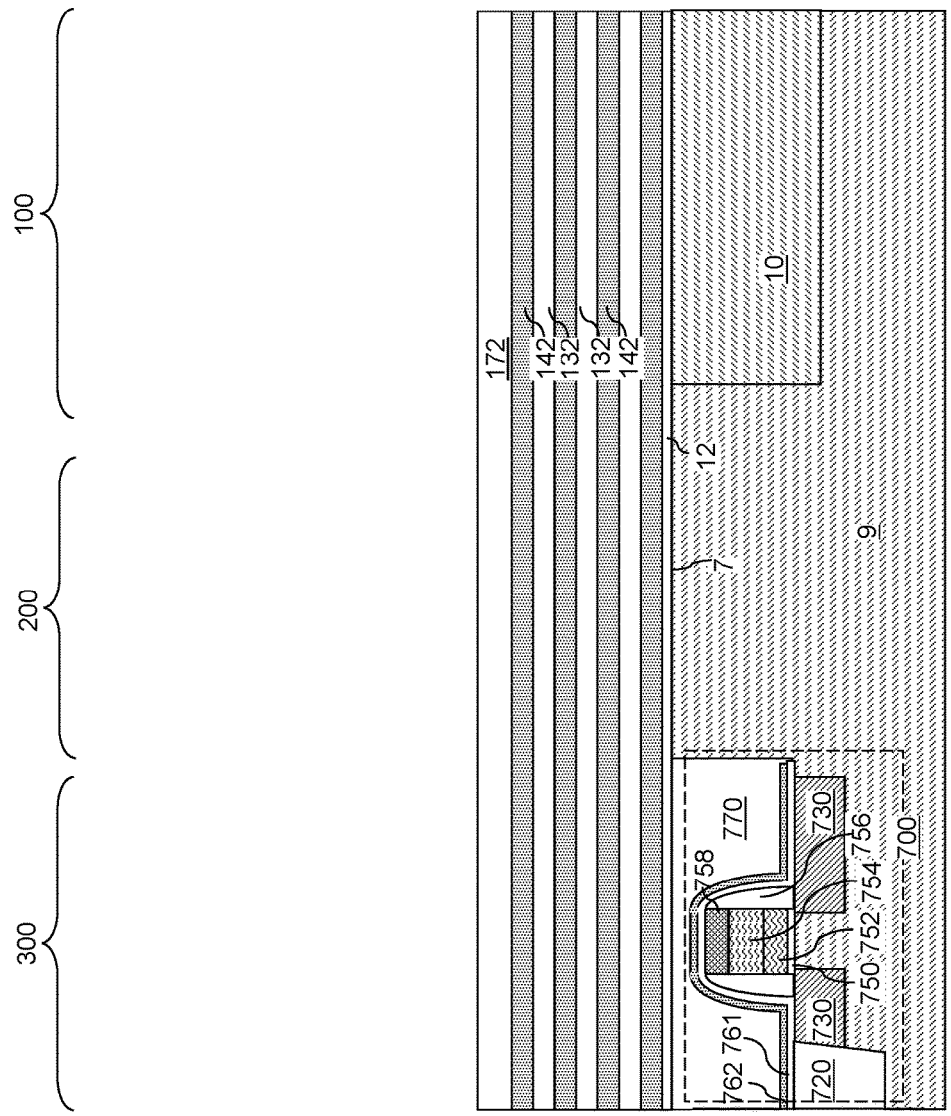
FIG. 1 is a vertical cross-sectional view of a first exemplary structure after formation of at least one peripheral device according to an embodiment of the present disclosure and a first alternating stack of first insulating layers and first sacrificial material layers according to a first embodiment of the present disclosure.

As discussed above, the present disclosure is directed to multi-tier three-dimensional memory devices employing dummy memory cells for providing inter-tier connection and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, an "active region" refers to a source region of a field effect transistor or a drain region of a field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed.

The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9 in regions that do not include the at least one semiconductor device 700.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

A gate dielectric layer 12 can be formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. The first material layers can be insulating layers, in which case the first material layers are herein referred to as first insulating layers 132. The second material layers are herein referred to as first spacer material layers, which provide vertical spacing between the first insulating layers 132. The first spacer material layers may be provided as sacrificial material layers that are subsequently replaced with electrically conductive layers. In this case, the first spacer material layers are referred to as first sacrificial material layers 142. Alternatively, the first spacer material layers may be provided as electrically conductive layers (such as metal layers). In this case, the first spacer material layers are herein referred to as first electrically conductive layers. While the present disclosure is described employing an embodiment in which the first sacrificial material layers 142 are employed as the first spacer material layers, embodiments are expressly contemplated herein in which first electrically conductive layers are employed as the first spacer material layers.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first-tier insulating cap layer 172 can be subsequently formed over the second alternating stack (232, 242). The first-tier insulating cap layer 172 includes a dielectric material that is different from the material of the first sacrificial material layers 142. The first-tier insulating cap layer 172 includes a dielectric material that may be the same as, or different from, the material of the first insulating layers 132. In one embodiment, the first-tier insulating cap layer 172 can include silicon oxide. In one embodiment, the thickness of the first-tier insulating cap layer 172 can be in a range from 20 nm to 100 nm, although lesser and greater thicknesses can also be employed. The first alternating stack (132, 142) and the first insulating cap layer 172 collectively constitutes a first tier structure (132, 142, 172).

Figure 2A:
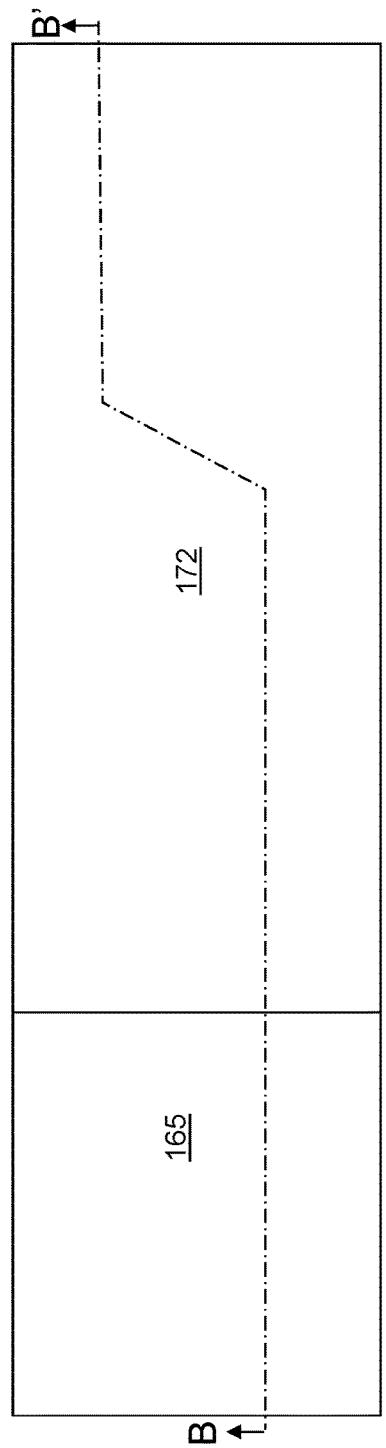
FIG. 2A is a vertical cross-sectional view of the first exemplary structure after formation of first stepped surfaces and a first retro-stepped dielectric material portion according to the first embodiment of the present disclosure.
Figure 2B:
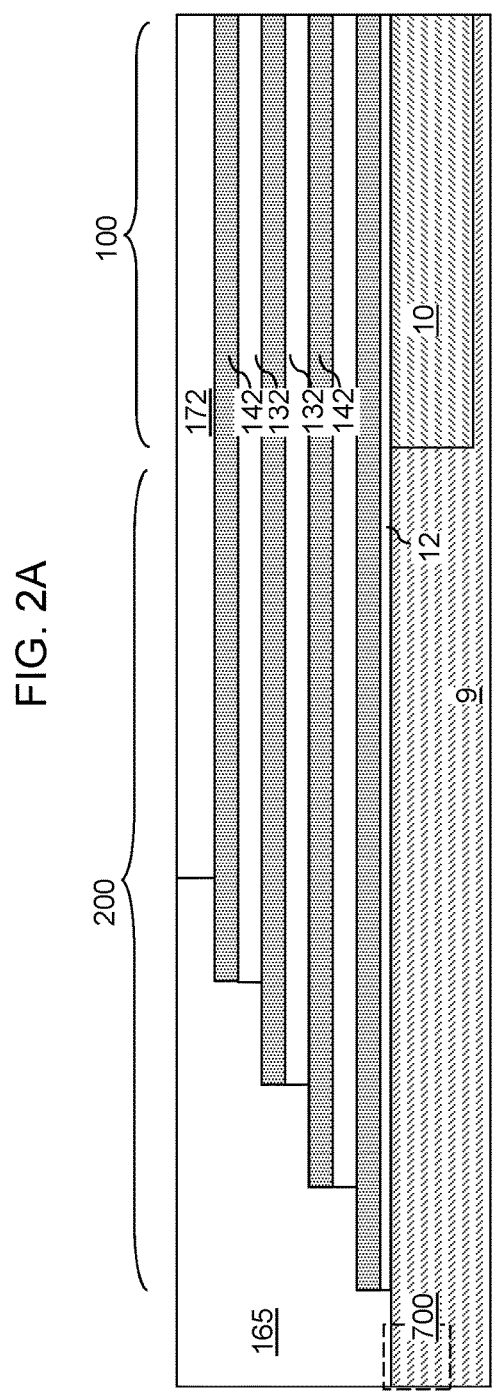
FIG. 2B is a vertical cross-sectional view of the first exemplary structure of FIG. 2A along the vertical plane B-B'.

Referring to FIGS. 2A and 2B, the first tier structure (132, 142, 172) can be patterned to form first stepped surfaces. The first stepped surfaces form a first terrace region, which is located within an area of the contact region 200. The contact region 200 includes a first stepped area in which the first stepped surfaces are formed, and a second stepped area in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first-tier insulating cap layer 172 and the first alternating stack (132, 142) are patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first dielectric material portion, which is herein referred to as a first retro-stepped dielectric material portion 165. The first retro-stepped dielectric material portion 165 is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portion 165. The first retro-stepped dielectric material portion 165 is incorporated into the first tier structure (132, 142, 172, 165).

Figure 3A:
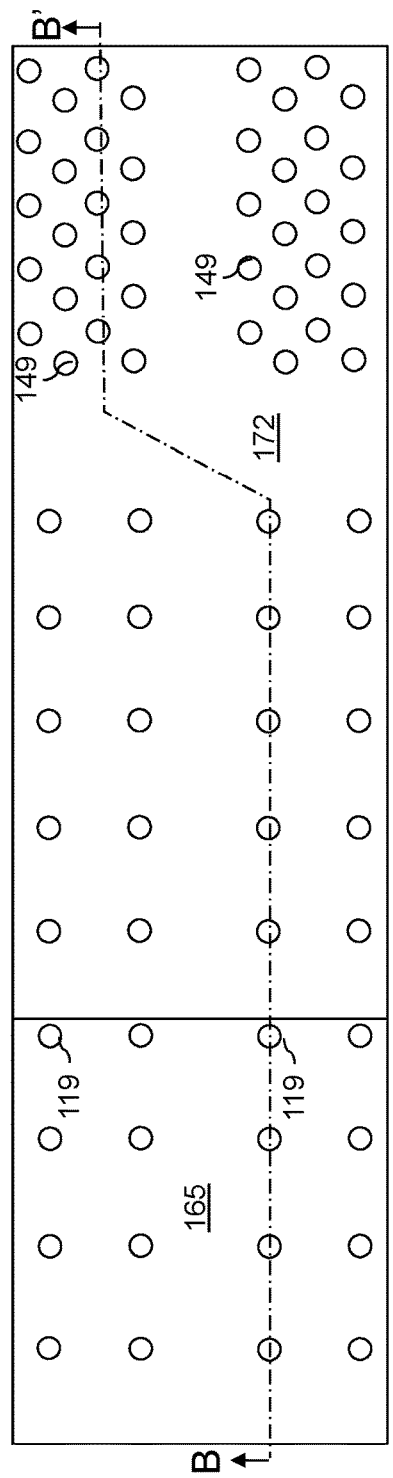
FIG. 3A is a top-down view of the first exemplary structure after formation of first-tier memory openings in a memory array region and first-tier support openings in a contact region according to the first embodiment of the present disclosure.
Figure 3B:
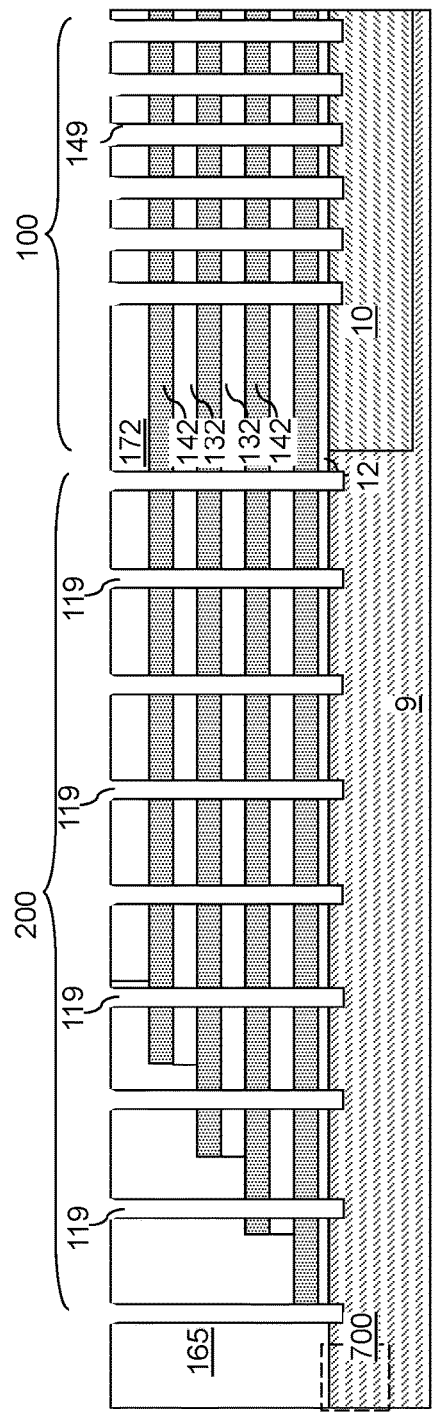
FIG. 3B is a vertical cross-sectional view of the first exemplary structure of FIG. 3A along the vertical plane B-B'.

Referring to FIGS. 3A and 3B, first-tier openings (149, 119) extending to a top surface of the substrate (9, 10) are formed through the first tier structure (132, 142, 172, 165). The first-tier openings (149, 119) include first-tier memory openings 149 that are formed in the memory array region 100 and first-tier support openings 119 that are formed in the contact region 200. The first-tier memory openings 149 and the first-tier support openings 119 can be formed concurrently by a patterning process. To form the first-tier openings (149, 119), a lithographic material stack (not shown) including at least a photoresist layer can be formed over the first tier structure (132, 142, 172, 165), and can be lithographically patterned to form openings within the lithographic material stack. The pattern in the lithographic material stack can be transferred through the entirety of the first tier structure (132, 142, 172, 165) by at least one anisotropic etch that employs the patterned lithographic material stack as an etch mask. Portions of the first tier structure (132, 142, 172, 165) underlying the openings in the patterned lithographic material stack are etched to form the first-tier openings (149, 119). In other words, transfer of the pattern in the patterned lithographic material stack through the first tier structure (132, 142, 172, 165) forms the first-tier openings (149, 119).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first-tier openings (149, 119) can be substantially vertical, or can be tapered. Subsequently, the patterned lithographic material stack can be subsequently removed, for example, by ashing. The first-tier memory openings 149 and the first-tier support openings 119 can be formed concurrently employing the same set of anisotropic etch processes.

In one embodiment, the substrate (9, 10) can be employed as a stopping layer for the anisotropic etch process. In one embodiment, the first-tier openings (149, 119) may extend below the top surface of the substrate (9, 10) by an overetch. The lateral dimensions (e.g., a diameter) of the first-tier openings (149, 119) can be from about 20 nm to 200 nm at an upper portion of each first-tier opening (149, 119), and can be about 10 nm to 150 nm at a lower portion of each first-tier opening (149, 119).

In one embodiment, the first-tier memory openings 149 can be formed as an array of openings, which can be a periodic two-dimensional array of openings. The first-tier support openings 119 can be formed as discrete openings that are mutually separated from one another, and may, or may not, form a periodic two-dimensional array pattern. In one embodiment, the first-tier support openings 119 may form a plurality of periodic one-dimensional array patterns that are parallel among one another.

FIGS. 4A-4G illustrate sequential vertical cross-sectional views of a first-tier memory opening 149 within the first exemplary structure up to the processing step of formation of a first memory stack structure.

Referring to FIG. 4A, a first-tier memory opening 149 in the first exemplary device structure of FIGS. 3A and 3B is illustrated. The first-tier memory opening 149 extends through the first-tier insulating cap layer 172, the first alternating stack (132, 142), the gate dielectric layer 12, and optionally into an upper portion of the semiconductor material layer 10. At this processing step, each first-tier support opening 119 can extend through the first retro-stepped dielectric material portion 165, a subset of layers in the first alternating stack (132, 142), the gate dielectric layer 12, and optionally through the upper portion of the semiconductor material layer 10. The recess depth of the bottom surface of each first-tier memory opening 149 with respect to the top surface of the semiconductor material layer 10 can be in a range from 0 nm to 30 nm, although greater recess depths can also be employed. Optionally, the first sacrificial material layers 142 can be laterally recessed partially to form lateral recesses (not shown), for example, by an isotropic etch.

Referring to FIG. 4B, an optional epitaxial channel portion (e.g., an epitaxial pedestal) 11 can be formed at the bottom portion of each first-tier memory opening 149 and each first-tier support openings 119, for example, by selective epitaxy. As an optional structure, the epitaxial channel portions 11 may be formed, or may be omitted. In case the epitaxial channel portions 11 are not formed, the processing steps of FIG. 4B can be omitted. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a first sacrificial material layer 142. In this case, at least one source select gate electrode can be subsequently formed by replacing each first sacrificial material layer 142 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the first-tier memory opening 149. A first-tier memory cavity 149' is present in the unfilled portion of the first-tier memory opening 149 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 4C, a stack of layers including a first blocking dielectric layer 152, a first charge storage layer 154, a first tunneling dielectric layer 156, and an optional first outer semiconductor channel layer 611 can be sequentially deposited in the first-tier memory openings 149.

The first blocking dielectric layer 152 can include a single dielectric material layer or a stack of a plurality of dielectric material layers. In one embodiment, the first blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 152 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the first blocking dielectric layer 152 includes aluminum oxide. In one embodiment, the first blocking dielectric layer 152 can include multiple dielectric metal oxide layers having different material compositions.

Alternatively or additionally, the first blocking dielectric layer 152 can include a dielectric semiconductor compound such as silicon oxide, silicon oxynitride, silicon nitride, or a combination thereof. In one embodiment, the first blocking dielectric layer 152 can include silicon oxide. In this case, the dielectric semiconductor compound of the first blocking dielectric layer 152 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the first blocking dielectric layer 152 can be omitted, and a backside first blocking dielectric layer can be formed after formation of backside recesses on surfaces of memory films to be subsequently formed.

Subsequently, the first charge storage layer 154 can be formed. In one embodiment, the first charge storage layer 154 can be a continuous layer or patterned discrete portions of a charge trapping material including a dielectric charge trapping material, which can be, for example, silicon nitride. Alternatively, the first charge storage layer 154 can include a continuous layer or patterned discrete portions of a conductive material such as doped polysilicon or a metallic material that is patterned into multiple electrically isolated portions (e.g., floating gates), for example, by being formed within lateral recesses into first sacrificial material layers 142. In one embodiment, the first charge storage layer 154 includes a silicon nitride layer. In one embodiment, the first sacrificial material layers 142 and the first insulating layers 132 can have vertically coincident sidewalls, and the first charge storage layer 154 can be formed as a single continuous layer.

In another embodiment, the first sacrificial material layers 142 can be laterally recessed with respect to the sidewalls of the first insulating layers 132, and a combination of a deposition process and an anisotropic etch process can be employed to form the first charge storage layer 154 as a plurality of memory material portions that are vertically spaced apart. While the present disclosure is described employing an embodiment in which the first charge storage layer 154 is a single continuous layer, embodiments are expressly contemplated herein in which the first charge storage layer 154 is replaced with a plurality of memory material portions (which can be charge trapping material portions or electrically isolated conductive material portions) that are vertically spaced apart.

The first charge storage layer 154 can be formed as a single first charge storage layer of homogeneous composition, or can include a stack of multiple first charge storage layers. The multiple first charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the first charge storage layer 154 may comprise an insulating charge trapping material, such as one or more silicon nitride segments. Alternatively, the first charge storage layer 154 may comprise conductive nanoparticles such as metal nanoparticles, which can be, for example, ruthenium nanoparticles. The first charge storage layer 154 can be formed, for example, by chemical vapor deposition (CVD), atomic layer deposition (ALD), physical vapor deposition (PVD), or any suitable deposition technique for storing electrical charges therein. The thickness of the first charge storage layer 154 can be in a range from 2 nm to 20 nm, although lesser and greater thicknesses can also be employed.

The first tunneling dielectric layer 156 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The first tunneling dielectric layer 156 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric layer 156 can include a stack of a first silicon oxide layer, a silicon oxynitride layer, and a second silicon oxide layer, which is commonly known as an ONO stack. In one embodiment, the first tunneling dielectric layer 156 can include a silicon oxide layer that is substantially free of carbon or a silicon oxynitride layer that is substantially free of carbon. The thickness of the first tunneling dielectric layer 156 can be in a range from 2 nm to 20 nm, although lesser and greater thicknesses can also be employed.

The optional first outer semiconductor channel layer 611 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first outer semiconductor channel layer 611 includes amorphous silicon or polysilicon. The first outer semiconductor channel layer 611 can be formed by a conformal deposition method such as low pressure chemical vapor deposition (LPCVD). The thickness of the first outer semiconductor channel layer 611 can be in a range from 2 nm to 10 nm, although lesser and greater thicknesses can also be employed. A first memory cavity 149' is formed in the volume of each first-tier memory opening 149 that is not filled with the deposited material layers (52, 154, 156, 611).

Referring to FIG. 4D, the optional first outer semiconductor channel layer 611, the first tunneling dielectric layer 156, the first charge storage layer 154, the first blocking dielectric layer 152 are sequentially anisotropically etched employing at least one anisotropic etch process. The portions of the first outer semiconductor channel layer 611, the first tunneling dielectric layer 156, the first charge storage layer 154, and the first blocking dielectric layer 152 located above the top surface of the first-tier insulating cap layer 172 can be removed by the at least one anisotropic etch process. Further, the horizontal portions of the first outer semiconductor channel layer 611, the first tunneling dielectric layer 156, the first charge storage layer 154, and the first blocking dielectric layer 152 at a bottom of each first memory cavity 149' can be removed to form openings in remaining portions thereof. Each of the first outer semiconductor channel layer 611, the first tunneling dielectric layer 156, the first charge storage layer 154, and the first blocking dielectric layer 152 can be etched by a respective anisotropic etch process employing a respective etch chemistry, which may, or may not, be the same for the various material layers.

Each remaining portion of the first outer semiconductor channel layer 611 can have a tubular configuration. The first charge storage layer 154 can comprise a charge trapping material or a floating gate material. In one embodiment, each first charge storage layer 154 can include a vertical stack of first charge storage regions that store electrical charges upon programming. In one embodiment, the first charge storage layer 154 can be a first charge storage layer in which each portion adjacent to the first sacrificial material layers 142 constitutes a first charge storage region.

A surface of the epitaxial channel portion 11 (or a surface of the semiconductor material layer 10 in case the epitaxial channel portions 11 are not employed) can be physically exposed underneath the opening through the first outer semiconductor channel layer 611, the first tunneling dielectric layer 156, the first charge storage layer 154, and the first blocking dielectric layer 152. Optionally, the physically exposed semiconductor surface at the bottom of each first memory cavity 149' can be vertically recessed so that the recessed semiconductor surface underneath the first memory cavity 149' is vertically offset from the topmost surface of the epitaxial channel portion 11 (or of the semiconductor substrate layer 10 in case epitaxial channel portions 11 are not employed) by a recess distance. A first tunneling dielectric layer 156 is located over the first charge storage layer 154. A set of a first blocking dielectric layer 152, a first charge storage layer 154, and a first tunneling dielectric layer 156 in a first-tier memory opening 149 constitutes a memory film 150, which includes a plurality of first charge storage regions (as embodied as the first charge storage layer 154) that are insulated from surrounding materials by the first blocking dielectric layer 152 and the first tunneling dielectric layer 156. In one embodiment, the first outer semiconductor channel layer 611, the first tunneling dielectric layer 156, the first charge storage layer 154, and the first blocking dielectric layer 152 can have vertically coincident sidewalls.

Referring to FIG. 4E, a first inner semiconductor channel layer 612 can be deposited directly on the semiconductor surface of the epitaxial channel portion 11 or the semiconductor substrate layer 10 if the epitaxial channel portion 11 is omitted, and directly on the first outer semiconductor channel layer 611. The first inner semiconductor channel layer 612 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first inner semiconductor channel layer 612 includes amorphous silicon or polysilicon. The first inner semiconductor channel layer 612 can be formed by a conformal deposition method such as low pressure chemical vapor deposition (LPCVD). The thickness of the first inner semiconductor channel layer 612 can be in a range from 2 nm to 10 nm, although lesser and greater thicknesses can also be employed. The first inner semiconductor channel layer 612 may partially fill the first memory cavity 149' in each memory opening, or may fully fill the cavity in each memory opening.

The materials of the first outer semiconductor channel layer 611 and the first inner semiconductor channel layer 612 are collectively referred to as a first semiconductor channel material. In other words, the first semiconductor channel material is a set of all semiconductor material in the first outer semiconductor channel layer 611 and the first inner semiconductor channel layer 612.

Referring to FIG. 4F, in case the first memory cavity 149' in each first-tier memory opening is not completely filled by the first inner semiconductor channel layer 612, a first dielectric core layer 162L can be deposited in the first memory cavity 149' to fill any remaining portion of the first memory cavity 149' within each first-tier memory opening. The first dielectric core layer 162L includes a dielectric material such as silicon oxide or organosilicate glass. The first dielectric core layer 162L can be deposited by a conformal deposition method such as low pressure chemical vapor deposition (LPCVD), or by a self-planarizing deposition process such as spin coating.

Figure 4G:
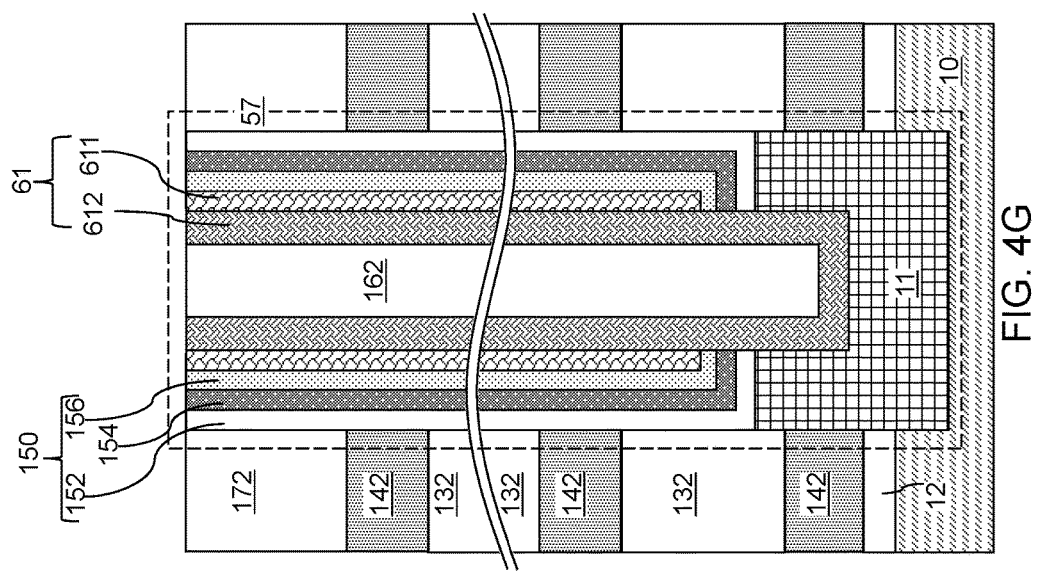
FIG. 4G is a vertical cross-sectional view of the region of the first exemplary structure after formation of a first dielectric core according to the first embodiment of the present disclosure.

Referring to FIG. 4G, the horizontal portion of the first dielectric core layer 162L can be removed, for example, by a recess etch from above the top surface of the first-tier insulating cap layer 172. Each remaining portion of the first dielectric core layer 162L constitutes a dielectric core 162. Further, the horizontal portion of the first inner semiconductor channel layer 612 located above the top surface of the first-tier insulating cap layer 172 can be removed by a planarization process, which can employ a recess etch or chemical mechanical planarization (CMP). Each remaining portion of the first inner semiconductor channel layer 612 can be located entirely within a first-tier memory opening 149 or entirely within a first-tier support opening 119.

Each adjoining pair of a first outer semiconductor channel layer 611 and a first inner semiconductor channel layer 612 can collectively form a first vertical semiconductor channel 61 through which electrical current can flow when a vertical NAND device including the first vertical semiconductor channel 61 is turned on. A first tunneling dielectric layer 156 is surrounded by a first charge storage layer 154, and laterally surrounds a portion of the first vertical semiconductor channel 61. Each adjoining set of a first blocking dielectric layer 152, a first charge storage layer 154, and a first tunneling dielectric layer 156 collectively constitute a first memory film 150, which can store electrical charges with a macroscopic retention time. In some embodiments, a first blocking dielectric layer 152 may not be present in the first memory film 150 at this step, and a first blocking dielectric layer may be subsequently formed after formation of backside recesses. As used herein, a macroscopic retention time refers to a retention time suitable for operation of a memory device as a permanent memory device such as a retention time in excess of 24 hours. Each contiguous set of material portions that fills a first-tier memory opening 149 constitutes a first memory opening fill structure 57, which can include an epitaxial channel portion 11, a first memory film 150, a first vertical semiconductor channel 61, and a first dielectric core 162. Thus, each first-tier memory opening 149 can be filled with an instance of a first memory opening fill structure 57. Each first-tier support opening 119 can be filled with a first-tier support opening fill structure 17, which can include an epitaxial channel portion 11, a first memory film 150, a first vertical semiconductor channel 61, and a first dielectric core 162.

Figure 5A:
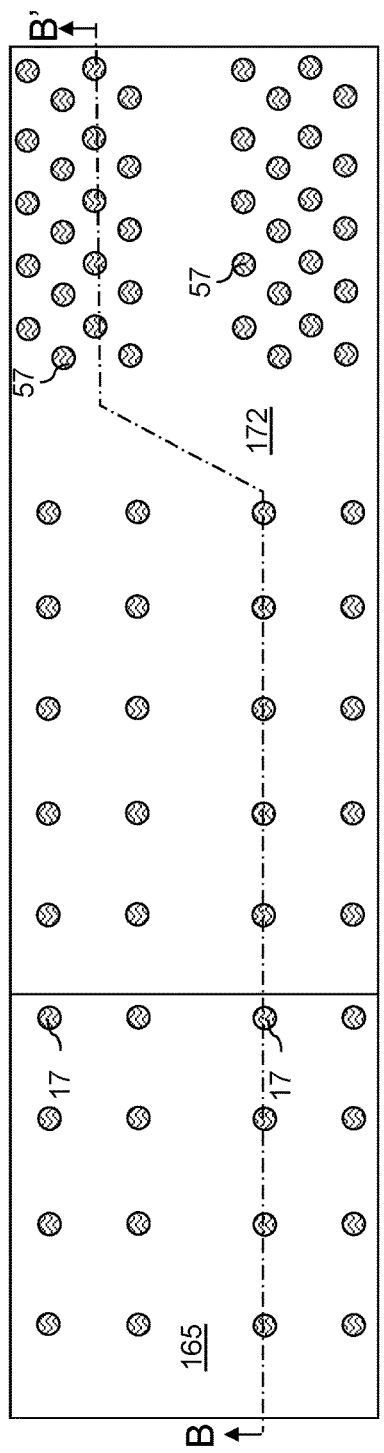
FIG. 5A is a top-down view of the first exemplary structure after formation of first memory stack structures in the first-tier memory openings and formation of first-tier support structures in the first-tier support openings according to an embodiment of the present disclosure.
Figure 5B:
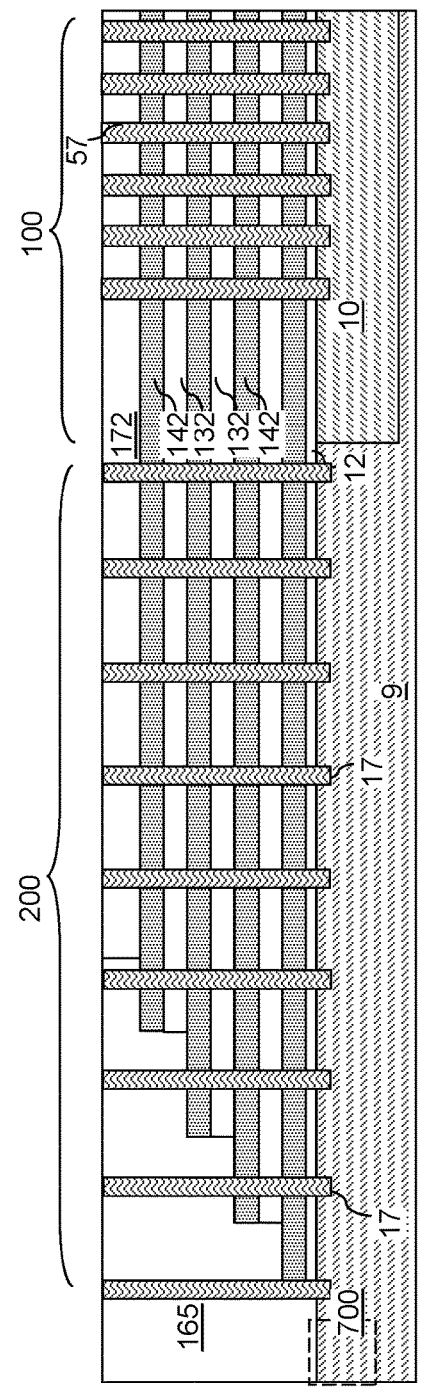
FIG. 5B is a vertical cross-sectional view of the first exemplary structure of FIG. 5A along the vertical plane B-B'.

Referring to FIGS. 5A and 5B, the exemplary structure is illustrated after formation of the first memory opening fill structures 57 in the first-tier memory openings 149 and formation of the first-tier support opening fill structures 17 in the first-tier support openings 119. Each layer (such as the first blocking dielectric layer 152, the first charge storage layer 154, the first tunneling dielectric layer 156, the first outer semiconductor channel layer 611, and the first inner semiconductor channel layer 612) within each first-tier support opening fill structure 17 can have the same composition and the same thickness as the corresponding layer within a first memory opening fill structure 57. The first memory opening fill structures 57 can be arranged as a plurality of two-dimensional periodic arrays in the memory array region 100. Likewise, the first-tier support opening fill structures 17 can be arranged as a plurality of two-dimensional periodic arrays in the contact region 200.

FIGS. 6A-6H illustrate a region overlying a first memory opening fill structure 57 of the first exemplary structure during formation of joint-level doped semiconductor portions and joint-level material layers according to the first embodiment of the present disclosure. As used herein, a "joint level" refers to a level at which two structures are adjoined to each other. Specifically, a first memory opening fill structure 57 can be adjoined to a second memory opening fill structure to be subsequently formed at the joint level, and a first-tier support opening fill structure 17 can be adjoined to a second support opening fill structure to be subsequently formed at the joint level.

Referring to FIG. 8A, a first joint-level doped semiconductor layer 173L is deposited over the first tier structure, which includes the first alternating stack (131, 142), the first-tier cap dielectric layer 172, the first memory opening fill structures 57, and the first support opening fill structures 17. The first joint-level doped semiconductor layer 173L includes a first doped semiconductor material, which can be, for example, doped amorphous silicon, doped polysilicon, or a doped silicon-germanium alloy. The first doped semiconductor material can be doped with dopants of the first conductivity type, i.e., the same conductivity type as the conductivity type of the semiconductor material layer 10. For example, if the semiconductor material layer 10 is doped with p-type dopants, the first joint-level doped semiconductor layer 173L can be doped with p-type dopants. The dopant concentration of the first joint-level doped semiconductor layer 173L can be in a range from $1.0\times10^{15}/cm^3$ to $1.0\times10^{19}/cm^3$, although lower and higher dopant concentrations can also be employed. The thickness of the first joint-level doped semiconductor layer 173L can be in a range from 20 nm to 100 nm, although lesser and greater thicknesses can also be employed. The first joint-level doped semiconductor layer 173L can be deposited by a conformal deposition method (such as low pressure chemical vapor deposition) or a non-conformal deposition method (such as plasma enhanced chemical vapor deposition).

Figure 6A:
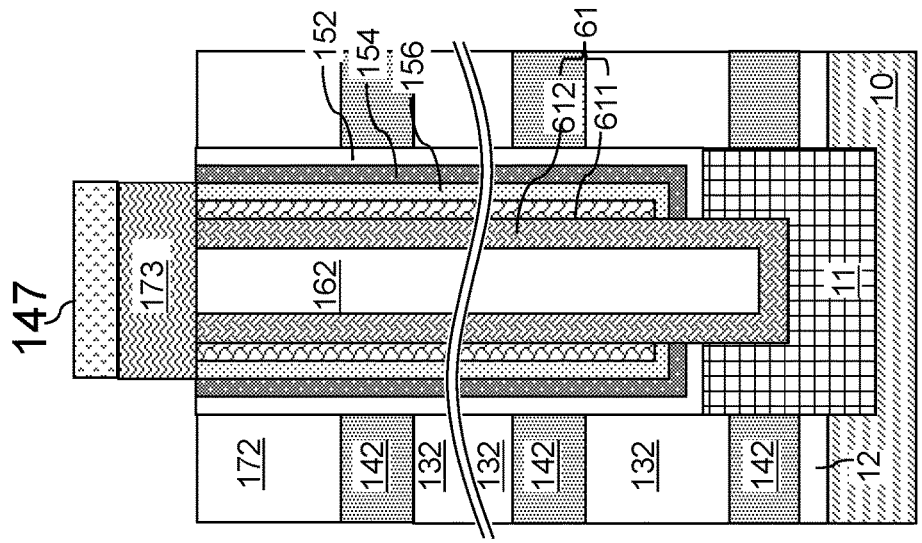
FIG. 6A is a vertical cross-sectional view of a region of the first exemplary structure that includes a first memory stack structure after formation of a first joint-level doped semiconductor layer according to the first embodiment of the present disclosure.
Figure 6B:
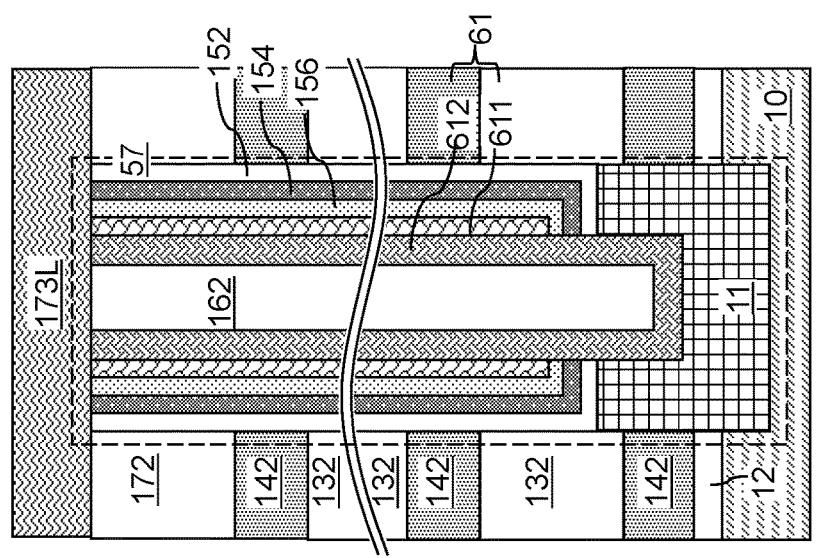
FIG. 6B is a vertical cross-sectional view of the region of the first exemplary structure after patterning the first joint-level doped semiconductor layer into a first joint-level doped semiconductor portion according to the first embodiment of the present disclosure.

Referring to FIG. 6B, a photoresist layer 147 can be applied over the first joint-level doped semiconductor layer 173L and lithographically patterned to cover each of the first memory opening fill structures 57 and each of the first-tier support opening fill structures 17. Physically exposed portions of the first joint-level doped semiconductor layer 173L can be removed by an anisotropic etch. Each remaining portion of the first joint-level doped semiconductor layer 173L constitutes a first joint-level doped semiconductor portion 173. Each first joint-level doped semiconductor portion 173 covers and protects the underlying first vertical semiconductor channel 61 from oxidation during a subsequent oxidation process. The photoresist layer can be subsequently removed, for example, by ashing. The width (e.g., diameter) of the doped semiconductor portion 173 can be smaller than that of the first memory opening 149 (e.g., 20-25 nm smaller than a 100 nm first memory opening 149) but larger than that of the first memory cavity 149' (e.g., about 20 nm larger than a 60 nm first memory cavity 149') to account for misalignment of the layers (e.g., about 10 nm misalignment).

Referring to FIG. 6C, an oxidation process is performed to convert physically exposed surface portions of each first joint-level doped semiconductor portion 173 into a dielectric oxide material. Each oxidized surface portion of the first joint-level doped semiconductor portions 173 constitutes a dielectric oxide portion 174', which includes a dielectric oxide of the semiconductor material of the first joint-level doped semiconductor portions 173, and may include silicon oxide. Thermal oxidation or plasma oxidation may be employed to form the dielectric oxide portions 174'. The thickness of each dielectric oxide portion 174', as measured between an inner sidewall and an outer sidewall, can be in a range from 10 nm to 50 nm, such as 10 to 15 nm, although lesser and greater thicknesses can also be employed. In an alternative embodiment shown in the dashed line inset in FIG. 6C, only the sidewalls of the first joint-level doped semiconductor portions 173 are oxidized to form a first annular dielectric spacer 174. In this alternative embodiment, a mask 147, such as the patterned photoresist layer used to etch portions 173, is left on the top surface of the etched portions 173 while leaving the sidewalls of the portions 173 exposed. The exposed sidewalls of the portions 173 are then oxidized to form the first annular dielectric spacers 174 followed by removing the mask 147.

Referring to FIG. 6D, a first joint-level spacer material layer 175, a joint-level insulating layer 176, and a second joint-level spacer material layer 177 can be sequentially formed. The first joint-level spacer material layer 175 and the second joint-level spacer material layers 177 can include the same material as the first spacer material layers in the first alternating stack (132, 142). If the first spacer material layers are provided as first sacrificial material layers 142, the first joint-level spacer material layer 175 and the second joint-level spacer material layers 177 can include the same sacrificial material as the first sacrificial material layers 142. If the first spacer material layers are provided as first electrically conductive layers, the first joint-level spacer material layer 175 and the second joint-level spacer material layers 177 can include the same conductive material as the first electrically conductive layers (which are formed as the first spacer material layers). The joint-level insulating layer 176 can include the same insulating material as the first insulating layers 132. The first joint-level spacer material layer 175, the joint-level insulating layer 176, and the second joint-level spacer material layer 177 are collectively referred to as joint-level material layers 180.

The first joint-level spacer material layer 175 can be formed over the first alternating stack (132, 142) and around the first joint-level doped semiconductor portion 173. The joint-level insulating layer 176 is formed over the first joint-level spacer material layer 175. The second joint-level spacer material layer 177 is an additional joint-level spacer material layer that is formed over the joint-level insulating layer 176. Thus, the first joint-level spacer material layer 175, the joint-level insulating layer 176, and the second joint-level spacer material layer 177 are formed over the first joint-level doped semiconductor portions 173 and either the dielectric oxide portion 174' or the spacer 174 (depending on which one is present), as well as over the first alternating stack (132, 142).

The thickness of each of the first joint-level spacer material layer 175, the joint-level insulating layer 176, and the second joint-level spacer material layer 177 can be in a range from 20 nm to 100 nm, although lesser and greater thicknesses can also be employed. Each of the first joint-level spacer material layer 175, the joint-level insulating layer 176, and the second joint-level spacer material layer 177 includes portions that overlie the dielectric oxide portions 174' or the first annular dielectric spacers 174, which protrude upward due to the topography caused by the dielectric oxide portions 174' or the first annular dielectric spacers 174 above each of the first memory opening fill structure 57 and each of the first-tier support opening fill structure 17.

Referring to FIG. 6E, a chemical mechanical planarization (CMP) process can be optionally performed to remove protruding portions of the second joint-level spacer material layer 177 above each of the first memory opening fill structure 57 and each of the first-tier support opening fill structure 17. In this case, the top surface of the joint-level insulating layer 176 may, or may not, be physically exposed above each of the first memory opening fill structure 57 and each of the first-tier support opening fill structure 17. The chemical mechanical planarization process is optional, and thus, may be skipped.

Referring to FIG. 6F, a photoresist layer 157 can be applied over the stack of the first joint-level spacer material layer 175, the joint-level insulating layer 176, and the second joint-level spacer material layer 177, and can be lithographically patterned to form openings over the dielectric oxide portions 174' and the first joint-level doped semiconductor portions 173. The lateral dimensions of each opening in the photoresist layer 157 can be selected such that the outer periphery of each first joint-level doped semiconductor portion 173 is entirely within the area of an overlying opening in the photoresist layer 157. In one embodiment, the outer periphery of each first joint-level doped semiconductor portion 173 can be laterally offset inward from the periphery of an overlying opening in the photoresist layer 157 at least by an overlay tolerance between the first memory opening fill structures and second-tier memory openings to be subsequently formed in a second tier structure to be subsequently formed, i.e., at least by the overlay tolerance between the first-tier memory openings 149 and the second-tier memory openings to be subsequently formed. In one embodiment, the periphery of each opening in the photoresist layer 157 can be located outside the area of the respective underlying dielectric oxide portion 174' or the first annular dielectric spacers 174. In another embodiment shown by the dashed lines, the periphery of each opening in the photoresist layer 157 can be located even with or inside the area of the respective underlying dielectric oxide portion 174' or the first annular dielectric spacers 174.

An anisotropic etch process can be performed to etch the portions of the second joint-level spacer material layer 177, the joint-level insulating layer 176, and the first joint-level spacer material layer 175 that are located within the areas of the openings in the photoresist layer 157. The photoresist layer 157 is employed as an etch mask during the anisotropic etch process. The chemistry of the various steps of the anisotropic etch process can be selected to sequentially etch each material of the second joint-level spacer material layer 177, the joint-level insulating layer 176, and the first joint-level spacer material layer 175 selective to materials of underlying layers. Thus, the material of the second joint-level spacer material layer 177 can be etched selected to the material of the joint-level insulating layer 176 in a first etch step, the material of the joint-level insulating layer 176 can be etched selective to the material of the first joint-level spacer material layer 175 in a second etch step, and the material of the first joint-level spacer material layer 175 can be etched selective to materials of the dielectric oxide portions 174' or the spacers 174 and the first-tier insulating cap layer 172. In one embodiment, the first and second joint-level spacer material layers (175, 177) can include silicon nitride, and the joint-level insulating layer 176 and the first-tier insulating cap layer 172 can include silicon oxide. Each opening in the memory array region 100 that is formed through the stack of the second joint-level spacer material layer 177, the joint-level insulating layer 176, and the first joint-level spacer material layer 175 is herein referred to as a joint-level memory opening. Each opening in the contact region 200 that is formed through the stack of the second joint-level spacer material layer 177, the joint-level insulating layer 176, and the first joint-level spacer material layer 175 is herein referred to as a joint-level support opening. The joint-level memory openings and the joint-level support openings are herein collectively referred to as joint-level openings.

Subsequently, if the horizontal top portion of the dielectric oxide portions 174' is present then it can be etched. Alternatively, if the spacers 174 are formed in the step of FIG. 6C, then the etching step can be omitted. The optional horizontal top portion of the dielectric oxide portions 174' cab be etched selective to the doped semiconductor material of the first joint-level doped semiconductor portions 173 by a fourth step of the anisotropic etch process. For example, a reactive ion etch step employing a chemistry selected from $CF_4/O_2$, $CF_4/CHF_3/Ar$, $C_2F_6$, $C_3F_8$, $C_4F_8/CO$, $C_5F_8$, and $CH_2F_2$ can be employed to etch the dielectric semiconductor oxide material of the horizontal top portions of the dielectric oxide portions 174'. Each remaining annular portion of the dielectric oxide portions 174' constitutes an annular dielectric spacer, which is herein referred to as a first annular dielectric spacer 174. As used herein, an "annular" element refers to an element including a single hole therethrough. Thus, each first annular dielectric spacer 174 is formed from an oxidized surface portion of the first joint-level doped semiconductor portion 173 as provided at the processing steps of FIG. 6B. The photoresist layer 157 is subsequently removed, for example, by ashing. A recessed region is provided within each volume that is laterally enclosed by sidewalls of the second joint-level spacer material layer 177, the joint-level insulating layer 176, and the first joint-level spacer material layer 175 and overlies a respective first joint-level doped semiconductor portion 173 and a respective first annular dielectric spacer 174.

Referring to FIG. 6G, a conformal dielectric material layer including a dielectric material such as silicon oxide and/or a dielectric metal oxide (e.g., aluminum oxide) can be deposited over the top surface of the second joint-level spacer material layer 177 and inside the recessed regions overlying the first annular dielectric spacers 174. The conformal dielectric material layer can be deposited by a conformal deposition process such as low pressure chemical vapor deposition (LPCVD) or atomic layer deposition (ALD). The conformal dielectric layer can be subsequently anisotropically etched to remove horizontal portions overlying the second joint-level spacer material layer 177 and the first joint-level doped semiconductor portions 173. Each remaining portion of the conformal dielectric material layer inside a respective recessed region constitutes a second annular dielectric spacer 178. The composition of the second annular dielectric spacers 178 may be the same as, or may be different from, the composition of the first annular dielectric spacers 174. In one embodiment, the thickness of the conformal dielectric material layer can be selected such that each second annular dielectric spacer 178 overlaps with an outer periphery of a respective first annular dielectric spacer 174 located within the same recessed region. In another embodiment, each second annular dielectric spacer 178 is formed only on the top surface of each respective first annular dielectric spacer 174. In one embodiment, the top surfaces of the first-tier insulating cap layer 172, the first memory opening fill structures 57, and the first-tier support opening fill structures 17 can be entirely covered by the first joint-level spacer material layer 175, the first joint-level doped semiconductor portions 173, the first annular dielectric spacers 174, and optionally by the second annular dielectric spacers 178. In one embodiment, an annular bottom surface of each second annular dielectric spacer 178 can directly contact a top surface of the first-tier insulating cap layer 172. In another embodiment, an annular bottom surface of each second annular dielectric spacer 178 only contacts the top surface of each respective first annular dielectric spacer 174 and does not directly contact a top surface of the first-tier insulating cap layer 172.

Referring to FIG. 6H, a second joint-level doped semiconductor layer is deposited in the remaining volumes of the recessed regions. The second joint-level doped semiconductor layer includes a second doped semiconductor material, which can be, for example, doped amorphous silicon, doped polysilicon, or a doped silicon-germanium alloy. The second doped semiconductor material can be doped with dopants of the first conductivity type. The second joint-level doped semiconductor layer can be deposited by a conformal deposition method (such as low pressure chemical vapor deposition) or a non-conformal deposition method (such as plasma enhanced chemical vapor deposition). The entire remaining volume of each recessed region can be filled with the second joint-level doped semiconductor layer.

Excess portions of the second joint-level doped semiconductor layer can be removed from above the horizontal plane including the top surface of the second joint-level spacer material layer 177 by a planarization process such as chemical mechanical planarization. Each remaining portion of the second joint-level doped semiconductor layer that fills the recessed regions constitutes a second joint-level doped semiconductor portion 179. The second joint-level doped semiconductor portions 179 can include the same doped semiconductor material as, or may include a different doped semiconductor material from, the first joint-level doped semiconductor portions 173. The dopant concentration of the second joint-level doped semiconductor portions 179 can be in a range from $1.0 \times 10^{15}/cm^3$ to $1.0 \times 10^{19}/cm^3$, although lower and higher dopant concentrations can also be employed.

Within each opening through the stack of the first joint-level spacer material layer 175, the joint-level insulating layer 176, and the second joint-level spacer material layer 177, each of the first joint-level spacer material layer 175, the joint-level insulating layer 176, and the second joint-level spacer material layer 177 is laterally spaced from at least one joint-level doped semiconductor portion (173, 179) (i.e., from the first and second joint-level doped semiconductor portions (173, 179)) by at least one annular dielectric spacer (174, 178), (i.e., by the first and/or second annular dielectric spacers (174, 178)). Each contiguous combination of a first joint-level doped semiconductor portion 173, a second joint-level doped semiconductor portion 179, a first annular dielectric spacer 174, and a second annular dielectric spacer 178 that fills a joint-level memory opening is herein referred to as a joint-level memory opening fill structure 67.

Figure 7A:
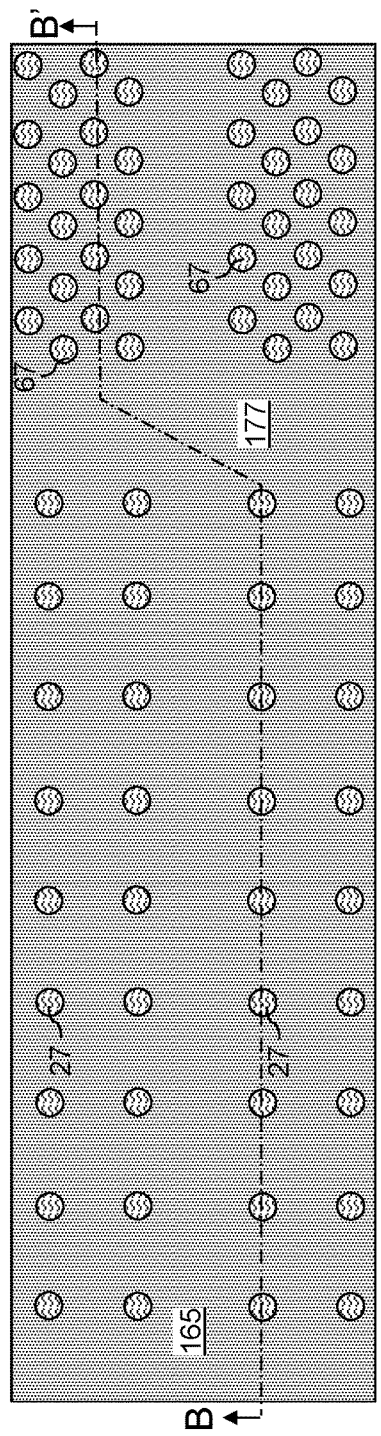
FIG. 7A is a top-down view of the first exemplary structure after formation of joint-level fill structures according to the first embodiment of the present disclosure.
Figure 7B:
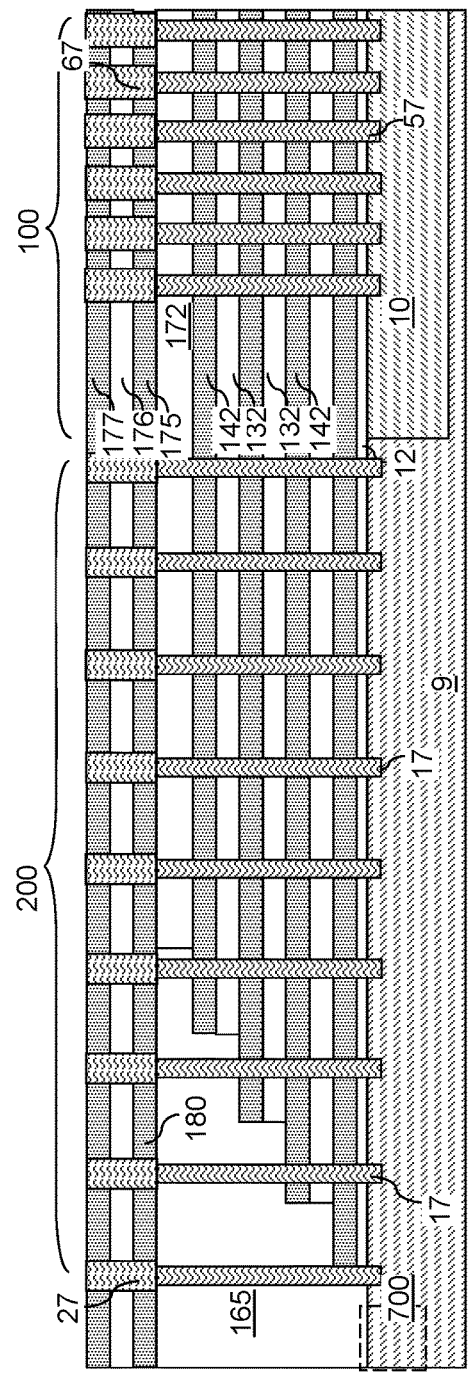
FIG. 7B is a vertical cross-sectional view of the first exemplary structure of FIG. 7A along the vertical plane B-B'.

Referring to FIGS. 7A and 7B, the first exemplary structure is shown at the processing steps of FIG. 6H. Each joint-level support opening is filled with a respective contiguous combination of a first joint-level doped semiconductor portion 173, a second joint-level doped semiconductor portion 179, a first annular dielectric spacer 174, and a second annular dielectric spacer 178, which is herein referred to as a joint-level support opening fill structure 27. The joint-level memory opening fill structures 57 and the joint-level support opening fill structures 27 are collectively referred to as joint-level fill structures (67, 27).

Referring to FIGS. 8A and 8B, a second alternating stack (232, 242) of material layers is subsequently formed on the top surface of the joint-level material layers (175, 176, 177). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. For example, the first and second sacrificial material layers (142, 242) can include silicon nitride, and the first and second insulating layers (132, 232) can include silicon oxide.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

An insulating cap layer 70 can be subsequently formed over the second alternating stack (232, 242). The insulating cap layer 70 includes a dielectric material that is different from the material of the second sacrificial material layers 242. The insulating cap layer 70 includes a dielectric material that may be the same as, or different from, the material of the second insulating layers 232. In one embodiment, the insulating cap layer 70 can include silicon oxide. The second alternating stack (232, 242) and the insulating cap layer 70 constitute a second tier structure (232, 242, 70).

Referring to FIGS. 9A and 9B, additional stepped surfaces are formed in the second alternating stack (232, 242) and in the joint-level material layers (175, 176, 177) in the contact region 200. The additional stepped surfaces are herein referred to as second stepped surfaces. The second stepped surfaces are formed in a second stepped area, which is adjacent to, and does not overlie, the first stepped area of the first stepped surfaces within the first tier structure (132, 142, 172, 165). The second stepped surfaces can be adjacent to, and do not overlie, the stepped interface between the first alternating stack (132, 142) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second alternating stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. Likewise, the joint-level material layers (175, 176, 177) such that each of the joint-level material layers (175, 176, 177) laterally protrude farther than any layer in the second alternating stack (232, 242), and the first joint-level spacer material layer 175 laterally protrudes farther than the second joint-level spacer material layer 177. The etched area includes the area of the contact region 200, which includes the contact area for the second alternating stack (232, 242) and a contact area for the first alternating stack (132, 142).

Thus, the second alternating stack (232, 242) is patterned to form the second stepped surfaces thereupon. The cavity formed by removal of portions of the second alternating stack (232, 242) is herein referred to as a second stepped cavity. The area of the second stepped cavity includes the area of the first retro-stepped first dielectric material portion 165, from which all layers of the second alternating stack (232, 242) are removed. The area of the second stepped cavity further includes the area of the second stepped surfaces of the second alternating stack (232, 242).

Dielectric material is deposited to fill the second stepped cavity. Excess portions of the dielectric material overlying the topmost surface of the second alternating stack (232, 242) are removed, for example, by chemical mechanical planarization. The remaining portion of the deposited dielectric material is retro-stepped, and thus, forms a second dielectric material portion, which is herein referred to as a second retro-stepped dielectric material portion 265. The second retro-stepped dielectric material portion 265 is located on, and over, the second stepped surfaces of the second alternating stack (232, 242). The second retro-stepped dielectric material portion 265 is formed on the second stepped surfaces. The contact region 200 comprises a region of the first stepped surfaces and a region of the second stepped surfaces. Upon formation of the second retro-stepped dielectric material portion 265, the second retro-stepped dielectric material portion 265 is incorporated into the second tier structure (232, 242, 70, 265), i.e., becomes an element of the second tier structure (232, 242, 70, 265).

The first stepped surfaces and the second stepped surfaces are collectively referred to as "stepped surfaces." A first portion of the stepped surfaces is the first stepped surfaces located in the first tier structure (132, 142, 172, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region. Each sacrificial material layer (142, 242) among the first and second sacrificial material layers (142, 242) that is not a bottommost first sacrificial material layer 142 laterally extends less than any underlying layer among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

Referring to FIGS. 10A and 10B, second-tier openings (249, 219) are formed through the second tier structure (232, 242, 265, 70) to the top surface of the first tier structure (132, 142, 172, 165). The second-tier openings (249, 219) include second-tier memory openings 249 that are formed in the memory array region 100 and second-tier support openings 219 that are formed in the contact region 200. Each adjoining combination of a first-tier memory opening 149, a joint-level memory opening, and a second-tier memory opening 249 collectively constitutes a memory opening, or an inter-tier memory opening. Each adjoining combination of a first-tier support opening 119, a joint-level support opening, and a second-tier support opening (that is formed over a respective joint-level support opening) collectively constitutes a support opening, or an inter-tier support opening.

The second-tier memory openings 249 are formed through the second tier structure (232, 242, 70, 265) in areas that overlap with the joint-level memory opening fill structures 67, i.e., with the joint-level memory openings. Thus, each second-tier memory opening 249 can be formed on top of a respective joint-level memory opening fill structure 67. In one embodiment, the bottom surface of each second-tier memory opening 249 can be formed within a periphery of a top surface of an underlying joint-level memory opening fill structure 67, i.e., can have an areal overlap with the top surface of the underlying joint-level memory opening fill structure 67. The second-tier support openings 219 are formed through the second tier structure (232, 242, 70, 265) such that each second-tier support opening 219 is formed in an area that overlaps with the area of an underlying joint-level support opening fill structures 27. In one embodiment, the same lithographic mask may be employed to pattern the first-tier openings (149, 119) and the second-tier openings (249, 219).

The second-tier openings (249, 219) can be formed by a combination of lithographic patterning and an anisotropic etch. For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second-tier openings (249, 219). In other words, transfer of the pattern in the patterned lithographic material stack through the second tier structure (232, 242, 265, 70) forms the second-tier openings (249, 219).

In one embodiment, the chemistry of the anisotropic etch process employed to etch through the materials of the second alternating stack (232, 242) can alternate to optimize etching of the third and fourth materials in the second alternating stack (232, 242) while providing a comparable average etch rate for the second dielectric material portion 265. The anisotropic etch can be, for example, a series of reactive ion etches. The sidewalls of the second-tier openings (249, 219) can be substantially vertical, or can be tapered.

The lateral dimensions (e.g., a diameter) of the second-tier openings (249, 219) can be comparable to the lateral dimensions of the first-tier openings (149, 119). For example, the lateral dimensions of the second-tier openings (249, 219) can be from about 20 nm to 200 nm at an upper portion of each second-tier opening (249, 219), and can be about 10 nm to 150 nm at a lower portion of each second-tier opening (249, 219). In one embodiment, the second-tier memory openings 249 and the first-tier memory openings 149 can be formed as an array of openings, which can be a periodic two-dimensional array of openings. The second-tier support openings 219 and the first-tier support openings 119 can be formed as discrete openings that are mutually separated from one another, and may, or may not, form a periodic two-dimensional array pattern. Subsequently, the patterned lithographic material stack can be subsequently removed, for example, by ashing.

Figure 11B:
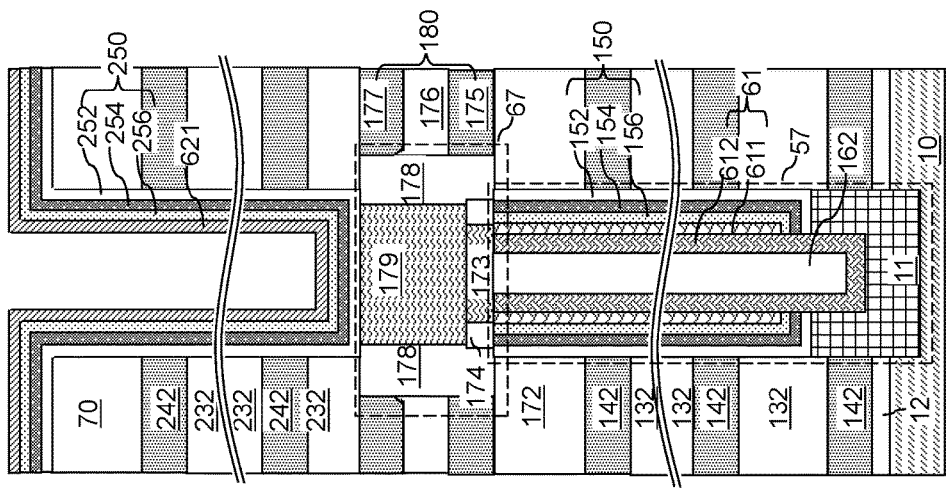
FIG. 11B is a vertical cross-sectional view of the region of the first exemplary structure after formation of a second memory film and a cover material layer according to the first embodiment of the present disclosure.
Figure 11A:
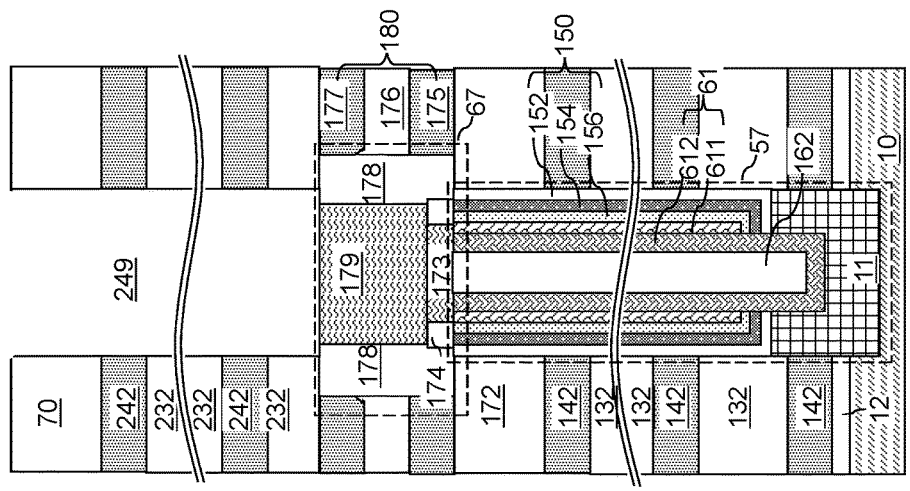
FIG. 11A is a vertical cross-sectional view of a region of the first exemplary structure that includes a first memory stack structure, a joint-level memory opening fill structure, and a second memory opening after the processing steps of FIGS. 10A and 10B.

FIGS. 11A-11F illustrate a region including a stack of a first memory opening fill structure 57, a joint-level memory opening fill structure 67, and a second-tier memory opening 249 during formation of a second memory opening fill structure. FIG. 11A illustrate the region at the processing steps of FIGS. 10A and 10B, i.e., after formation of the second-tier memory openings 249 and the second-tier support openings 219.

Referring to FIG. 11B, a stack of layers including a second blocking dielectric layer 252, a second charge storage layer 254, a second tunneling dielectric layer 256, and an optional second outer semiconductor channel layer 621 can be sequentially deposited in the second-tier memory openings 249. Each adjoining set of a second blocking dielectric layer 252, a second charge storage layer 254, and a second tunneling dielectric layer 256 collectively constitute a second memory film 250, which can store electrical charges with a macroscopic retention time.

The second blocking dielectric layer 252 can include a single dielectric material layer or a stack of a plurality of dielectric material layers. In one embodiment, the second blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. Any of the materials that can be employed for the first blocking dielectric layer 152 can be employed for the second blocking dielectric layer 252.

Subsequently, the second charge storage layer 254 can be formed. In one embodiment, the second charge storage layer 254 can be a continuous layer or patterned discrete portions of a charge trapping material including a dielectric charge trapping material, which can be, for example, silicon nitride. Alternatively, the second charge storage layer 254 can include a continuous layer or patterned discrete portions of a conductive material such as doped polysilicon or a metallic material that is patterned into multiple electrically isolated portions (e.g., floating gates), for example, by being formed within lateral recesses into second sacrificial material layers 242. In one embodiment, the second charge storage layer 254 includes a silicon nitride layer. In one embodiment, the second sacrificial material layers 242 and the second insulating layers 232 can have vertically coincident sidewalls, and the second charge storage layer 254 can be formed as a single continuous layer.

In another embodiment, the second sacrificial material layers 242 can be laterally recessed with respect to the sidewalls of the second insulating layers 232, and a combination of a deposition process and an anisotropic etch process can be employed to form the second charge storage layer 254 as a plurality of memory material portions that are vertically spaced apart. While the present disclosure is described employing an embodiment in which the second charge storage layer 254 is a single continuous layer, embodiments are expressly contemplated herein in which the second charge storage layer 254 is replaced with a plurality of memory material portions (which can be charge trapping material portions or electrically isolated conductive material portions) that are vertically spaced apart.

The second charge storage layer 254 can be formed as a single second charge storage layer of homogeneous composition, or can include a stack of multiple second charge storage layers. The multiple second charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the second charge storage layer 254 may comprise an insulating charge trapping material, such as one or more silicon nitride segments. Alternatively, the second charge storage layer 254 may comprise conductive nanoparticles such as metal nanoparticles, which can be, for example, ruthenium nanoparticles. The second charge storage layer 254 can be formed, for example, by chemical vapor deposition (CVD), atomic layer deposition (ALD), physical vapor deposition (PVD), or any suitable deposition technique for storing electrical charges therein. The thickness of the second charge storage layer 254 can be in a range from 2 nm to 20 nm, although lesser and greater thicknesses can also be employed.

The second tunneling dielectric layer 256 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The second tunneling dielectric layer 256 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the second tunneling dielectric layer 256 can include a stack of a second silicon oxide layer, a silicon oxynitride layer, and a second silicon oxide layer, which is commonly known as an ONO stack. In one embodiment, the second tunneling dielectric layer 256 can include a silicon oxide layer that is substantially free of carbon or a silicon oxynitride layer that is substantially free of carbon. The thickness of the second tunneling dielectric layer 256 can be in a range from 2 nm to 20 nm, although lesser and greater thicknesses can also be employed.

The optional second outer semiconductor channel layer 621 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second outer semiconductor channel layer 621 includes amorphous silicon or polysilicon. The second outer semiconductor channel layer 621 can be formed by a conformal deposition method such as low pressure chemical vapor deposition (LPCVD). The thickness of the second outer semiconductor channel layer 621 can be in a range from 2 nm to 20 nm, although lesser and greater thicknesses can also be employed. A second memory cavity 249' is formed in the volume of each second-tier memory opening 249 that is not filled with the deposited material layers (252, 254, 256, 621).

Figure 11C:
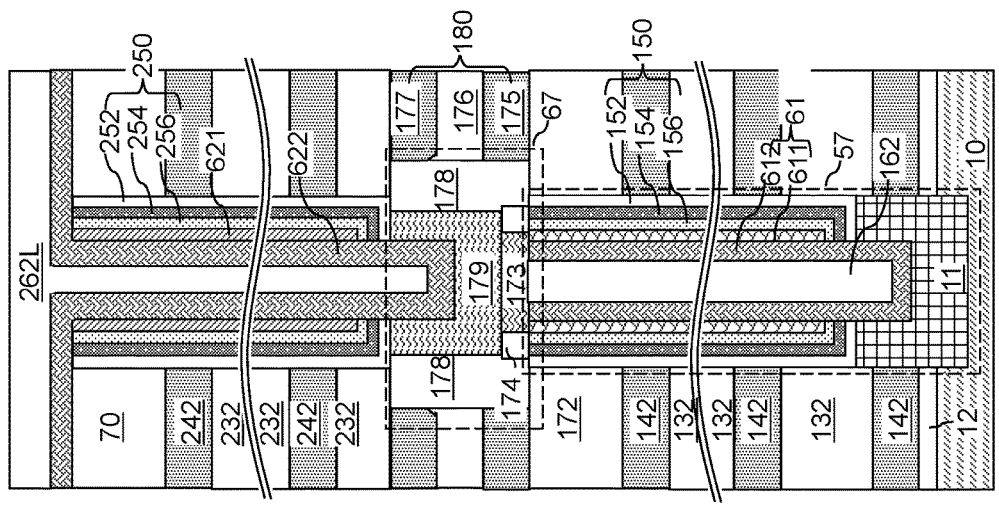
FIG. 11C is a vertical cross-sectional view of the region of the first exemplary structure after an anisotropic etch process that etches horizontal portions of cover material layer and the second memory film according to the first embodiment of the present disclosure.

Referring to FIG. 11C, the optional second outer semiconductor channel layer 621, the second tunneling dielectric layer 256, the second charge storage layer 254, the second blocking dielectric layer 252 are sequentially anisotropically etched employing at least one anisotropic etch process. The portions of the second outer semiconductor channel layer 621, the second tunneling dielectric layer 256, the second charge storage layer 254, and the second blocking dielectric layer 252 located above the top surface of the second-tier insulating cap layer 70 can be removed by the at least one anisotropic etch process. Further, the horizontal portions of the second outer semiconductor channel layer 621, the second tunneling dielectric layer 256, the second charge storage layer 254, and the second blocking dielectric layer 252 at a bottom of each second memory cavity 249' can be removed to form openings in remaining portions thereof. Each of the second outer semiconductor channel layer 621, the second tunneling dielectric layer 256, the second charge storage layer 254, and the second blocking dielectric layer 252 can be etched by a respective anisotropic etch process employing a respective etch chemistry, which may, or may not, be the same for the various material layers.

Each remaining portion of the second outer semiconductor channel layer 621 can have a tubular configuration. The second charge storage layer 254 can comprise a charge trapping material or a floating gate material. In one embodiment, each second charge storage layer 254 can include a vertical stack of second charge storage regions that store electrical charges upon programming. In one embodiment, the second charge storage layer 254 can be a second charge storage layer in which each portion adjacent to the second sacrificial material layers 242 constitutes a second charge storage region.

A surface of an upper portion of the at least one joint-level doped semiconductor portion (i.e., the first and second joint-level doped semiconductor portions (173, 179)) can be physically exposed underneath the opening through the second outer semiconductor channel layer 621, the second tunneling dielectric layer 256, the second charge storage layer 254, and the second blocking dielectric layer 252. Optionally, the physically exposed semiconductor surface at the bottom of each second memory cavity 249' can be vertically recessed so that the recessed semiconductor surface underneath the second memory cavity 249' is vertically offset from the topmost surface of the second joint-level doped semiconductor portions 179 by a recess distance.

A second tunneling dielectric layer 256 is located over the second charge storage layer 254. A set of a second blocking dielectric layer 252, a second charge storage layer 254, and a second tunneling dielectric layer 256 in a second-tier memory opening 249 constitutes a memory film 250, which includes a plurality of second charge storage regions (as embodied as the second charge storage layer 254) that are insulated from surrounding materials by the second blocking dielectric layer 252 and the second tunneling dielectric layer 256. In one embodiment, the second outer semiconductor channel layer 621, the second tunneling dielectric layer 256, the second charge storage layer 254, and the second blocking dielectric layer 252 can have vertically coincident sidewalls.

Figure 11D:
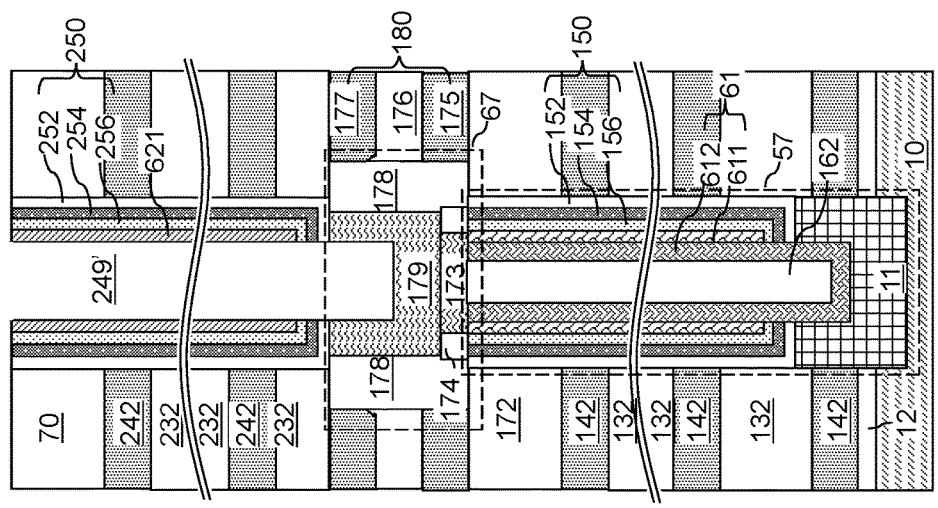
FIG. 11D is a vertical cross-sectional view of the region of the first exemplary structure after formation of a second vertical semiconductor channel layer and a second dielectric core layer according to the first embodiment of the present disclosure.

Referring to FIG. 11D, a second inner semiconductor channel layer 622 can be deposited directly on the semiconductor surface of the second joint-level doped semiconductor portion 179, and directly on the second outer semiconductor channel layer 621. The second inner semiconductor channel layer 622 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second inner semiconductor channel layer 622 includes amorphous silicon or polysilicon. The second inner semiconductor channel layer 622 can be formed by a conformal deposition method such as low pressure chemical vapor deposition (LPCVD). The thickness of the second inner semiconductor channel layer 622 can be in a range from 2 nm to 20 nm, although lesser and greater thicknesses can also be employed. The second inner semiconductor channel layer 622 may partially fill the second memory cavity 249' in each memory opening, or may fully fill the cavity in each memory opening.

The materials of the second outer semiconductor channel layer 621 and the second inner semiconductor channel layer 622 are collectively referred to as a second semiconductor channel material. In other words, the second semiconductor channel material is a set of all semiconductor material in the second outer semiconductor channel layer 621 and the second inner semiconductor channel layer 622.

In case the second memory cavity 249' in each second-tier memory opening is not completely filled by the second inner semiconductor channel layer 622, a second dielectric core layer 262L can be deposited in the second memory cavity 249' to fill any remaining portion of the second memory cavity 249' within each second-tier memory opening. The second dielectric core layer 262L includes a dielectric material such as silicon oxide or organosilicate glass. The second dielectric core layer 262L can be deposited by a conformal deposition method such as low pressure chemical vapor deposition (LPCVD), or by a self-planarizing deposition process such as spin coating.

Referring to FIG. 11E, the horizontal portion of the second dielectric core layer 262L can be removed, for example, by a recess etch from above the top surface of the second-tier insulating cap layer 70. Each remaining portion of the second dielectric core layer 262L constitutes a dielectric core 262. Further, the horizontal portion of the second inner semiconductor channel layer 622 located above the top surface of the second-tier insulating cap layer 70 can be removed by a planarization process, which can employ a recess etch or chemical mechanical planarization (CMP). Each remaining portion of the second inner semiconductor channel layer 622 can be located entirely within a second-tier memory opening 249 or entirely within a second support opening 219.

Each adjoining pair of a second outer semiconductor channel layer 621 and a second inner semiconductor channel layer 622 can collectively form a second vertical semiconductor channel 62 through which electrical current can flow when a vertical NAND device including the second vertical semiconductor channel 62 is turned on. A second tunneling dielectric layer 256 is surrounded by a second charge storage layer 254, and laterally surrounds a portion of the second vertical semiconductor channel 62. In some embodiments, a second blocking dielectric layer 252 may not be present in the second memory film 250 at this step, and a second blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 11F, the top surface of each second dielectric core 262 can be recessed below the top surface of the insulating cap layer 70, for example, by a recess etch to a depth that is located between the top surface of the insulating cap layer 70 and the bottom surface of the insulating cap layer 70. Drain regions 63 can be formed by depositing a doped semiconductor material within each recessed region above the second dielectric cores 262. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a first memory film 150 and a first vertical semiconductor channel 61 (which is a lower portion of the vertical semiconductor channel) within a first-tier memory opening 149 constitutes a first-tier memory stack structure (150, 61). Each combination of a second memory film 250 and a second vertical semiconductor channel 62 (which is an upper portion of the vertical semiconductor channel) within a second-tier memory opening 249 constitutes a second-tier memory stack structure (250, 62). Each contiguous combination of a first vertical semiconductor channel 61, a set of at least one joint-level doped semiconductor portions (173, 179) (which can include a first joint-level doped semiconductor portion 173 and a second joint-level doped semiconductor portion 179), a second vertical semiconductor channel 62 constitutes a vertical semiconductor channel (61, 173, 179, 62). Each combination of an epitaxial channel portion 11 (if present), a first-tier memory stack structure (150, 61), a first dielectric core 162, a joint-level memory opening fill structure 67, a second-tier memory stack structure (250, 62), a second dielectric core 262, and a drain region 63 within an inter-tier memory opening is herein referred to as a memory opening fill structure (57, 67, 77), or an inter-tier memory opening fill structure. Each combination of an epitaxial channel portion 11 (if present), a first-tier memory stack structure (150, 61), a first dielectric core 162, a joint-level support opening fill structure 27, a second-tier memory stack structure (250, 62), a second dielectric core 262, and a drain region 63 within an inter-tier support opening is herein referred to as a support opening fill structure (17, 27, 37), or an inter-tier support opening fill structure.

FIGS. 12A and 12B illustrate the first exemplary structure after formation of the inter-tier memory opening fill structures (57, 67, 77) and the inter-tier support opening fill structures (17, 27, 37), i.e., after the processing steps of FIG. 11F.

Referring to FIGS. 13A, 13B, and 14A, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 500 nm, although lesser and greater thicknesses can also be employed.

If the spacer material layers (142, 242, 175, 177) are electrically conductive layers, then the subsequent processing steps for replacement of the sacrificial material layers with electrically conductive layers can be omitted.

In case the spacer material layers (142, 242, 175, 177) are sacrificial material layers, a photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (132, 142, 172, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

An etchant that selectively etches the second material of the sacrificial material layers (142, 242) and the joint-level spacer material layers (175, 177) with respect to the materials of the insulating layers (132, 232) and the semiconductor material(s) of the substrate (9, 10) can be introduced into the at least one backside trench 79, for example, employing an etch process. Backside recesses 43 are formed in volumes from which the sacrificial material layers (142, 242) and the joint-level spacer material layers (175, 177) are removed. Specifically, first backside recesses are formed in the volumes from which the first sacrificial material layers 142 are removed, second backside recesses are formed in the volumes from which the second sacrificial material layers 242 are removed, and joint-level backside recesses are formed in the volumes from which the joint-level spacer material layers (175, 177) are removed.

The removal of the second material of the sacrificial material layers (142, 242) and the sacrificial materials of the joint-level sacrificial material layers (175, 177) can be selective to the materials of the insulating layers (132, 232, 176, 172, 70), the materials of the retro-stepped dielectric material portions (165, 265), the semiconductor material(s) of the substrate (9, 10), and the material of the outermost layer of the memory films 50. Each backside recess 43 can be a laterally extending cavity having a lateral dimension that is greater than the vertical extent of the cavity. In other words, the lateral dimension of each backside recess 43 can be greater than the height of the backside recess 43. The inter-tier memory openings and the inter-tier support openings are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, a first subset of the backside recesses 43 formed by removal of the first and second sacrificial material layers (142, 242) can define spaces for receiving a respective word line of the array of monolithic three-dimensional NAND strings, while a second subset of the backside recesses formed by removal of the inter-tier spacer material layers (175, 177) can define spaces for receiving a set of at least one channel control electrically conductive layer that controls electrical current through the vertical semiconductor channel (61, 173, 179, 62) without controlling any charge storage elements that are provided in the first and second memory films (150, 250).

Each of the plurality of backside recesses 43 can extend substantially parallel to the top surface of the substrate (9, 10). A backside recess 43 can be vertically bounded by a top surface of an underlying insulating layer (132, 232, 172, or 176) and a bottom surface of an overlying insulating layer (132, 232, 172, 176, or 70). In one embodiment, each backside recess 43 can have a uniform height throughout.

Subsequently, physically exposed surface portions of the optional epitaxial channel portions 11 and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer (shown in FIG. 14A), and to convert each physically exposed surface portion of the semiconductor material layer 10 into a planar dielectric portion 616 (shown in FIG. 15B).

Figure 15A:
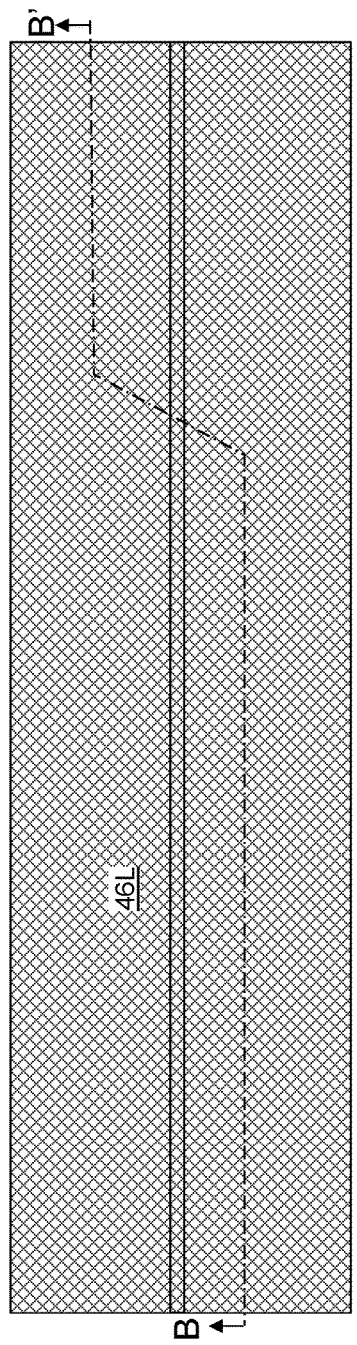
FIG. 15A is a top-down view of the first exemplary structure after formation of first and second electrically conductive layers and a continuous conductive material layer according to an embodiment of the present disclosure.
Figure 15B:
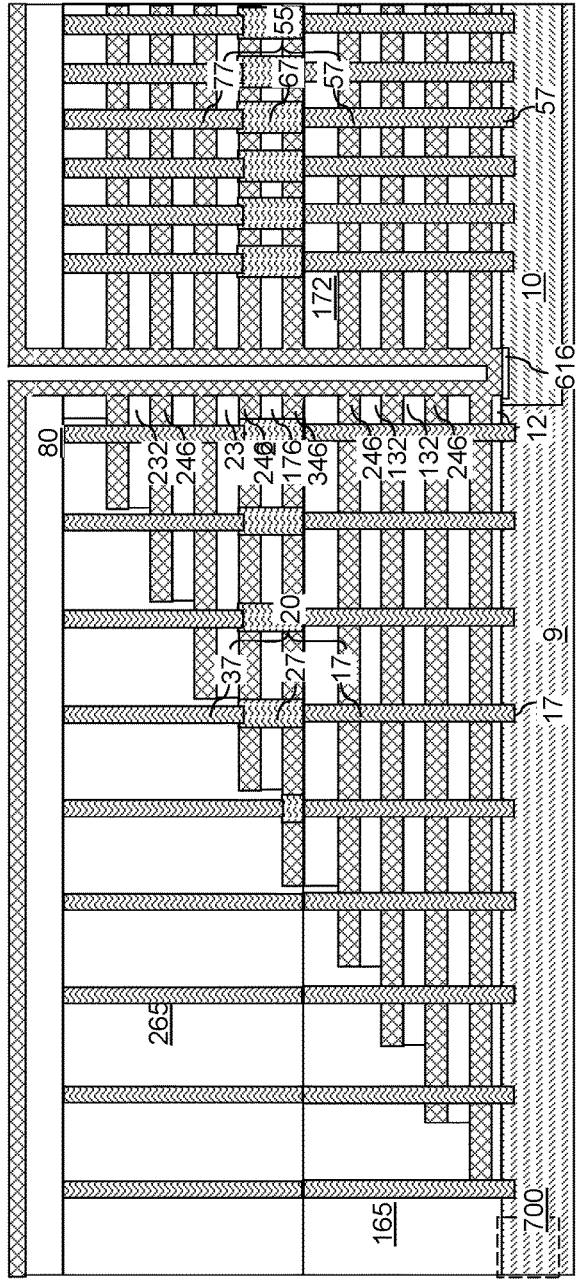
FIG. 15B is a vertical cross-sectional view of the first exemplary structure of FIG. 15A along the vertical plane B-B'.

Referring to FIGS. 14B, 15A, and 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the first and second blocking dielectric layers (152, 252) are present within each memory opening, the backside blocking dielectric layer 44 is optional. In case the first and second blocking dielectric layers (152, 252) are omitted, the backside blocking dielectric layer 44 is present The backside blocking dielectric layer 44 can be formed in the backside recesses 43 and on a sidewall of the backside trench 79. The backside blocking dielectric layer can be formed directly on horizontal surfaces of the insulating layers (132, 232, 172, 176, 170) and physically exposed sidewalls of the first and second blocking dielectric layers (152, 252) within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

At least one conducive material can be deposited to form electrically conductive layers (146, 246, 346). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246, or 346) can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess 43 constitutes an electrically conductive layer (146, 246, or 346). The electrically conductive layers (146, 246, 346) include first electrically conductive layers 146 that are formed in the first backside recesses in the first tier structure, second electrically conductive layers 246 that are formed in the second backside recesses in the second tier structure, and joint-level electrically conductive layers 346 formed at the joint level, i.e., between the first tier structure and the second tier structure and around each of the joint-level fill structures (67, 27). The portion of the at least one conductive material that excludes the electrically conductive layers (146, 246, 346) constitutes continuous metallic material layer 46L. A plurality of electrically conductive layers (146, 246, 346) can be formed in the plurality of backside recesses 43, and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

While the backside recesses 43 remain as cavities, i.e., between removal of the sacrificial material layers (142, 242, 175, 177) and formation of the electrically conductive layers (146, 246, 346) in the backside recesses 43, the memory opening fill structures (57, 67, 77) and the support pillar structures (17, 27, 37) mechanically support the insulating layers (132, 142, 172, 176, 70) and the contact level dielectric layer 80. Thus, each first sacrificial material layer 142 can be replaced with a respective first electrically conductive layer 146, each second sacrificial material layer 242 can be replaced with a respective second electrically conductive layer 246, and each joint-level spacer material layer (175, 177) can be replaced with a respective joint-level electrically conductive layer 346, while the memory opening fill structures (57, 67, 77) and the support pillar structures (17, 27, 37) provide structural support to the insulating layers (132, 142, 172, 176, 70) and the contact level dielectric layer 80.

Figure 16A:
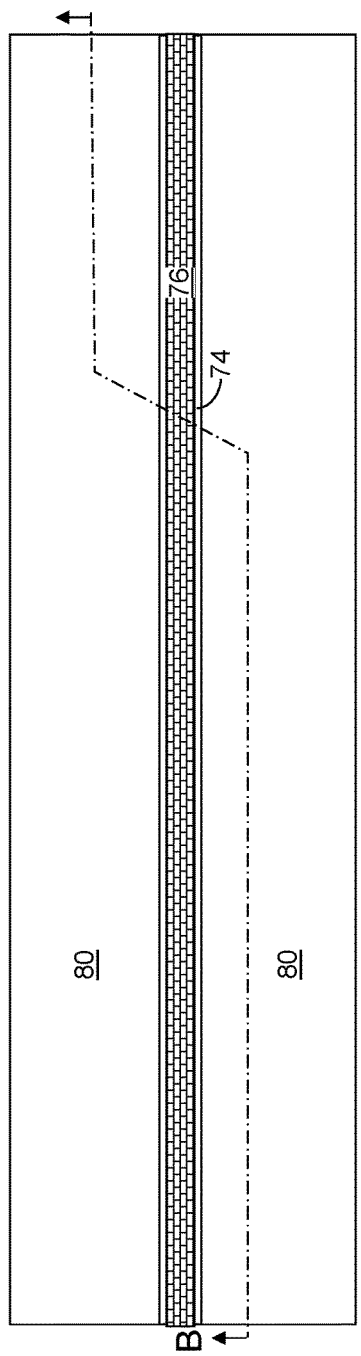
FIG. 16A is a top-down view of the first exemplary structure after removal of the continuous conductive material layer and formation of an insulating spacer, a source region, and a backside contact via structure according to an embodiment of the present disclosure.
Figure 16B:
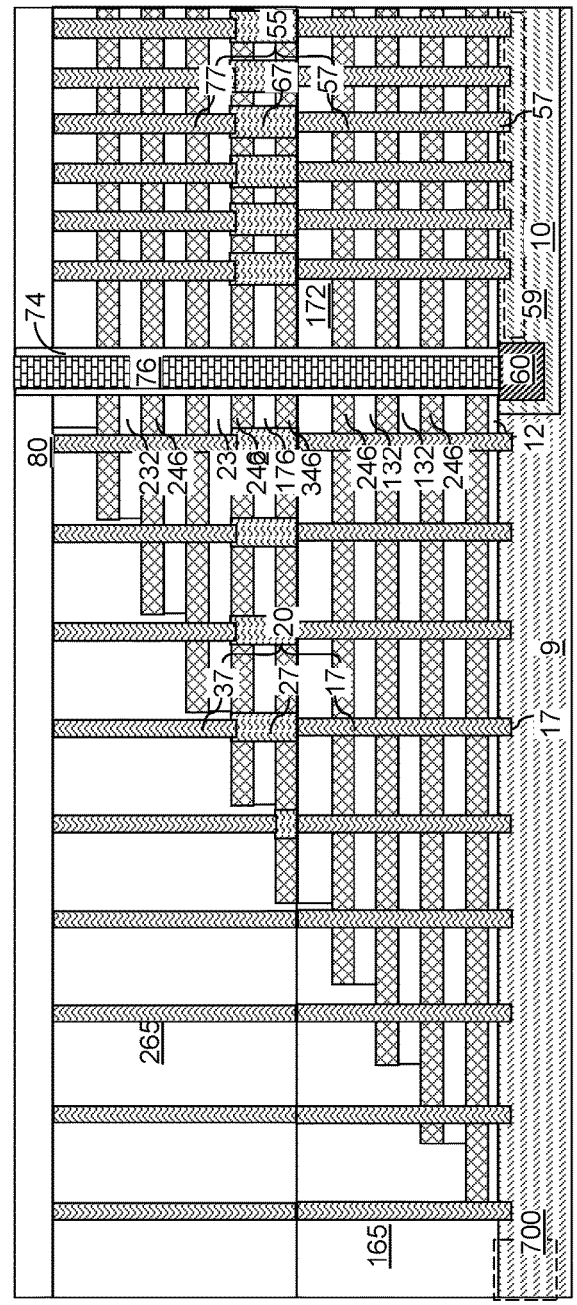
FIG. 16B is a vertical cross-sectional view of the first exemplary structure of FIG. 16A along the vertical plane B-B'.

Referring to FIGS. 16A and 16B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246, 346) in the backside recesses are not removed by the etch process. In one embodiment, the sidewalls of each electrically conductive layer (146, 246, 346) can be vertically coincident after removal of the continuous electrically conductive material layer 46L.

Each of the first and second electrically conductive layers (146, 246) can function as a combination of a plurality of control gate electrodes located at a same level and a word line electrically interconnecting, i.e., electrically shorting, the plurality of control gate electrodes located at the same level. The plurality of control gate electrodes within each of the first and second electrically conductive layers (146, 246, 346) are the control gate electrodes for the vertical memory devices including the first memory film 150, the second memory film 250, and the vertical semiconductor channel (61, 173, 179, 62). In other words, each of the first and second electrically conductive layers (146, 246, 346) can be a word line that functions as a common control gate electrode for the plurality of vertical memory devices. In contrast, the joint-level electrically conductive layers 346 do not control any charge storage, but controls the current flow through the joint-level doped semiconductor portions (173, 179).

An insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LP-CVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 60 can be formed underneath each backside trench 79 by implantation of electrical dopants into physically exposed surface portions of the semiconductor material layer 10. Each source region 60 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 60 can contact a bottom surface of the insulating spacer 74. A surface portion of the semiconductor material layer 10 adjoining a source region 60 and continuously extending to the epitaxial channel portions 11 constitutes a horizontal semiconductor channel 59, which is a common portion of a plurality of semiconductor channels (59, 11, 61, 173, 179, 61) that include the vertical semiconductor channels (61, 173, 179, 62) within the memory opening fill structures (57, 67, 77).

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stacks (132, 146, 232, 246) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 60. Each backside contact via structure 76 can contact a respective source region 60, and can be laterally surrounded by a respective insulating spacer 74.

Referring to FIGS. 17A and 17B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163.

Layer contact via structures 86 can be formed in the terrace region on the electrically conductive layers (146, 246, 346) through the contact level dielectric layer 80, and through the retro-stepped dielectric material portions (165, 265). The layer contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246) and the joint-level electrically conductive layers 346. Peripheral gate contact via structures (not shown) and peripheral active region contact via structures (not shown) can be formed through the retro-stepped dielectric material portions (165, 265) directly on respective nodes of the peripheral devices 700 (shown in FIG. 1).

While the present disclosure is described employing an embodiment in which the first and second spacer material layers are formed as first and second sacrificial material layers (142, 242), respectively, and the joint-level spacer material layers (175, 177) are formed as additional sacrificial material layers, embodiments are expressly contemplated herein in which the first and second spacer material layers are formed as first and second electrically conductive layers (146, 246) at the time of formation of the alternating stacks, and the joint-level spacer material layers (175, 177) are formed as joint-level electrically conductive layers at the time of formation of the joint-level spacer material layers (175, 177). In this case, processing steps employed to replace the sacrificial material layers (142, 242, 175, 177) with the electrically conductive layers (146, 246, 346) can be omitted.

The first exemplary structure comprises at least one annular dielectric spacer (174, 178), which includes a first annular dielectric spacer 174 and a second annular dielectric spacer 178. Further, the first exemplary structure comprises at least one joint-level doped semiconductor portion (173, 179), which includes a first joint-level doped semiconductor portion 173 and a second joint-level doped semiconductor portion 179. The first annular dielectric spacer 174 contacts a top surface of the first memory film 150 and laterally surrounds the first joint-level doped semiconductor portion 173. The second annular dielectric spacer 178 contacts at least one of a top surface and outer sidewall of the first annular dielectric spacer 174 and a bottom surface of the second alternating stack (232, 246) and laterally surrounds the second joint-level doped semiconductor portion 179.

A second exemplary structure can be derived from the first exemplary structure by modifying the joint-level fill structures (67, 27) in which the second annular dielectric spacer is formed by oxidation of a semiconductor layer rather than by deposition of a dielectric layer. For example, the first exemplary structure of FIGS. 5A and 5B can be employed to form the second exemplary structure.

Figure 18A:
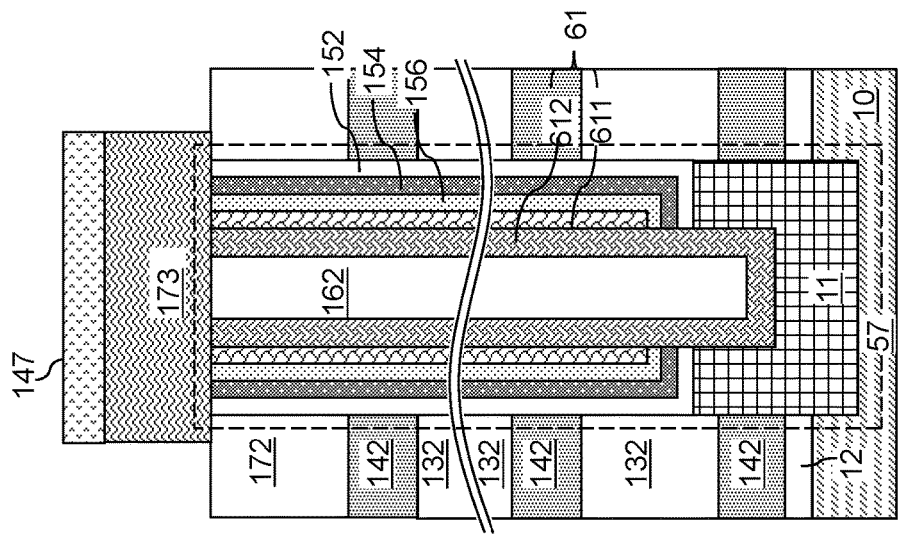
FIG. 18A is a vertical cross-section of a region of a second exemplary structure after formation of a first joint-level doped semiconductor layer according to a second embodiment of the present disclosure.

Referring to FIG. 18A, a first joint-level doped semiconductor layer 173L is deposited over the first tier structure, which includes the first alternating stack (131, 142), the first-tier cap dielectric layer 172, the first memory opening fill structures 57, and the first support opening fill structures 17. The first joint-level doped semiconductor layer 173L includes a first doped semiconductor material, which may have the same composition and the same thickness as in the first embodiment.

Figure 18B:
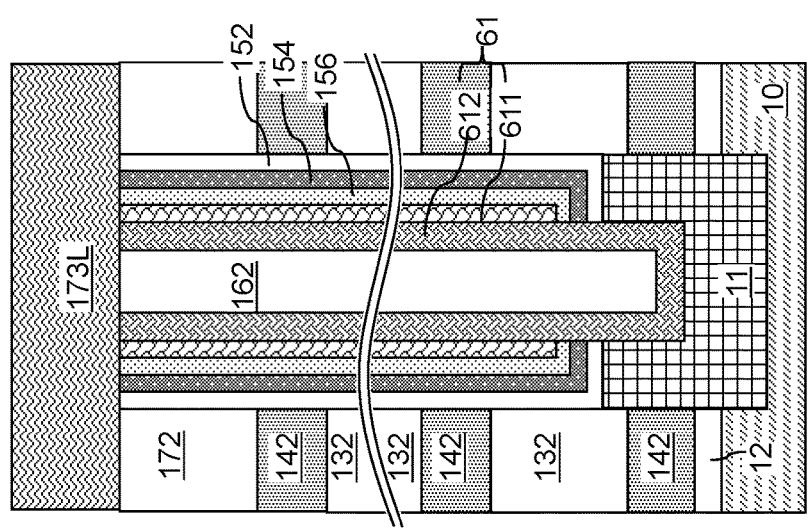
FIG. 18B is a vertical cross-sectional view of the region of the second exemplary structure after patterning the first joint-level doped semiconductor layer into a first joint-level doped semiconductor portion according to the second embodiment of the present disclosure.

Referring to FIG. 18B, a photoresist layer 147 can be applied over the first joint-level doped semiconductor layer 173L and lithographically patterned to cover each of the first memory opening fill structures 57 and each of the first-tier support opening fill structures 17. Physically exposed portions of the first joint-level doped semiconductor layer 173L can be removed by an anisotropic etch. Each remaining portion of the first joint-level doped semiconductor layer 173L constitutes a first joint-level doped semiconductor portion 173. Each first joint-level doped semiconductor portion 173 covers and protects the underlying first vertical semiconductor channel 61 from oxidation during a subsequent oxidation process. In one embodiment, the bottom surface of each first joint-level doped semiconductor portion 173 can contact an entire top surface of an underlying first memory opening fill structure 57. The photoresist layer can be subsequently removed, for example, by ashing.

Figures 18C, 18D:
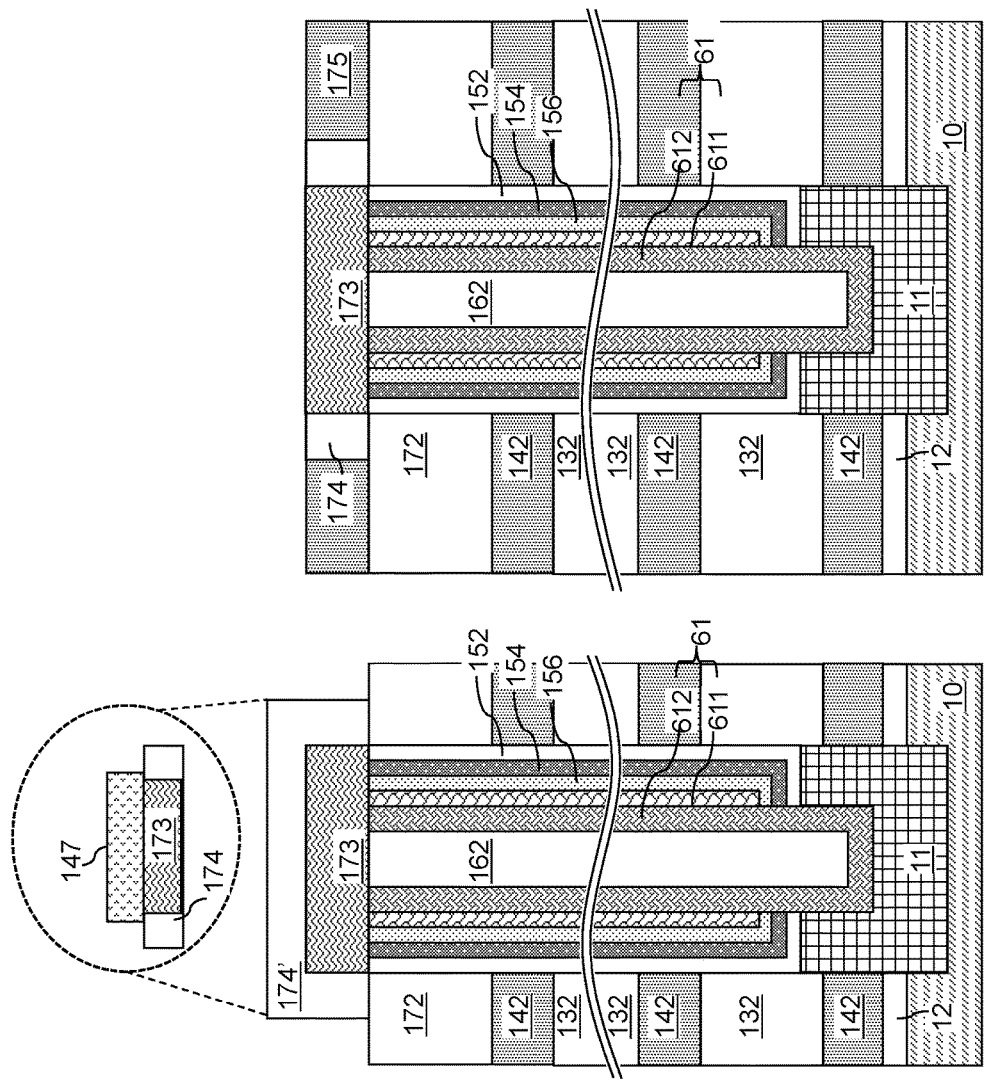
FIG. 18C is a vertical cross-sectional view of the region of the second exemplary structure after oxidation of surface portions of the first joint-level doped semiconductor portion according to the second embodiment of the present disclosure.
FIG. 18D is a vertical cross-sectional view of the region of the second exemplary structure after formation of a first joint-level spacer material layer and planarization of a top portion of a first semiconductor oxide portion according to the second embodiment of the present disclosure.

Referring to FIG. 18C, in one embodiment, an oxidation process is performed to convert physically exposed surface portions of each first joint-level doped semiconductor portion 173 into a dielectric oxide material. Each oxidized surface portion of the first joint-level doped semiconductor portions 173 constitutes a dielectric oxide portion, which is herein referred to as a first dielectric oxide portion 174', which includes a dielectric oxide of the semiconductor material of the first joint-level doped semiconductor portions 173, and may include silicon oxide. Thermal oxidation or plasma oxidation may be employed to form the first dielectric oxide portions 174'. The thickness of each first dielectric oxide portion 174', as measured between an inner sidewall and an outer sidewall, can be in a range from 10 nm to 50 nm, although lesser and greater thicknesses can also be employed. In an alternative embodiment shown in the dashed line inset in FIG. 18C, only the sidewalls of the first joint-level doped semiconductor portions 173 are oxidized to form a first annular dielectric spacer 174. In this alternative embodiment, a mask 147, such as the patterned photoresist layer used to etch portions 173, is left on the top surface of the etched portions 173, while leaving the sidewalls of the portions 173 exposed. The exposed sidewalls of the portions 173 are then oxidized to form the first annular dielectric spacers 174 followed by removing the mask 147.

Referring to FIG. 18D, a first joint-level spacer material layer 175 can be deposited over the first dielectric oxide portion 174' or the first annular dielectric spacers 174 and the first joint-level doped semiconductor portion 173. The first joint-level spacer material layer 175 can include the same material as the first spacer material layers in the first alternating stack (132, 142). If the first spacer material layers are provided as first sacrificial material layers 142, the first joint-level spacer material layer 175 can include the same sacrificial material as the first sacrificial material layers 142. If the first spacer material layers are provided as first electrically conductive layers, the first joint-level spacer material layer 175 can include the same conductive material as the first electrically conductive layers (which are formed as the first spacer material layers).

The first joint-level spacer material layer 175 can be formed over the first alternating stack (132, 142) and around the first joint-level doped semiconductor portion 173 and one of the first dielectric oxide portions 174' or the first annular dielectric spacers 174. The thickness of the first joint-level spacer material layer 175 can be in a range from 20 nm to 100 nm, although lesser and greater thicknesses can also be employed. A chemical mechanical planarization (CMP) process can be performed to remove protruding portions of the first joint-level spacer material layer 175 and a horizontal top portion of each first dielectric oxide portion 174' from above a horizontal plane including top surfaces of the first joint-level doped semiconductor portions 173. Each remaining annular portion of the first dielectric oxide portions 174' (if present) constitutes an annular dielectric spacer, which is herein referred to as a first annular dielectric spacer 174. Thus, each first annular dielectric spacer 174 is formed from an oxidized surface portion of the first joint-level doped semiconductor portion 173 as provided at the processing steps of FIG. 18B or FIG. 18C. In one embodiment, the chemical mechanical planarization process can further remove portions of the first annular dielectric spacers 174 and surface portions of the first joint-level doped semiconductor portions 173 from above a horizontal plane including the top surface of the first joint-level spacer material layer 175. In this case, the top surfaces of the first joint-level spacer material layer 175, the first annular dielectric spacers 174, and the first joint-level doped semiconductor portions 173 can be within a same horizontal plane.

Figures 18E, 18F:
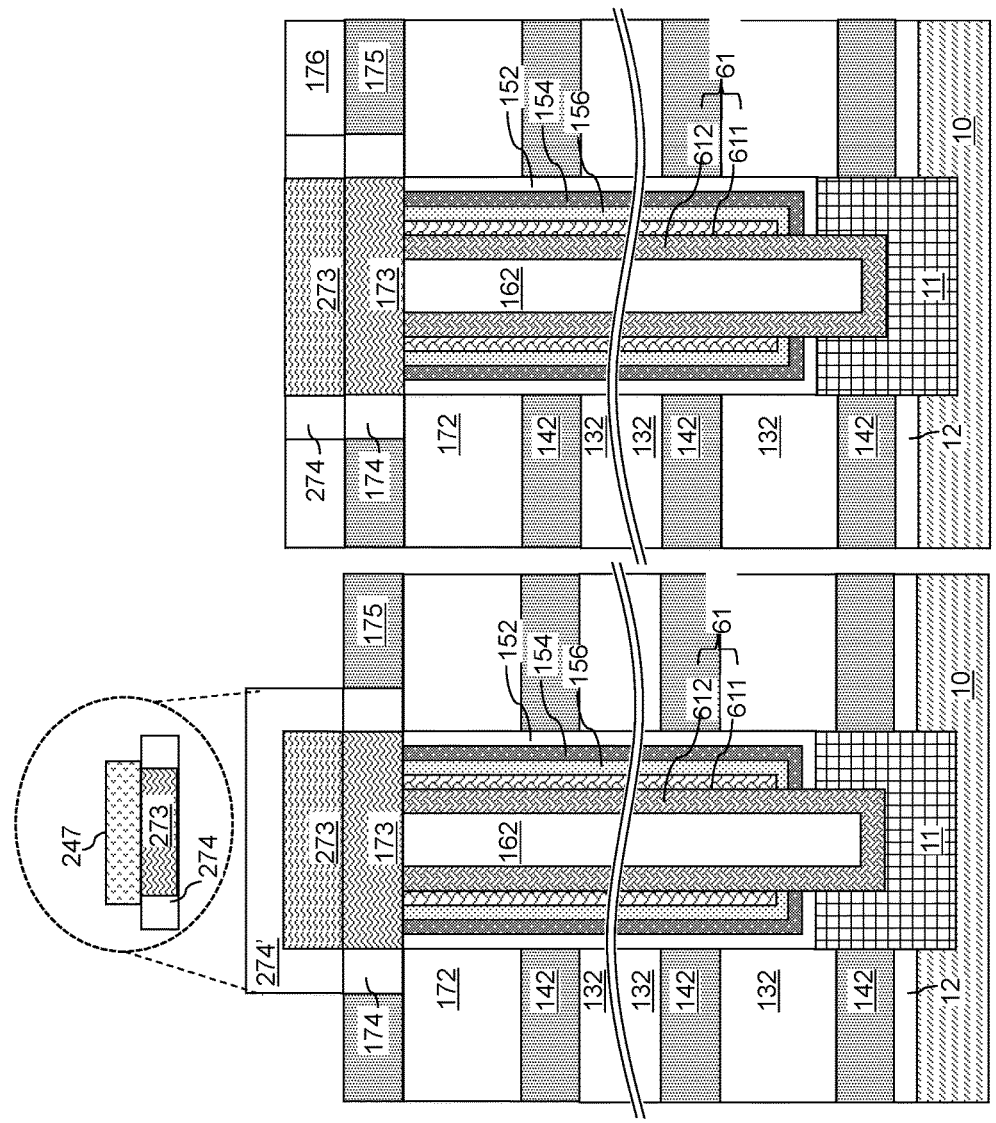
FIG. 18E is a vertical cross-sectional view of the region of the second exemplary structure after formation and partial oxidation of a second joint-level doped semiconductor portion according to the second embodiment of the present disclosure.
FIG. 18F is a vertical cross-sectional view of the region of the second exemplary structure after formation of a joint-level insulating layer and planarization of a top portion of a second semiconductor oxide portion according to the second embodiment of the present disclosure.

Referring to FIG. 18E, a second joint-level doped semiconductor layer is deposited over the first joint-level spacer material layer 175. The second joint-level doped semiconductor layer includes a second doped semiconductor material, which may have the same composition as, or have a different composition from, the material of the first joint-level doped semiconductor layer 173L. The thickness of the second joint-level doped semiconductor layer may be in a range from 20 nm to 100 nm, although lesser and greater thicknesses can also be employed.

A photoresist layer 247 can be applied over the second joint-level doped semiconductor layer and lithographically patterned to cover the first annular dielectric spacers 174 and the first joint-level doped semiconductor portions 173. The lithographic mask employed to pattern the photoresist layer at the processing steps of FIG. 18B can be employed again at this step. Physically exposed portions of the second joint-level doped semiconductor layer can be removed by an anisotropic etch. Each remaining portion of the second joint-level doped semiconductor layer constitutes a second joint-level doped semiconductor portion 273. Each second joint-level doped semiconductor portion 273 covers an underlying first joint-level doped semiconductor portion 173. The photoresist layer can be subsequently removed, for example, by ashing.

An oxidation process is performed to convert physically exposed surface portions of each second joint-level doped semiconductor portion 273 into a dielectric oxide material. Each oxidized surface portion of the second joint-level doped semiconductor portions 273 constitutes a dielectric oxide portion, which is herein referred to as a second dielectric oxide portion 274', which includes a dielectric oxide of the semiconductor material of the second joint-level doped semiconductor portions 273, and may include silicon oxide. Thermal oxidation or plasma oxidation may be employed to form the second dielectric oxide portions 274'. The thickness of each second dielectric oxide portion 274', as measured between an inner sidewall and an outer sidewall, can be in a range from 10 nm to 50 nm, although lesser and greater thicknesses can also be employed. In an alternative embodiment shown in the dashed line inset in FIG. 18E, only the sidewalls of the second joint-level doped semiconductor portions 273 are oxidized to form a second annular dielectric spacer 274. In this alternative embodiment, a mask 247, such as the patterned photoresist layer used to etch portions 273, is left on the top surface of the etched portions 273 while leaving the sidewalls of the portions 273 exposed. The exposed sidewalls of the portions 273 are then oxidized to form the second annular dielectric spacers 274 followed by removing the mask \247.

Referring to FIG. 18F, a joint-level insulating layer 176 can be deposited over the second dielectric oxide portion 274' o the second annular dielectric spacers 274 and the second joint-level doped semiconductor portion 273. The joint-level insulating layer 176 can include the same material as the first insulating layers 132 in the first alternating stack (132, 142). The joint-level insulating layer 176 can be formed over the second joint-level doped semiconductor portions 273 and around the second joint-level doped semiconductor portion 273. The thickness of the joint-level insulating layer 176 can be in a range from 20 nm to 100 nm, although lesser and greater thicknesses can also be employed. A chemical mechanical planarization (CMP) process can be performed to remove protruding portions of the joint-level insulating layer 176 and a horizontal top portion of each second dielectric oxide portion 274' or the second annular dielectric spacers 274 from above a horizontal plane including top surfaces of the second joint-level doped semiconductor portions 273. Each remaining annular portion of the second dielectric oxide portions 274' (if present) constitutes an annular dielectric spacer, which is herein referred to as a second annular dielectric spacer 274. Thus, each second annular dielectric spacer 274 is formed from an oxidized surface portion of the second joint-level doped semiconductor portion 273 as provided at the processing steps of FIG. 18E. In one embodiment, the chemical mechanical planarization process can further remove portions of the second annular dielectric spacers 274 and surface portions of the second joint-level doped semiconductor portions 273 from above a horizontal plane including the top surface of the joint-level insulating layer 176. In this case, the top surfaces of the joint-level insulating layer 176, the second annular dielectric spacers 274, and the second joint-level doped semiconductor portions 273 can be within a same horizontal plane.

Figure 18G:
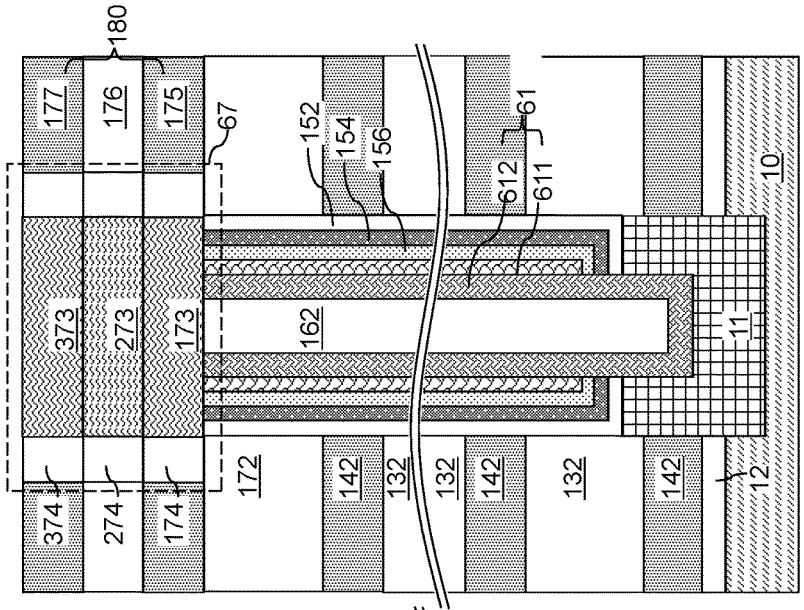
FIG. 18G is a vertical cross-sectional view of the region of the second exemplary structure after formation and partial oxidation of a third joint-level doped semiconductor portion according to the second embodiment of the present disclosure.

Referring to FIG. 18G, a third joint-level doped semiconductor layer is deposited over the joint-level insulating layer 176. The third joint-level doped semiconductor layer includes a third doped semiconductor material, which may have the same composition as, or have a different composition from, the material of the first joint-level doped semiconductor layer 173L and/or the material of the second joint-level doped semiconductor layer. The thickness of the third joint-level doped semiconductor layer may be in a range from 20 nm to 100 nm, although lesser and greater thicknesses can also be employed.

A photoresist layer 347 can be applied over the third joint-level doped semiconductor layer and lithographically patterned to cover the second annular dielectric spacers 274 and the second joint-level doped semiconductor portions 273. The lithographic mask employed to pattern the photoresist layer at the processing steps of FIG. 18B can be employed again at this step. Physically exposed portions of the third joint-level doped semiconductor layer can be removed by an anisotropic etch. Each remaining portion of the third joint-level doped semiconductor layer constitutes a third joint-level doped semiconductor portion 373. Each third joint-level doped semiconductor portion 373 covers an underlying second joint-level doped semiconductor portion 273. The photoresist layer can be subsequently removed, for example, by ashing.

An oxidation process is performed to convert physically exposed surface portions of each third joint-level doped semiconductor portion 373 into a dielectric oxide material. Each oxidized surface portion of the third joint-level doped semiconductor portions 373 constitutes a dielectric oxide portion, which is herein referred to as a third dielectric oxide portion 374', which includes a dielectric oxide of the semiconductor material of the third joint-level doped semiconductor portions 373, and may include silicon oxide. Thermal oxidation or plasma oxidation may be employed to form the third dielectric oxide portions 374'. The thickness of each third dielectric oxide portion 374', as measured between an inner sidewall and an outer sidewall, can be in a range from 10 nm to 50 nm, although lesser and greater thicknesses can also be employed. In an alternative embodiment shown in the dashed line inset in FIG. 18G, only the sidewalls of the third joint-level doped semiconductor portions 373 are oxidized to form a third annular dielectric spacer 374. In this alternative embodiment, a mask 347, such as the patterned photoresist layer used to etch portions 373, is left on the top surface of the etched portions 373 while leaving the sidewalls of the portions 373 exposed. The exposed sidewalls of the portions 373 are then oxidized to form the third annular dielectric spacers 374 followed by removing the mask 347.

Figure 18H:
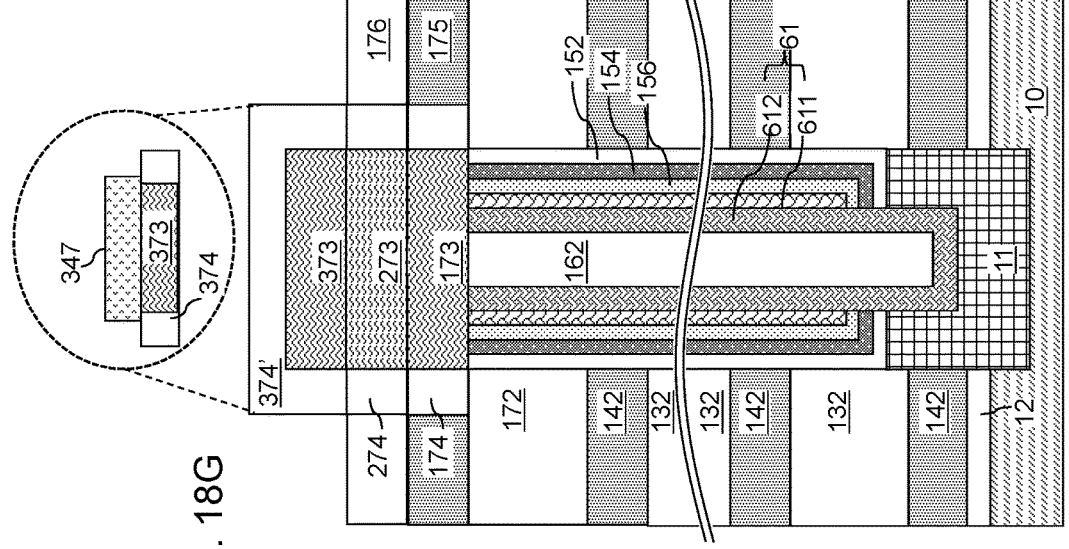
FIG. 18H is a vertical cross-sectional view of the region of the second exemplary structure after formation of a second joint-level spacer material layer and planarization of a top portion of a third semiconductor oxide portion according to the second embodiment of the present disclosure.

Referring to FIG. 18H, a second joint-level spacer material layer 177 can be deposited over the third dielectric oxide portion 374' or the third annular dielectric spacers 374 and the third joint-level doped semiconductor portion 373. The second joint-level spacer material layer 177 can include the same material as the first sacrificial material layers 142 in the first alternating stack (132, 142). The second joint-level spacer material layer 177 can be formed over the third joint-level doped semiconductor portions 373 and around the third annular dielectric spacers 374 or portions 374'. The thickness of the second joint-level spacer material layer 177 can be in a range from 20 nm to 100 nm, although lesser and greater thicknesses can also be employed.

A chemical mechanical planarization (CMP) process can be performed to remove protruding portions of the second joint-level spacer material layer 177 and a horizontal top portion of each third dielectric oxide portion 374' or the third annular dielectric spacers 374 from above a horizontal plane including top surfaces of the third joint-level doped semiconductor portions 373. Each remaining annular portion of the third dielectric oxide portions 374' (if present) constitutes an annular dielectric spacer, which is herein referred to as a third annular dielectric spacer 374. Thus, each third annular dielectric spacer 374 is formed from an oxidized surface portion of the third joint-level doped semiconductor portion 373 as provided at the processing steps of FIG. 18G. In one embodiment, the chemical mechanical planarization process can further remove portions of the third annular dielectric spacers 374 and surface portions of the third joint-level doped semiconductor portions 373 from above a horizontal plane including the top surface of the second joint-level spacer material layer 177. In this case, the top surfaces of the second joint-level spacer material layer 177, the third annular dielectric spacers 374, and the third joint-level doped semiconductor portions 373 can be within a same horizontal plane.

Each of the first joint-level spacer material layer 175, the joint-level insulating layer 176, and the second joint-level spacer material layer 177 is laterally spaced from the first, second, and third joint-level doped semiconductor portions (173, 273, 373) by the first, second, and third annular dielectric spacers (174, 274, 374). Each of the first, second, and third joint-level doped semiconductor portions (173, 273, 373) is formed by deposition and patterning of a respective doped semiconductor material. Each of the first, second, and third joint-level annular dielectric spacers (174, 274, 374) is formed by oxidation of a surface portion of a respective one of the first, second, and third joint-level doped semiconductor portions (173, 273, 373) and an anisotropic etch of the respective one of the first, second, and third joint-level doped semiconductor portions (173, 273, 373).

Subsequently, the processing steps of FIGS. 7A, 7B, 8A, 8B, 9A, 9B, 10A, and 10B can be performed.

Then, the processing steps of FIGS. 19A-19F can be performed in lieu of the processing steps of FIGS. 11A-11F.

Figure 19A:
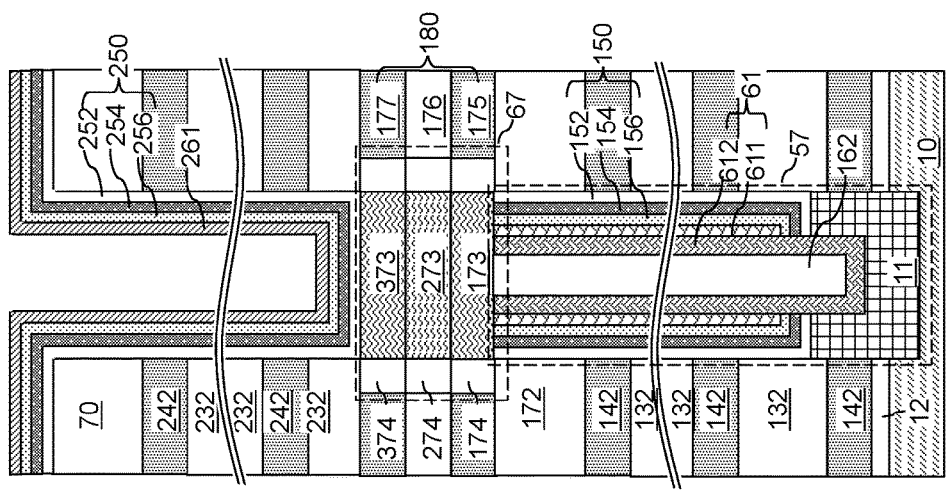
FIG. 19A is a vertical cross-sectional view of a region of the second exemplary structure that includes a first memory stack structure, a joint-level memory opening fill structure, and a second memory opening after performing the processing steps of FIGS. 10A and 10B.

FIG. 19A illustrate a region of the second exemplary structure at the processing steps of FIGS. 10A and 10B, i.e., after formation of the second-tier memory openings 249 and the second-tier support openings 219.

Figure 19B:
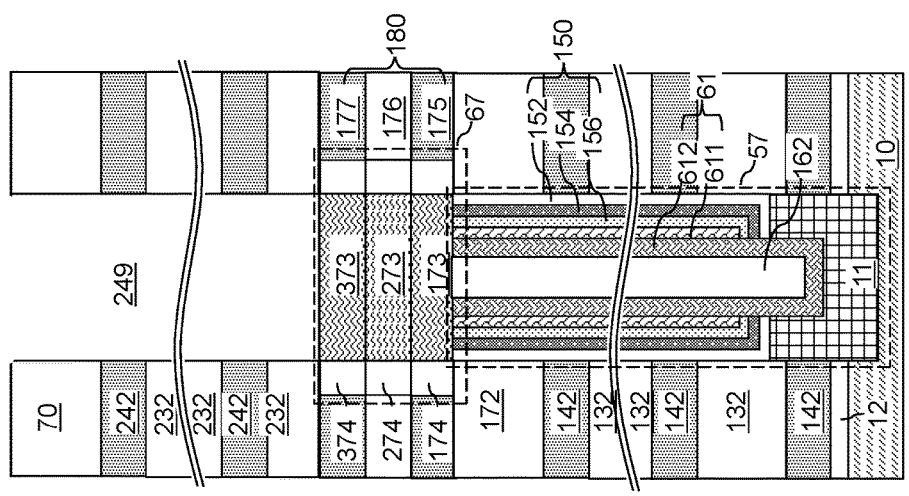
FIG. 19B is a vertical cross-sectional view of the region of the second exemplary structure after formation of a second memory film and a cover material layer according to the second embodiment of the present disclosure.

Referring to FIG. 19B, a stack of layers including a second blocking dielectric layer 252, a second charge storage layer 254, a second tunneling dielectric layer 256, and an optional second outer semiconductor channel layer 621 can be sequentially deposited in the second-tier memory openings 249 employing the processing steps of FIG. 11B.

Figure 19D:
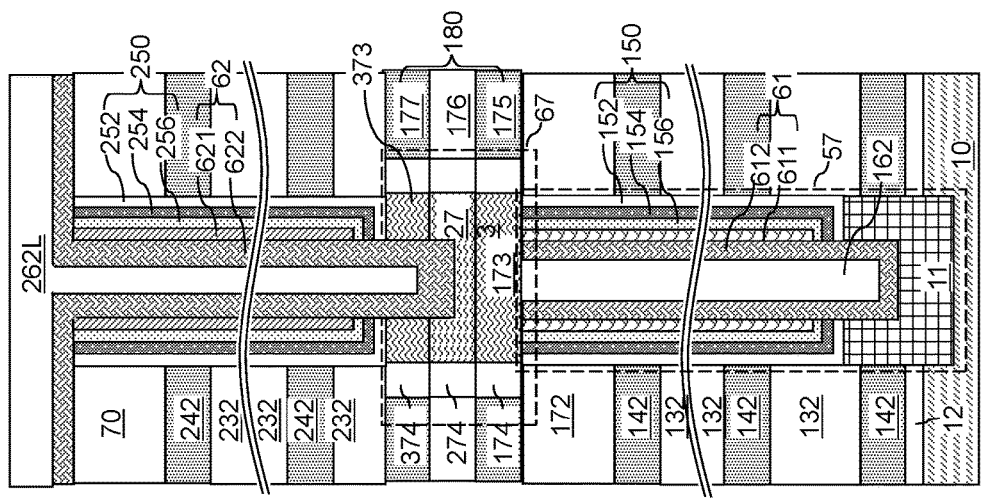
FIG. 19D is a vertical cross-sectional view of the region of the second exemplary structure after optional removal of the cover material layer according to the second embodiment of the present disclosure.
Figure 19C:
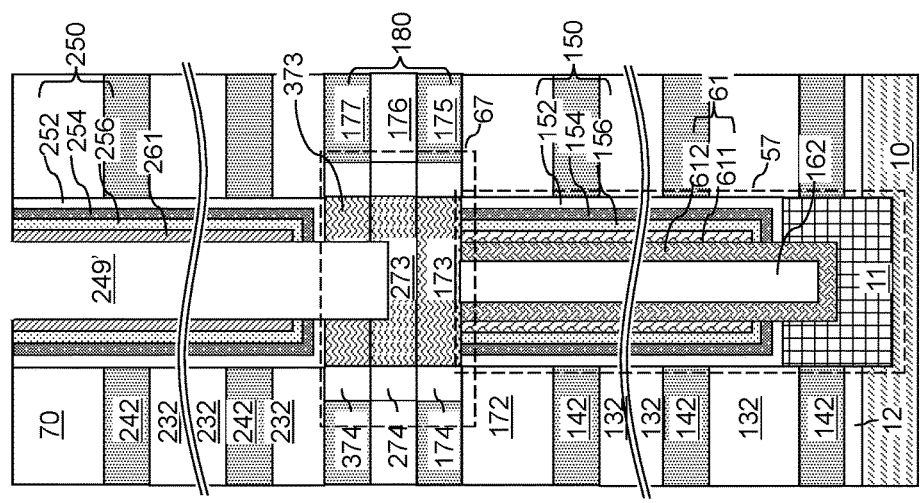
FIG. 19C is a vertical cross-sectional view of the region of the second exemplary structure after an anisotropic etch process that etches horizontal portions of cover material layer and the second memory film according to the second embodiment of the present disclosure.

Referring to FIG. 19C, the optional second outer semiconductor channel layer 621, the second tunneling dielectric layer 256, the second charge storage layer 254, the second blocking dielectric layer 252 are sequentially anisotropically etched employing at least one anisotropic etch process, which can be the same as the anisotropic etch process of FIG. 11C.

Referring to FIG. 19D, a second inner semiconductor channel layer 622 can be deposited directly on the semiconductor surface of the second joint-level doped semiconductor portion 273, and directly on the second outer semiconductor channel layer 621. In case the second memory cavity 249' in each second-tier memory opening is not completely filled by the second inner semiconductor channel layer 622, a second dielectric core layer 262L can be deposited in the second memory cavity 249' to fill any remaining portion of the second memory cavity 249' within each second-tier memory opening. The processing steps of FIG. 11D may be employed.

Figure 19F:
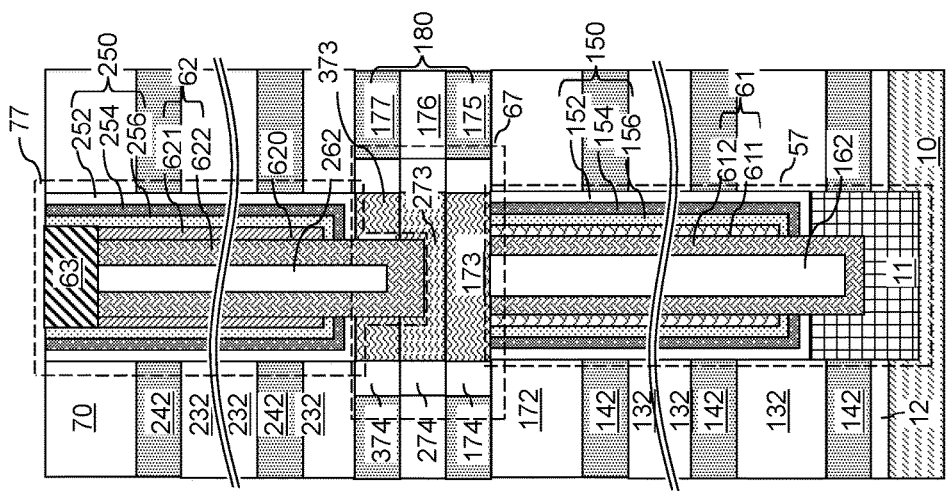
FIG. 19F is a vertical cross-sectional view of the region of the second exemplary structure after formation of a drain region according to the second embodiment of the present disclosure.
Figure 19E:
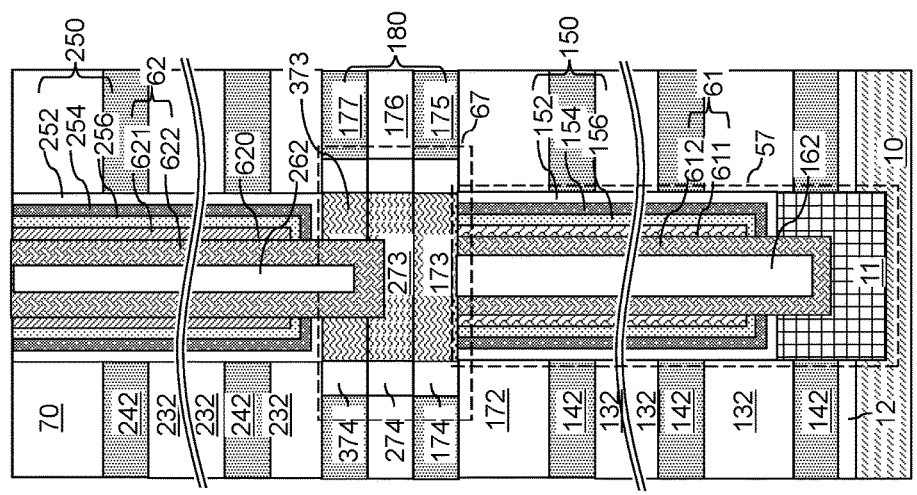
FIG. 19E is a vertical cross-sectional view of the region of the second exemplary structure after formation of a second vertical semiconductor channel and a second dielectric core according to the second embodiment of the present disclosure.

Referring to FIG. 19E, the horizontal portion of the second dielectric core layer 262L can be removed, for example, by a recess etch from above the top surface of the second-tier insulating cap layer 70, for example, employing the processing steps of FIG. 11E. Each adjoining pair of a second outer semiconductor channel layer 621 and a second inner semiconductor channel layer 622 can collectively form a second vertical semiconductor channel 62 through which electrical current can flow when a vertical NAND device including the second vertical semiconductor channel 62 is turned on.

Referring to FIG. 19F, the top surface of each second dielectric core 262 can be recessed below the top surface of the insulating cap layer 70, for example, by a recess etch to a depth that is located between the top surface of the insulating cap layer 70 and the bottom surface of the insulating cap layer 70. Drain regions 63 can be formed by depositing a doped semiconductor material within each recessed region above the second dielectric cores 262 employing the processing steps of FIG. 11F.

Each combination of a first memory film 150 and a first vertical semiconductor channel 61 (which is a lower portion of the vertical semiconductor channel) within a first-tier memory opening 149 constitutes a first-tier memory stack structure (150, 61). Each combination of a second memory film 250 and a second vertical semiconductor channel 62 (which is an upper portion of the vertical semiconductor channel) within a second-tier memory opening 249 constitutes a second-tier memory stack structure (250, 62). Each contiguous combination of a first vertical semiconductor channel 61, a set of at least one joint-level doped semiconductor portions (173, 273, 373) (which can include a first joint-level doped semiconductor portion 173, a second joint-level doped semiconductor portion 273, and a third joint-level doped semiconductor portion 373), a second vertical semiconductor channel 62 constitutes a vertical semiconductor channel (61, 173, 273, 373, 62). Each combination of an epitaxial channel portion 11 (if present), a first-tier memory stack structure (150, 61), a first dielectric core 162, a joint-level memory opening fill structure 67, a second-tier memory stack structure (250, 62), a second dielectric core 262, and a drain region 63 within an inter-tier memory opening is herein referred to as a memory opening fill structure (57, 67, 77), or an inter-tier memory opening fill structure. Each combination of an epitaxial channel portion 11 (if present), a first-tier memory stack structure (150, 61), a first dielectric core 162, a joint-level support opening fill structure 27, a second-tier memory stack structure (250, 62), a second dielectric core 262, and a drain region 63 within an inter-tier support opening is herein referred to as a support opening fill structure (17, 27, 37), or an inter-tier support opening fill structure.

Figure 19G:
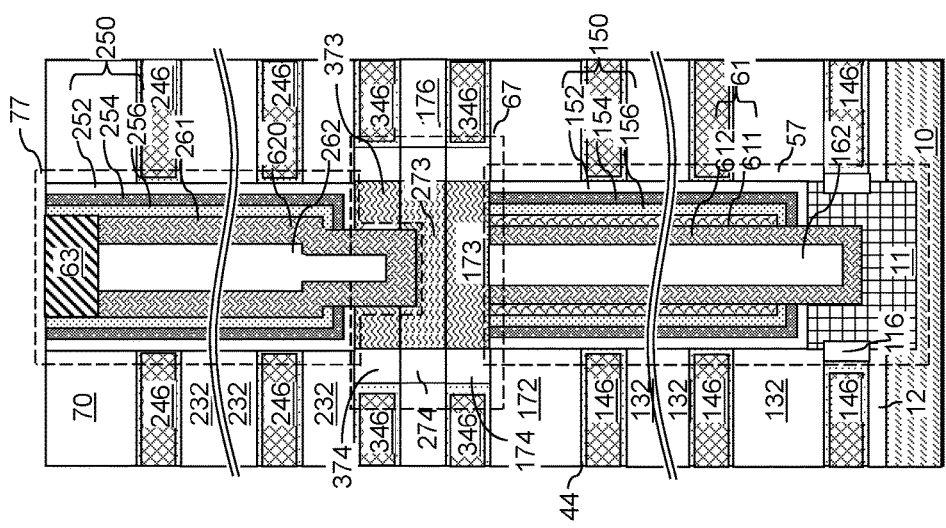
FIG. 19G is a vertical cross-sectional view of the region of the second exemplary structure after processing steps corresponding to the processing steps of FIG. 14B according to the second embodiment of the present disclosure.

Subsequently, the processing steps of FIGS. 13A, 13B, 14A, 14B, 15A, and 15B can be performed. FIG. 19G illustrates the second exemplary structure at the processing steps of FIG. 14B. Then, the processing steps of FIGS. 17A, 17B, 18A, and 18B can be performed.

A third exemplary structure can be derived from the first exemplary structure by modifying the joint-level fill structures (67, 27) to include only one joint-level doped semiconductor portion 173. For example, the first exemplary structure of FIGS. 5A and 5B can be employed to form the third exemplary structure.

Referring to FIG. 20A, a joint-level doped semiconductor layer 173L is deposited over the first tier structure, which includes the first alternating stack (131, 142), the first-tier cap dielectric layer 172, the first memory opening fill structures 57, and the first support opening fill structures 17. The joint-level doped semiconductor layer 173L of the third exemplary structure can include the same material as the first joint-level doped semiconductor layer 173L of the first exemplary structure. Thus, the joint-level doped semiconductor layer 173L can include a doped semiconductor material. The thickness of the joint-level doped semiconductor layer 173L of the third exemplary structure can be greater than the thickness of the first joint-level doped semiconductor layer 173L of the first exemplary structure. For example, the thickness of the joint-level doped semiconductor layer 173L can be in a range from 60 nm to 100 nm, although lesser and greater thicknesses can also be employed.

Referring to FIG. 20B, a photoresist layer 147 can be applied over the joint-level doped semiconductor layer 173L and lithographically patterned to cover each of the first memory opening fill structures 57 and each of the first-tier support opening fill structures 17. Physically exposed portions of the joint-level doped semiconductor layer 173L can be removed by an anisotropic etch. Each remaining portion of the joint-level doped semiconductor layer 173L constitutes a joint-level doped semiconductor portion 173. Each joint-level doped semiconductor portion 173 covers and protects the underlying first vertical semiconductor channel 61 from oxidation during a subsequent oxidation process. In one embodiment, the bottom surface of each joint-level doped semiconductor portion 173 can contact an entire top surface of an underlying first memory opening fill structure 57. The photoresist layer can be subsequently removed, for example, by ashing.

Referring to FIG. 20C, in one embodiment, an oxidation process is performed to convert physically exposed surface portions of each joint-level doped semiconductor portion 173 into a dielectric oxide material. Each oxidized surface portion of the joint-level doped semiconductor portions 173 constitutes a dielectric oxide portion 174', which includes a dielectric oxide of the semiconductor material of the joint-level doped semiconductor portions 173, and may include silicon oxide. Thermal oxidation or plasma oxidation may be employed to form the dielectric oxide portions 174'. The thickness of each dielectric oxide portion 174', as measured between an inner sidewall and an outer sidewall, can be in a range from 10 nm to 50 nm, although lesser and greater thicknesses can also be employed. In an alternative embodiment shown in the dashed line inset in FIG. 20C, only the sidewalls of the joint-level doped semiconductor portions 173 are oxidized to form a first annular dielectric spacer 174. In this alternative embodiment, a mask 147, such as the patterned photoresist layer used to etch portions 173, is left on the top surface of the etched portions 173 while leaving the sidewalls of the portions 173 exposed. The exposed sidewalls of the portions 173 are then oxidized to form the annular dielectric spacers 174 followed by removing the mask 147.

Referring to FIG. 20D, a joint-level spacer material layer 175 can be deposited over the dielectric oxide portion 174' or the annular dielectric spacer 174 and the joint-level doped semiconductor portion 173. The joint-level spacer material layer 175 can include the same material as the first spacer material layers in the first alternating stack (132, 142). If the first spacer material layers are provided as first sacrificial material layers 142, the joint-level spacer material layer 175 can include the same sacrificial material as the first sacrificial material layers 142. If the first spacer material layers are provided as first electrically conductive layers, the joint-level spacer material layer 175 can include the same conductive material as the first electrically conductive layers (which are formed as the first spacer material layers).

The joint-level spacer material layer 175 can be formed over the first alternating stack (132, 142) and around the joint-level doped semiconductor portion 173 and at least one of spacer 174 or portion 174'. The thickness of the joint-level spacer material layer 175 can be in a range from 60 nm to 300 nm, although lesser and greater thicknesses can also be employed. A chemical mechanical planarization (CMP) process can be performed to remove protruding portions of the joint-level spacer material layer 175 and a horizontal top portion of each dielectric oxide portion 174' from above a horizontal plane including top surfaces of the joint-level doped semiconductor portions 173. Each remaining annular portion of the dielectric oxide portions 174' (if present) constitutes an annular dielectric spacer 174. Thus, each annular dielectric spacer 174 is formed from an oxidized surface portion of the joint-level doped semiconductor portion 173 as provided at the processing steps of FIG. 20B or FIG. 20C. In one embodiment, the chemical mechanical planarization process can further remove portions of the annular dielectric spacers 174 and surface portions of the joint-level doped semiconductor portions 173 from above a horizontal plane including the top surface of the joint-level spacer material layer 175. In this case, the top surfaces of the joint-level spacer material layer 175, the annular dielectric spacers 174, and the joint-level doped semiconductor portions 173 can be within a same horizontal plane.

The joint-level spacer material layer 175 is laterally spaced from the joint-level doped semiconductor portion 173 by the annular dielectric spacer 174. The joint-level doped semiconductor portion 173 is formed by deposition and patterning of a doped semiconductor material. The joint-level annular dielectric spacers 174 is formed by oxidation of a surface portion of a joint-level doped semiconductor portion 173 and an anisotropic etch of the joint-level doped semiconductor portion 173. Each contiguous combination of a joint-level doped semiconductor portion 173 and a joint-level annular dielectric spacer overlying a first memory opening fill structure 57 constitutes a joint-level memory opening fill structure 67. Each contiguous combination of a joint-level doped semiconductor portion 173 and a joint-level annular dielectric spacer overlying a first support opening fill structure 17 constitutes a joint-level support opening fill structure 27.

Subsequently, the processing steps of FIGS. 7A, 7B, 8A, 8B, 9A, 9B, 10A, and 10B can be performed.

Then, the processing steps of FIGS. 21A-21F can be performed in lieu of the processing steps of FIGS. 11A-11F.

Figure 21B:
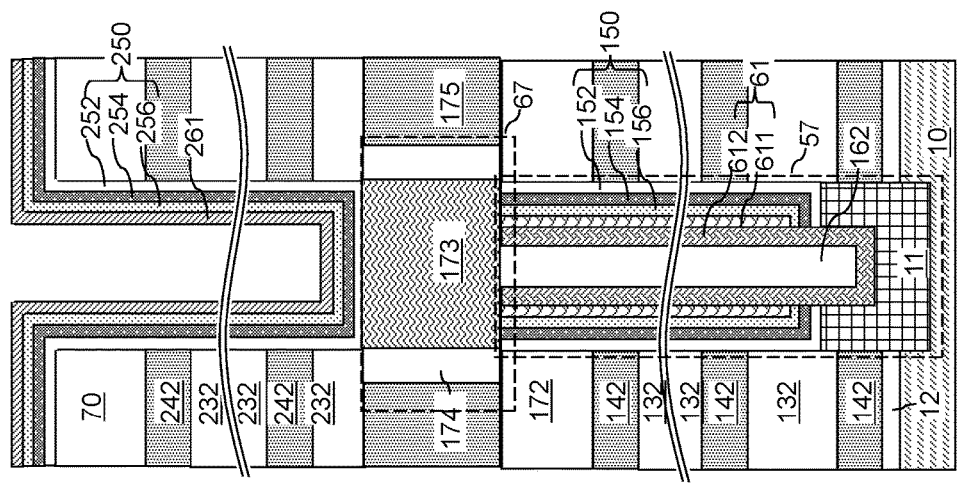
FIG. 21B is a vertical cross-sectional view of the region of the third exemplary structure after formation of a second memory film and a cover material layer according to the third embodiment of the present disclosure.
Figure 21A:
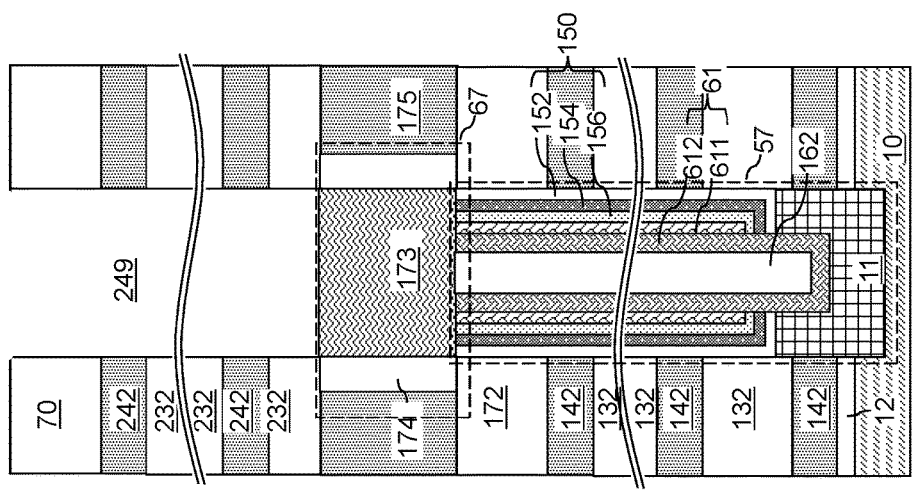
FIG. 21A is a vertical cross-sectional view of a region of the third exemplary structure that includes a first memory stack structure, a joint-level memory opening fill structure, and a second memory opening after performing the processing steps of FIGS. 10A and 10B.

FIG. 21A illustrate a region of the second exemplary structure at the processing steps of FIGS. 10A and 10B, i.e., after formation of the second-tier memory openings 249 and the second-tier support openings 219.

Referring to FIG. 21B, a stack of layers including a second blocking dielectric layer 252, a second charge storage layer 254, a second tunneling dielectric layer 256, and an optional second outer semiconductor channel layer 621 can be sequentially deposited in the second-tier memory openings 249 employing the processing steps of FIG. 11B.

Figure 21D:
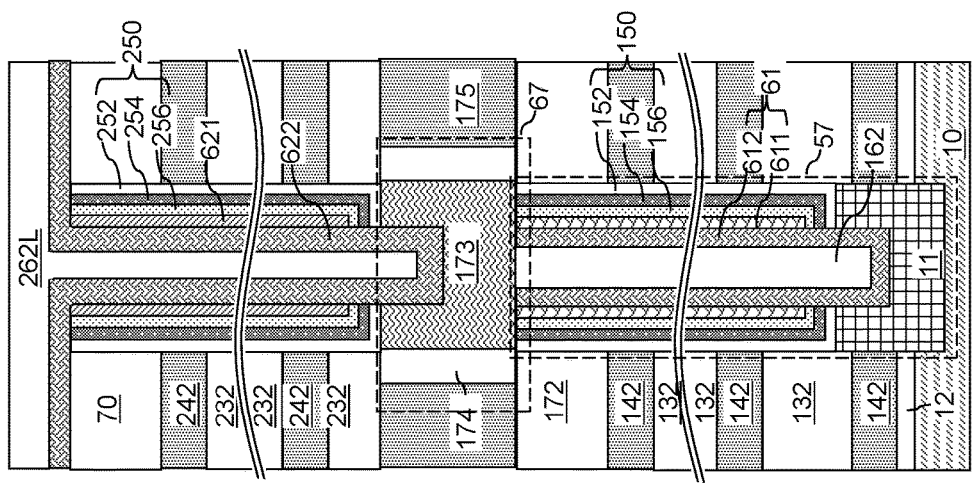
FIG. 21D is a vertical cross-sectional view of the region of the third exemplary structure formation of a second vertical semiconductor channel and a second dielectric core layer according to the third embodiment of the present disclosure.
Figure 21C:
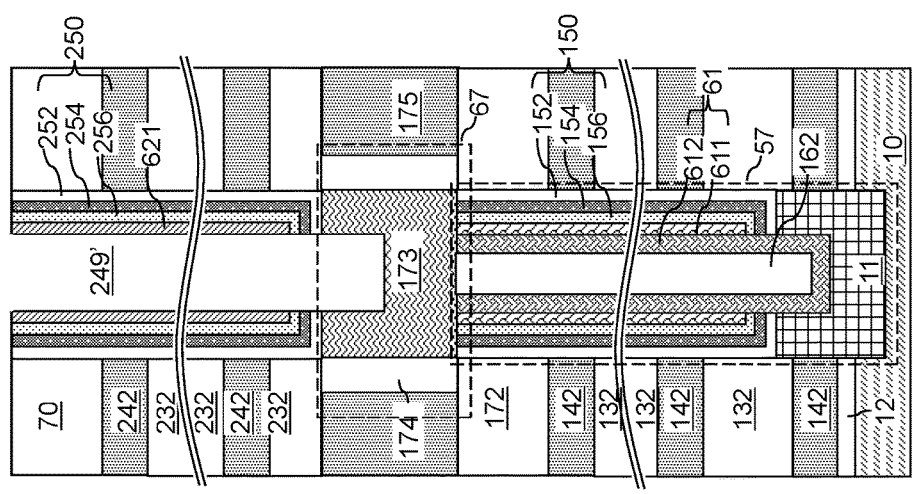
FIG. 21C is a vertical cross-sectional view of the region of the third exemplary structure after an anisotropic etch process that etches horizontal portions of cover material layer and the second memory film according to the third embodiment of the present disclosure.

Referring to FIG. 21C, the optional second outer semiconductor channel layer 621, the second tunneling dielectric layer 256, the second charge storage layer 254, the second blocking dielectric layer 252 are sequentially anisotropically etched employing at least one anisotropic etch process, which can be the same as the anisotropic etch process of FIG. 11C.

Referring to FIG. 21D, a second inner semiconductor channel layer 622 can be deposited directly on the semiconductor surface of the second joint-level doped semiconductor portion 179, and directly on the second outer semiconductor channel layer 621. In case the second memory cavity 249' in each second-tier memory opening is not completely filled by the second inner semiconductor channel layer 622, a second dielectric core layer 262L can be deposited in the second memory cavity 249' to fill any remaining portion of the second memory cavity 249' within each second-tier memory opening. The processing steps of FIG. 11D may be employed.

Figure 21F:
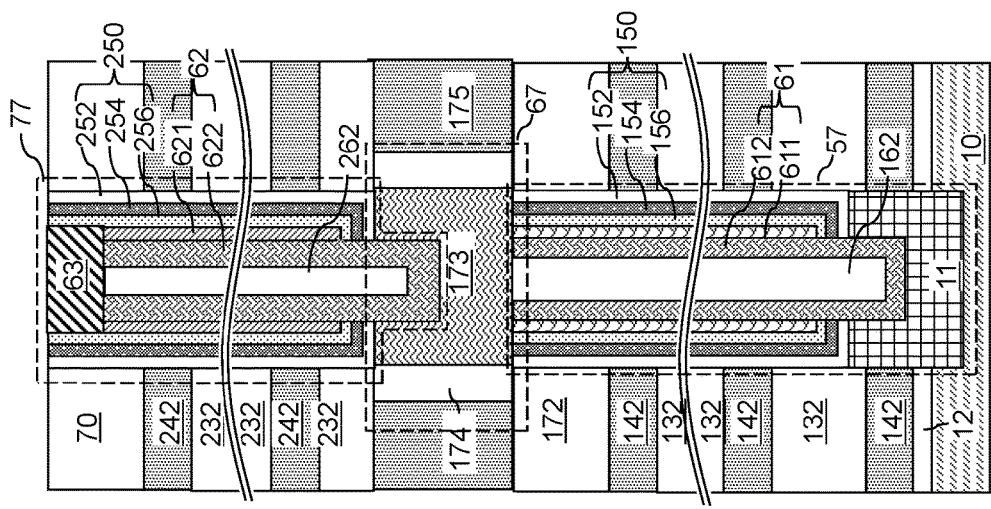
FIG. 21F is a vertical cross-sectional view of the region of the third exemplary structure after formation of a drain region according to the third embodiment of the present disclosure.
Figure 21E:
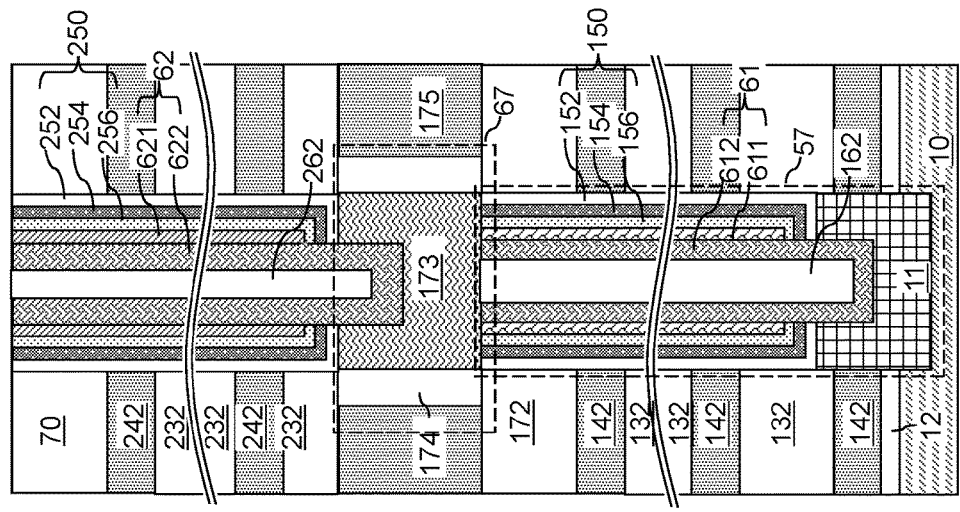
FIG. 21E is a vertical cross-sectional view of the region of the third exemplary structure formation of a second vertical semiconductor channel and a second dielectric core layer according to the third embodiment of the present disclosure.

Referring to FIG. 21E, the horizontal portion of the second dielectric core layer 262L can be removed, for example, by a recess etch from above the top surface of the second-tier insulating cap layer 70, for example, employing the processing steps of FIG. 11E. Each adjoining pair of a second outer semiconductor channel layer 621 and a second inner semiconductor channel layer 622 can collectively form a second vertical semiconductor channel 62 through which electrical current can flow when a vertical NAND device including the second vertical semiconductor channel 62 is turned on.

Referring to FIG. 21F, the top surface of each second dielectric core 262 can be recessed below the top surface of the insulating cap layer 70, for example, by a recess etch to a depth that is located between the top surface of the insulating cap layer 70 and the bottom surface of the insulating cap layer 70. Drain regions 63 can be formed by depositing a doped semiconductor material within each recessed region above the second dielectric cores 262 employing the processing steps of FIG. 11F.

Each combination of a first memory film 150 and a first vertical semiconductor channel 61 (which is a lower portion of the vertical semiconductor channel) within a first-tier memory opening 149 constitutes a first-tier memory stack structure (150, 61). Each combination of a second memory film 250 and a second vertical semiconductor channel 62 (which is an upper portion of the vertical semiconductor channel) within a second-tier memory opening 249 constitutes a second-tier memory stack structure (250, 62). Each contiguous combination of a first vertical semiconductor channel 61, a set of at least one joint-level doped semiconductor portions 173 (which can include a joint-level doped semiconductor portion 173 only in this embodiment), a second vertical semiconductor channel 62 constitutes a vertical semiconductor channel (61, 173, 62). In the third embodiment, the at least one joint-level doped semiconductor portion consists of a single joint-level doped semiconductor portion 173 contacting a top surface of the first memory film 150 and a bottom surface of the second memory film 250. The at least one annular dielectric spacer consists of a single annular dielectric spacer 174 that contacts an entirety of an outer sidewall of the single joint-level doped semiconductor portion 173.

Each combination of an epitaxial channel portion 11 (if present), a first-tier memory stack structure (150, 61), a first dielectric core 162, a joint-level memory opening fill structure 67, a second-tier memory stack structure (250, 62), a second dielectric core 262, and a drain region 63 within an inter-tier memory opening is herein referred to as a memory opening fill structure (57, 67, 77), or an inter-tier memory opening fill structure. Each combination of an epitaxial channel portion 11 (if present), a first-tier memory stack structure (150, 61), a first dielectric core 162, a joint-level support opening fill structure 27, a second-tier memory stack structure (250, 62), a second dielectric core 262, and a drain region 63 within an inter-tier support opening is herein referred to as a support opening fill structure (17, 27, 37), or an inter-tier support opening fill structure.

Figure 21G:
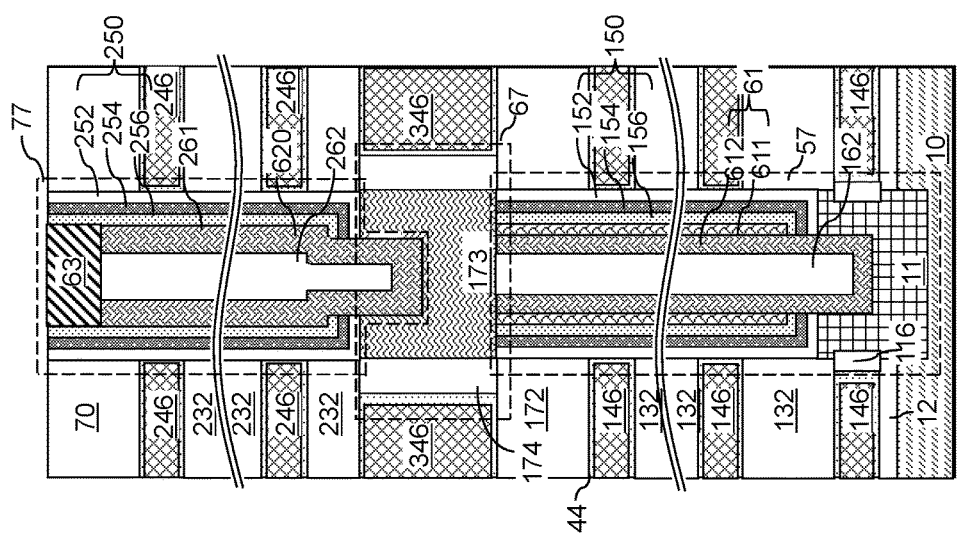
FIG. 21G is a vertical cross-sectional view of the region of the third exemplary structure after processing steps corresponding to the processing steps of FIG. 14B according to the third embodiment of the present disclosure.

Subsequently, the processing steps of FIGS. 13A, 13B, 14A, 14B, 15A, and 15B can be performed. FIG. 21G illustrates the second exemplary structure at the processing steps of FIG. 14B. Then, the processing steps of FIGS. 17A, 17B, 18A, and 18B can be performed.

Referring to FIG. 22A, an alternate embodiment of the third exemplary structure after formation of the second memory opening fill structures 77, which is derived from the third exemplary structure by reducing the thicknesses of each joint-level doped semiconductor portions 173, each single annular dielectric spacer 174, and the joint-level spacer material layer 175, for example, to a range from 20 nm to 150 nm, although lesser and greater thicknesses can also be employed.

Referring to FIG. 22B, the alternate embodiment of the third exemplary structure is shown after formation of the electrically conductive layers (146, 246, 346).

Each of the first, second, and third exemplary structures can comprise a three-dimensional memory device. The three-dimensional memory device can comprise: a first alternating stack (132, 146) of first insulating layers 132 and first electrically conductive layers 146 located over a substrate (9, 10); a first memory stack structure (150, 61) extending through the first alternating stack (132, 146) and comprising a first memory film 150 and a first vertical semiconductor channel 61 that is laterally surrounded by the first memory film 150; a joint-level electrically conductive layer 376 (which may be a bottommost one in case multiple joint-level electrically conductive layers 376 are present) overlying the first alternating stack (132, 146); at least one joint-level doped semiconductor portion {(173, 179), (173, 273, 373), or 173} contacting a top surface of the first vertical semiconductor channel 61 and located within, and electrically isolated from, the joint-level electrically conductive layer 346; a second alternating stack (232, 246) of second insulating layers 232 and second electrically conductive layers 246 located over the joint-level electrically conductive layer 376; a second memory stack structure (250, 62) extending through the second alternating stack (232, 246) and comprising a second memory film 250 and a second vertical semiconductor channel 62 that is laterally surrounded by the second memory film 250 and vertically extends into the at least one joint-level doped semiconductor portion {(173, 179), (173, 273, 373), or 173}. The first memory film 150 and the second memory film 250 are vertically spaced from each other by the at least one joint-level doped semiconductor portion {(173, 179), (173, 273, 373), or 173}. While the present disclosure is described employing an embodiment in which the first-tier insulating cap layer 172 is provided above the initial first alternating stack (132, 142), embodiments are expressly contemplated herein in which a first-tier insulating cap layer 172 is not provided and a topmost layer of a first tier structure as initially formed is a topmost first sacrificial material layer 142. In this case, a joint-level insulating layer can be formed directly on the topmost first sacrificial material layer prior to forming the joint-level electrically conductive layer 376 (which may be a bottommost one in case multiple joint-level electrically conductive layers 376 are present). The joint-level electrically conductive layer 376 overlies the first alternating stack (132, 146) with the joint-level insulating layer as an intermediate layer between the first alternating stack (132, 146) and the joint-level electrically conductive layer 376.

In one embodiment, the three-dimensional memory device further comprises at least one annular dielectric spacer {(174, 178), (174, 274, 374), or 174} laterally surrounding the at least one joint-level doped semiconductor portion {(173, 179), (173, 273, 373), or 173}, and laterally surrounded by the joint-level electrically conductive layer 346. In some embodiments, the three-dimensional memory device can further comprise: a joint-level insulating layer (176 or 275) overlying the joint-level electrically conductive layer 346; an additional joint-level electrically conductive layer 346 overlying the joint-level insulating layer (176 or 275) and underlying the second alternating stack (232, 246) as illustrated in the first and second embodiments. The joint-level insulating layer (176 or 275) and the additional joint-level electrically conductive layer 346 are laterally spaced from the at the one joint-level doped semiconductor portion {(173, 179), (173, 273, 373), or 173} by the at least one annular dielectric spacer {(174, 178), (174, 274, 374), or 174}.

In each of the first, second, and third exemplary structures, a bottommost surface of the at least one joint-level doped semiconductor portion {(173, 179), (173, 273, 373), or 173} contacts a top surface of the first vertical semiconductor channel 61 and a top surface of the first memory film 150. The first vertical semiconductor channel 61 is shown in FIGS. 6B-6F, 11A-11F, 14A-14B and 18A-22B. A topmost surface of the at least one joint-level doped semiconductor portion {(173, 179), (173, 273, 373), or 173} contacts a bottom surface of the second memory film 250; a recessed surface of the at least one joint-level doped semiconductor portion {(173, 179), (173, 273, 373), or 173} contacts a bottommost surface of the second vertical semiconductor channel 62; and the at least one annular dielectric spacer {(174, 178), (174, 274, 374), or 174} has a greater lateral extent (i.e., a maximum lateral dimension) than the first memory film and the second memory film.

Figure 23A:
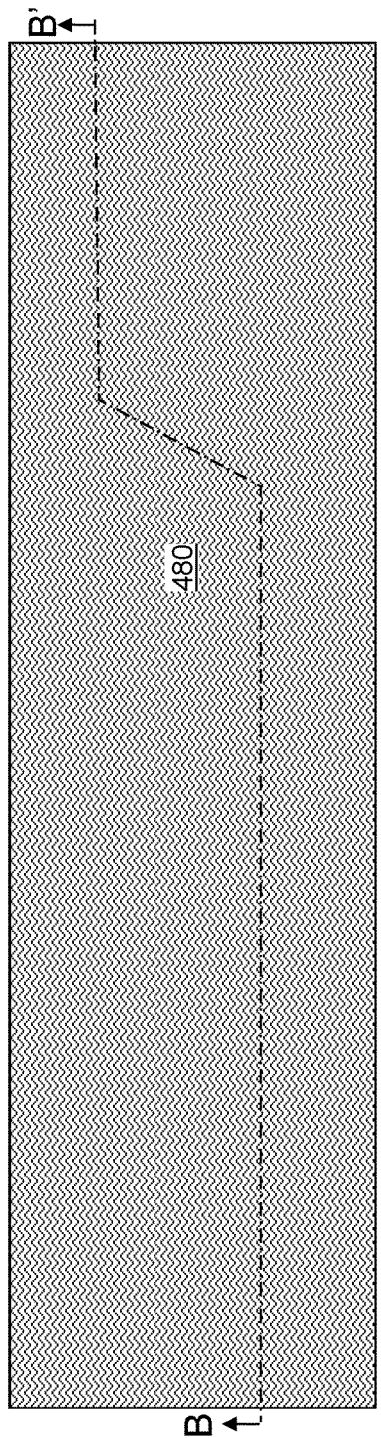
FIG. 23A is a top-down view of a fourth exemplary structure after formation of a joint-level sacrificial planarization layer according to a fourth embodiment of the present disclosure.
Figure 23B:
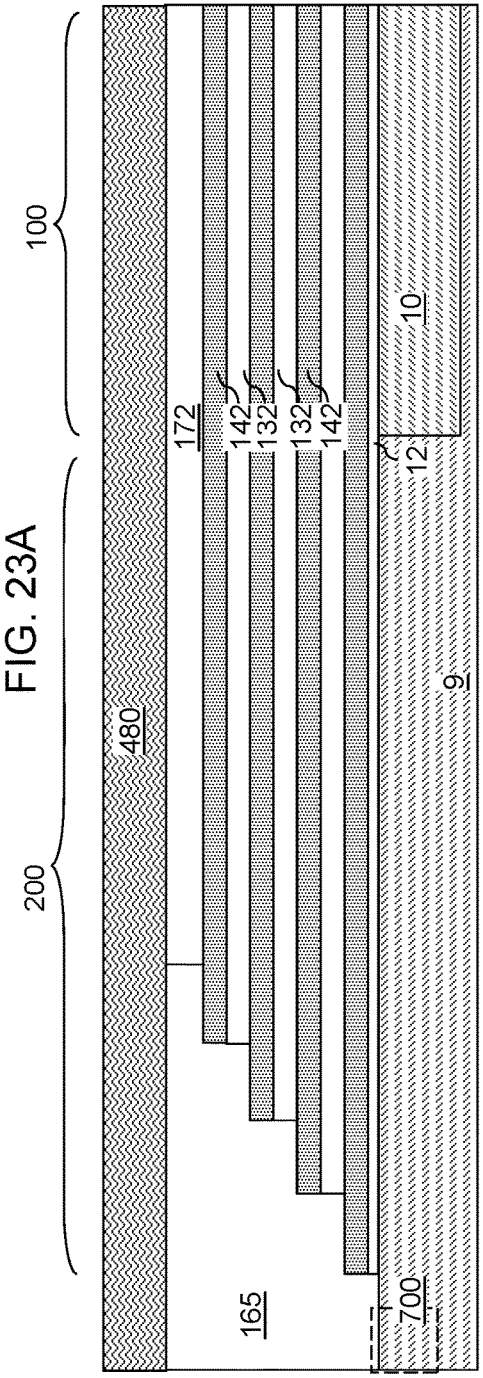
FIG. 23B is a vertical cross-sectional view of the fourth exemplary structure of FIG. 23A along the vertical plane B-B'.

Referring to FIGS. 23A and 23B, a fourth exemplary structure according to a fourth embodiment of the present disclosure can be derived from the first exemplary structure of FIGS. 2A and 2B by forming a joint-level sacrificial planarization layer 480 over the top surface of the first-tier insulating cap layer 172. The joint-level sacrificial planarization layer 480 includes a sacrificial material that can be removed selective to the materials of the first-tier insulating cap layer 172 and the first retro-stepped dielectric material portion 165. For example, the first-tier insulating cap layer 172 and the first retro-stepped dielectric material portion 165 can comprise silicon oxide, and the joint-level sacrificial planarization layer 480 can include a sacrificial material such as amorphous silicon, polysilicon, a silicon-germanium alloy, a non-organic polymer (such as a silicon-based polymer), or silicon nitride. In one embodiment, the joint-level sacrificial planarization layer 480 can include polysilicon. The thickness of the joint-level sacrificial planarization layer 480 can be in a range from 30 nm to 600 nm, although lesser and greater thicknesses can also be employed. The joint-level sacrificial planarization layer 480 can be deposited by a conformal or non-conformal deposition method.

Figure 24A:
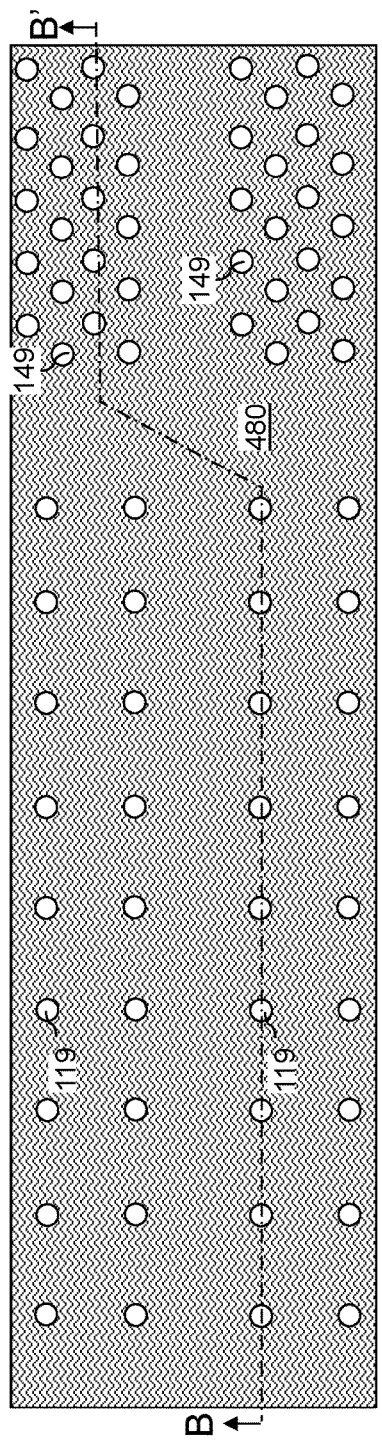
FIG. 24A is a top-down view of the fourth exemplary structure after formation of first-tier memory openings and first-tier support openings according to the fourth embodiment of the present disclosure.
Figure 24B:
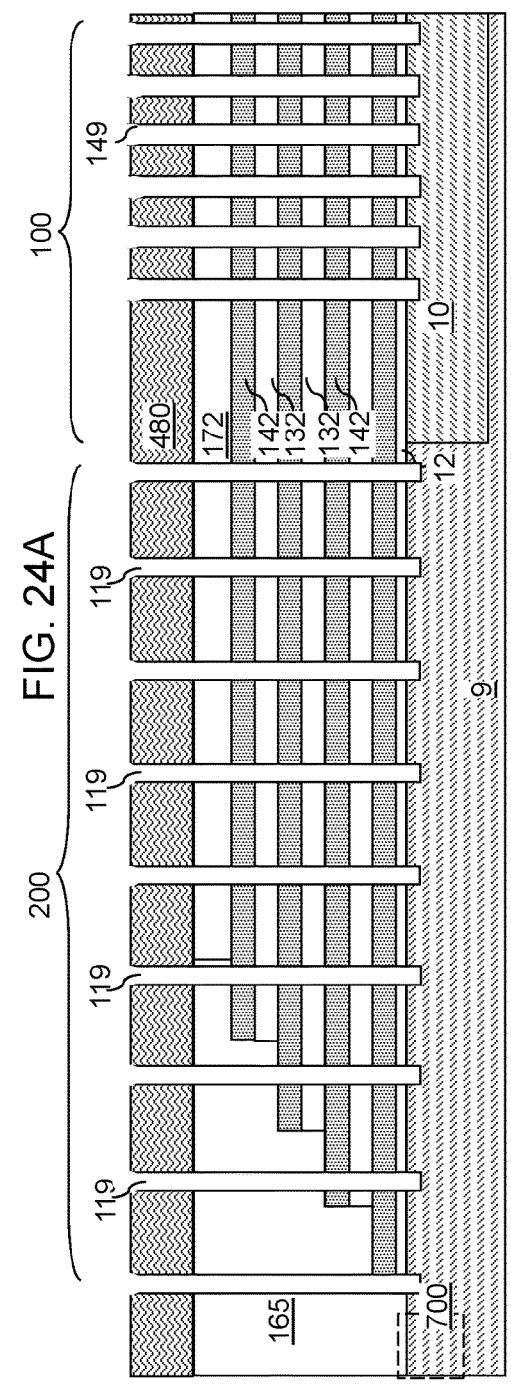
FIG. 24B is a vertical cross-sectional view of the fourth exemplary structure of FIG. 24A along the vertical plane B-B'.

Referring to FIGS. 24A and 24B, the processing steps of FIGS. 3A and 3B can be performed to form first-tier memory openings 149 and first-tier support openings 119 with appropriate modification to the anisotropic etch process. Specifically, the etch process employed at the processing steps of FIGS. 3A and 3B can be employed with a modification that inserts an additional etch step for etching the material of the joint-level sacrificial planarization layer 480 before etching the materials of the first-tier cap insulating layer 172 and the first alternating stack (132, 142). The first-tier memory openings 149 are formed through the joint-level sacrificial planarization layer 480 and the first tier structure (132, 142, 172, 165) in the memory array region 100, and the first-tier support openings 119 are formed through the joint-level sacrificial planarization layer 480 and the first tier structure (132, 142, 172, 165) in the contact region 200.

FIGS. 25A-25J illustrate sequential vertical cross-sectional views of a first-tier memory opening 149 and its vicinity within the fourth exemplary structure up to the processing step of formation of a joint-level spacer material layer 484.

Referring to FIG. 25A, a first-tier memory opening 149 in the fourth exemplary device structure of FIGS. 24A and 24B is illustrated. The first-tier memory opening 149 extends through the joint-level sacrificial planarization layer 480, the first-tier insulating cap layer 172, the first alternating stack (132, 142), the gate dielectric layer 12, and optionally into an upper portion of the semiconductor material layer 10. At this processing step, each first-tier support opening 119 can extend through the joint-level sacrificial planarization layer 480, the first retro-stepped dielectric material portion 165, a subset of layers in the first alternating stack (132, 142), the gate dielectric layer 12, and optionally through the upper portion of the semiconductor material layer 10. The recess depth of the bottom surface of each first-tier memory opening 149 with respect to the top surface of the semiconductor material layer 10 can be in a range from 0 nm to 30 nm, although greater recess depths can also be employed. Optionally, the first sacrificial material layers 142 can be laterally recessed partially to form lateral recesses (not shown), for example, by an isotropic etch.

Referring to FIG. 25B, an optional epitaxial channel portion (e.g., an epitaxial pedestal) 11 can be formed at the bottom portion of each first-tier memory opening 149 and each first-tier support openings 119, for example, by selective epitaxy. The processing steps of FIG. 4B may be employed. The epitaxial channel portion 11 is optional structure, and may be omitted.

Referring to FIG. 25C, a stack of layers including a first blocking dielectric layer 152, a first charge storage layer 154, a first tunneling dielectric layer 156, and an optional first outer semiconductor channel layer 611 can be sequentially deposited in the first-tier memory openings 149. Each of the first blocking dielectric layer 152, the first charge storage layer 154, the first tunneling dielectric layer 156, and the optional first outer semiconductor channel layer 611 may be the same as in the first embodiment.

Referring to FIG. 25D, the optional first outer semiconductor channel layer 611, the first tunneling dielectric layer 156, the first charge storage layer 154, the first blocking dielectric layer 152 are sequentially anisotropically etched employing at least one anisotropic etch process. The processing steps of FIG. 4D may be employed. The portions of the first outer semiconductor channel layer 611, the first tunneling dielectric layer 156, the first charge storage layer 154, and the first blocking dielectric layer 152 located above the top surface of the first-tier insulating cap layer 172 can be removed by the at least one anisotropic etch process. Further, the horizontal portions of the first outer semiconductor channel layer 611, the first tunneling dielectric layer 156, the first charge storage layer 154, and the first blocking dielectric layer 152 at a bottom of each first memory cavity 149' can be removed to form openings in remaining portions thereof.

Referring to FIG. 25E, a first inner semiconductor channel layer 612 can be deposited directly on the semiconductor surface of the epitaxial channel portion 11 or the semiconductor substrate layer 10 if the epitaxial channel portion 11 is omitted, and directly on the first outer semiconductor channel layer 611. The processing steps of FIG. 4E may be employed. The materials of the first outer semiconductor channel layer 611 and the first inner semiconductor channel layer 612 are collectively referred to as a first semiconductor channel material. In other words, the first semiconductor channel material is a set of all semiconductor material in the first outer semiconductor channel layer 611 and the first inner semiconductor channel layer 612.

Referring to FIG. 25F, in case the first memory cavity 149' in each first-tier memory opening is not completely filled by the first inner semiconductor channel layer 612, a first dielectric core layer 162L can be deposited in the first memory cavity 149' to fill any remaining portion of the first memory cavity 149' within each first-tier memory opening. The first dielectric core layer 162L includes a dielectric material such as silicon oxide or organosilicate glass. The first dielectric core layer 162L can be deposited by a conformal deposition method such as low pressure chemical vapor deposition (LPCVD), or by a self-planarizing deposition process such as spin coating.

Referring to FIG. 25G, the horizontal portion of the first dielectric core layer 162L can be removed, for example, by a recess etch from above the top surface of the joint-level sacrificial planarization layer 480. Each remaining portion of the first dielectric core layer 162L constitutes a dielectric core 162. Further, the horizontal portion of the first inner semiconductor channel layer 612 located above the top surface of the first-tier insulating cap layer 172 can be removed by a planarization process, which can employ a recess etch or chemical mechanical planarization (CMP). Each remaining portion of the first inner semiconductor channel layer 612 can be located entirety within a first-tier memory opening 149 or entirely within a first-tier support opening 119.

Each adjoining pair of a first outer semiconductor channel layer 611 and a first inner semiconductor channel layer 612 can collectively form a first vertical semiconductor channel 61 through which electrical current can flow when a vertical NAND device including the first vertical semiconductor channel 61 is turned on. A first tunneling dielectric layer 156 is surrounded by a first charge storage layer 154, and laterally surrounds a portion of the first vertical semiconductor channel 61. Each adjoining set of a first blocking dielectric layer 152, a first charge storage layer 154, and a first tunneling dielectric layer 156 collectively constitute a first memory film 150, which can store electrical charges with a macroscopic retention time. In some embodiments, a first blocking dielectric layer 152 may not be present in the first memory film 150 at this step, and a first blocking dielectric layer may be subsequently formed after formation of backside recesses. As used herein, a macroscopic retention time refers to a retention time suitable for operation of a memory device as a permanent memory device such as a retention time in excess of 24 hours.

Each contiguous set of material portions that fills a first-tier memory opening 149 constitutes a first memory opening fill structure 57, which can include an epitaxial channel portion 11, a first memory film 150, a first vertical semiconductor channel 61, and a first dielectric core 162. Thus, each first-tier memory opening 149 can be filled with an instance of a first memory opening fill structure 57. Each first-tier support opening 119 can be filled with a first-tier support opening fill structure 17, which can include an epitaxial channel portion 11, a first memory film 150, a first vertical semiconductor channel 61, and a first dielectric core 162.

Referring to FIG. 25H, a photoresist layer 47 can be applied over the joint-level sacrificial planarization layer 480, the first-tier memory opening fill structures 57 that are formed in the first-tier memory openings 149, and first-tier support opening fill structures that are formed in the first-tier support openings 119. The photoresist layer 47 can be patterned to form to form isolated portions of the photoresist layer 47 that covers each of the first-tier memory opening fill structures 57 and first-tier support opening fill structures, while physically exposing the top surface of the joint-level sacrificial planarization layer 480. In one embodiment, each portion of the joint-level sacrificial planarization layer 480 that is laterally spaced from the first-tier memory opening fill structures 57 and first-tier support opening fill structures by more than the thickness of the joint-level sacrificial planarization layer 480 can be physically exposed, i.e., not covered by the patterned portions of the photoresist layer 47.

An etch process can be performed to remove the joint-level sacrificial planarization layer 480 selective to the materials of the first-tier cap insulating layer 172, the first retro-stepped dielectric material portion 165, and the outermost layer of the first memory film 150 (i.e., the first blocking dielectric layer 152). For example, if the joint-level sacrificial planarization layer 480 includes polysilicon, a wet etch process employing a KOH solution can be employed to etch the joint-level sacrificial planarization layer 480. The photoresist layer 47 can be subsequently removed, for example, by ashing.

Referring to FIG. 25I, a dielectric liner layer 482 can be deposited. The dielectric liner 482 includes a material that is different form the material of the first sacrificial material layer 142. The material of the dielectric liner layer 482 may be the same as the material of the first insulating layers 132. For example, the dielectric liner layer 482 can include silicon oxide. The dielectric liner layer 482 can be formed by conformally depositing a dielectric liner material on a top surface of each first memory stack structure (150, 61), on an upper portion of a sidewall of each first memory stack structure (150, 61), and over a topmost layer in the first alternating stack (132, 142). In other words, the dielectric liner layer 482 can be deposited by a conformal deposition method such as chemical vapor deposition (CVD) or atomic layer deposition (ALD). The thickness of the dielectric liner layer 482 can be in a range from 6 nm to 100 nm, such as from 12 nm to 50 nm, although lesser and greater thicknesses can also be employed. The thickness of the dielectric liner layer 482 can be in a range from 2% to 40% of the thickness of the joint-level sacrificial planarization layer 480, although lesser and greater percentages can also be employed.

Referring to FIG. 25J, a spacer material can be deposited over the dielectric liner material of the dielectric liner layer 482. The spacer material can be the same material as the material of the first spacer material layers in the first alternating stack (132, 142). If the first spacer material layers are the first sacrificial material layers 142, the deposited spacer material can be the same as the sacrificial material of the first sacrificial material layers 142. For example, if the first sacrificial material layers 142 include silicon nitride, the deposited spacer material can include silicon nitride. If the first spacer material layers are first electrically conductive layers, the deposited spacer material can include a conductive material such as a metal and/or a conductive metallic alloy. While the present disclosure is described employing an embodiment in which the first spacer material layers are first sacrificial material layers 142, embodiments are expressly contemplated herein in which the first spacer material layers are first electrically conductive layers.

Portions of the spacer material and the dielectric liner material can be removed from above a horizontal plane including the top surface of the first memory stack structures (150, 61) by a planarization process such as chemical mechanical planarization. The remaining portion of the deposited and planarized spacer material constitutes a joint-level spacer material layer 484. Horizontal portions of the dielectric liner layer 482 overlying the first memory-opening fill structures 57 can be removed during the planarization process. The dielectric liner layer 482 includes the remaining portion of the dielectric liner material after the planarization process. The remaining portion of the spacer material constitutes a joint-level spacer material layer 484.

Thus, a combination of the dielectric liner layer 482 and the joint-level spacer material layer 484 is formed over the first memory stack structures (150, 61) and the first alternating stack (132, 142). The dielectric liner layer 482 includes a horizontal portion that overlies the first alternating stack (132, 142) and underlies the joint-level spacer material layer 484. The dielectric liner layer 482 further includes cylindrical vertical portions, each of which laterally surrounds an upper portion of a respective first memory stack structure (150, 61). As used herein, a "cylindrical" element refers to an element having an inner sidewall that is parallel to an outer sidewall and having a uniform thickness between the inner sidewall and the outer sidewall. The joint-level spacer material layer 484 is laterally spaced from the first memory stack structures (150, 61) by the cylindrical vertical portion of the dielectric liner layer 482.

Referring to FIGS. 26A and 26B, the fourth exemplary structure is illustrated after formation of the first memory opening fill structures 57 in the first-tier memory openings 149 and formation of the first-tier support opening fill structures 17 in the first-tier support openings 119. Each layer (such as the first blocking dielectric layer 152, the first charge storage layer 154, the first tunneling dielectric layer 156, the first outer semiconductor channel layer 611, and the first inner semiconductor channel layer 612) within each first-tier support opening fill structure 17 can have the same composition and the same thickness as the corresponding layer within a first memory opening fill structure 57. The first memory opening fill structures 57 can be arranged as a plurality of two-dimensional periodic arrays in the memory array region 100. Likewise, the first-tier support opening fill structures 17 can be arranged as a plurality of two-dimensional periodic arrays in the contact region 200.

Referring to FIGS. 27A and 27B, the processing steps of FIGS. 8A, 8B, 9A, and 9B can be performed to form a second alternating stack (232, 242) of second insulating layers 232 and second sacrificial material layers 242, second stepped surfaces, and a second retro-stepped dielectric material portion 265.

Referring to FIGS. 28A and 28B, the processing steps of FIGS. 10A and 10B can be performed to form second memory openings 249 over the first memory-opening fill structures 57 and to form second support openings 219 over the first support opening fill structure 17.

Subsequently, the processing steps of FIGS. 29A-29F can be performed to form second memory opening fill structures in the second-tier memory openings and to form second support opening fill structures in the second-tier support openings.

Figure 29A:
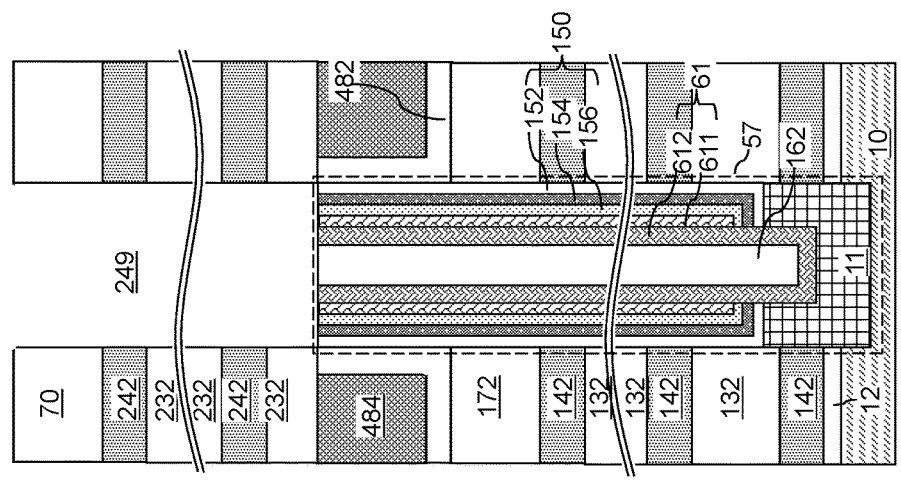
FIG. 29A is a vertical cross-sectional view of a region of the fourth exemplary structure that includes a first memory stack structure, a joint-level memory opening fill structure, and a second memory opening after performing the processing steps of FIGS. 10A and 10B.

FIG. 29A illustrate a region of the second exemplary structure at the processing steps of FIGS. 28A and 28B, i.e., after formation of the second-tier memory openings 249 and the second-tier support openings 219.

Figure 29B:
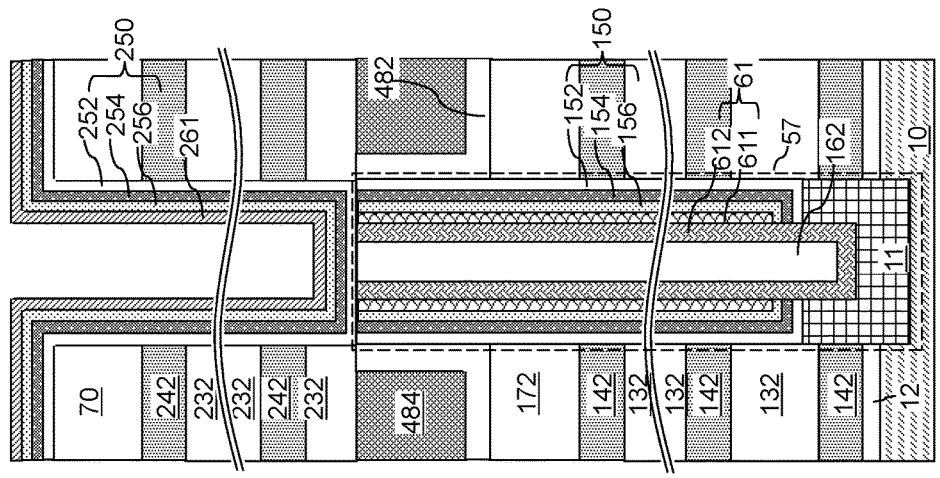
FIG. 29B is a vertical cross-sectional view of the region of the fourth exemplary structure after formation of a second memory film and a cover material layer according to the fourth embodiment of the present disclosure.

Referring to FIG. 29B, a stack of layers including a second blocking dielectric layer 252, a second charge storage layer 254, a second tunneling dielectric layer 256, and an optional second outer semiconductor channel layer 621 can be sequentially deposited in the second-tier memory openings 249 employing the processing steps of FIG. 11B. The second memory film 250 is formed directly on a top surface of the first memory film 150.

Figure 29D:
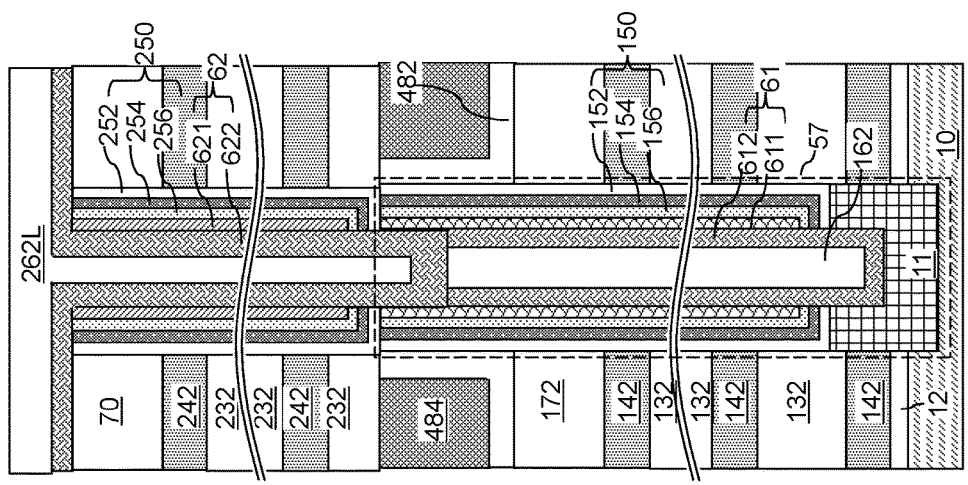
FIG. 29D is a vertical cross-sectional view of the region of the fourth exemplary structure after optional removal of the cover material layer according to the fourth embodiment of the present disclosure.
Figure 29C:
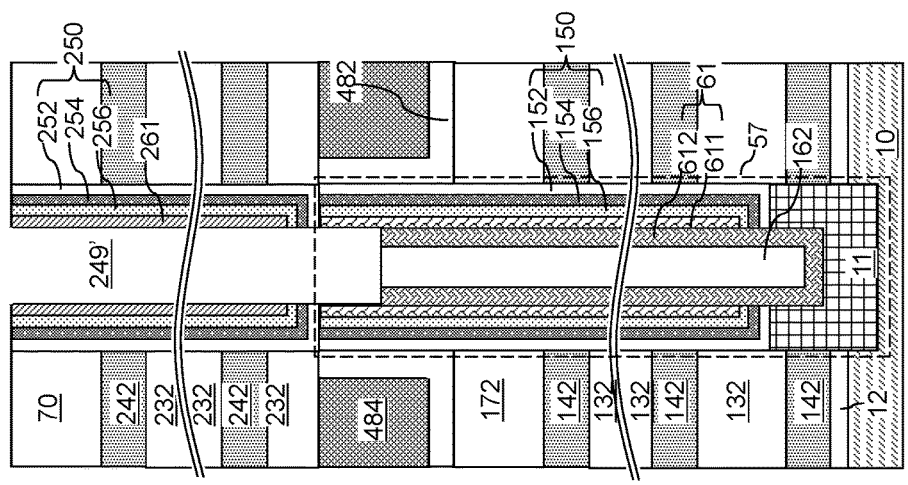
FIG. 29C is a vertical cross-sectional view of the region of the fourth exemplary structure after an anisotropic etch process that etches horizontal portions of cover material layer and the second memory film according to the fourth embodiment of the present disclosure.

Referring to FIG. 29C, the optional second outer semiconductor channel layer 621, the second tunneling dielectric layer 256, the second charge storage layer 254, the second blocking dielectric layer 252 are sequentially anisotropically etched employing at least one anisotropic etch process, which can be the same as the anisotropic etch process of FIG. 11C. After formed an opening in the horizontal portion of the second memory film 250 at the bottom of each second-tier memory opening 249, and the first vertical semiconductor channel 61 can be optionally vertically recessed.

Referring to FIG. 29D, a second inner semiconductor channel layer 622 can be deposited directly on the semiconductor surface of the first vertical semiconductor channel 61, and directly on the second outer semiconductor channel layer 621. In case the second memory cavity 249' in each second-tier memory opening is not completely filled by the second inner semiconductor channel layer 622, a second dielectric core layer 262L can be deposited in the second memory cavity 249' to fill any remaining portion of the second memory cavity 249' within each second-tier memory opening. The processing steps of FIG. 11D may be employed.

Figure 29E:
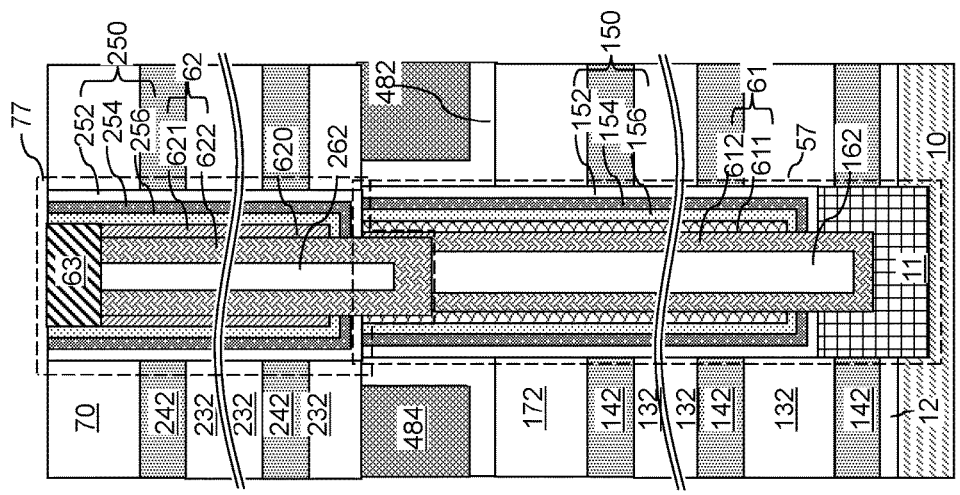
FIG. 29E is a vertical cross-sectional view of the region of the fourth exemplary structure after formation of a second vertical semiconductor channel and a second dielectric core according to the fourth embodiment of the present disclosure.

Referring to FIG. 29E, the horizontal portion of the second dielectric core layer 262L can be removed, for example, by a recess etch from above the top surface of the second-tier insulating cap layer 70, for example, employing the processing steps of FIG. 11E. Each adjoining pair of a second outer semiconductor channel layer 621 and a second inner semiconductor channel layer 622 can collectively form a second vertical semiconductor channel 62 through which electrical current can flow when a vertical NAND device including the second vertical semiconductor channel 62 is turned on. The second vertical semiconductor channel 62 can be formed directly on a vertically recessed surface of the first vertical semiconductor channel 61.

Figure 29F:
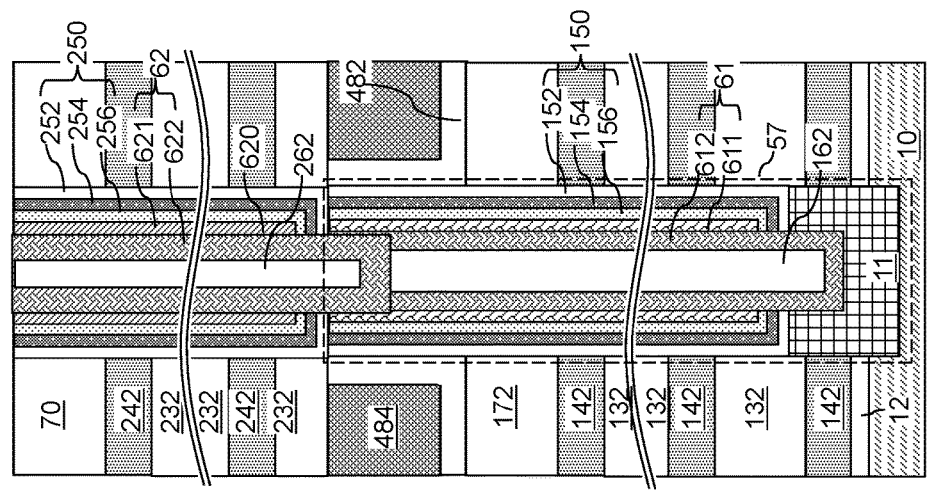
FIG. 29F is a vertical cross-sectional view of the region of the fourth exemplary structure after formation of a drain region according to the fourth embodiment of the present disclosure.

Referring to FIG. 29F, the top surface of each second dielectric core 262 can be recessed below the top surface of the insulating cap layer 70, for example, by a recess etch to a depth that is located between the top surface of the insulating cap layer 70 and the bottom surface of the insulating cap layer 70. Drain regions 63 can be formed by depositing a doped semiconductor material within each recessed region above the second dielectric cores 262 employing the processing steps of FIG. 11F.

Each combination of a first memory film 150 and a first vertical semiconductor channel 61 (which is a lower portion of the vertical semiconductor channel) within a first-tier memory opening 149 constitutes a first-tier memory stack structure (150, 61). Each combination of a second memory film 250 and a second vertical semiconductor channel 62 (which is an upper portion of the vertical semiconductor channel) within a second-tier memory opening 249 constitutes a second-tier memory stack structure (250, 62). Each contiguous combination of a first vertical semiconductor channel 61 and a second vertical semiconductor channel 62 constitutes a vertical semiconductor channel (61, 62). Each combination of an epitaxial channel portion 11 (if present), a first-tier memory stack structure (150, 61), a first dielectric core 162, a second-tier memory stack structure (250, 62), a second dielectric core 262, and a drain region 63 within an inter-tier memory opening is herein referred to as a memory opening fill structure (57, 77), or an inter-tier memory opening fill structure. Each combination of an epitaxial channel portion 11 (if present), a first-tier memory stack structure (150, 61), a first dielectric core 162, a second-tier memory stack structure (250, 62), a second dielectric core 262, and a drain region 63 within an inter-tier support opening is herein referred to as a support opening fill structure (17, 37), or an inter-tier support opening fill structure.

Subsequently, the processing steps of FIGS. 13A, 13B, 14A, 14B, 15A, and 15B can be performed. The joint-level spacer material layer 484 is removed during removal of the first and second sacrificial material layers (142, 242). Removal of the joint-level spacer material layer 484 and the first and second sacrificial material layers (142, 242) is selective to the dielectric liner layer 482. Thus, the backside blocking dielectric layer 44 can be deposited directly on the dielectric liner layer 482. After formation of the backside blocking dielectric layer 44, a joint-level electrically conducive layer 346 can be formed in the remaining volume of the backside cavity 43 that is formed by removal of the joint-level spacer material layer 484. FIG. 29G illustrates the fourth exemplary structure at the processing steps of FIG. 14B. Subsequently, the processing steps of FIGS. 17A, 17B, 18A, and 18B can be performed.

The fourth exemplary structure comprises a three-dimensional memory device. The three-dimensional memory device comprises: a first alternating stack (132, 146) of first insulating layers 132 and first electrically conductive layers 146 located over a substrate (91, 10); a joint-level electrically conductive layer 346 overlying the first alternating stack (132, 146); a first memory stack structure (150, 61) extending through the first alternating stack (132, 146) and the joint-level electrically conductive layer 346 and comprising a first memory film 150 and a first vertical semiconductor channel 61 that is laterally surrounded by the first memory film 150; a dielectric liner layer 482 including a horizontal portion that overlies the first alternating stack (132, 146) and underlies the joint-level electrically conductive layer 346, and a cylindrical vertical portion that laterally surrounds an upper portion of the first memory stack structure (150, 61), wherein the joint-level electrically conductive layer 346 is laterally spaced from the first memory stack structure (150, 61) by the cylindrical vertical portion of the dielectric liner layer 482; a second alternating stack (232, 246) of second insulating layers 232 and second electrically conductive layers 246 located over the joint-level electrically conductive layer 346 and the dielectric liner layer 482; and a second memory stack structure 77 comprising a second memory film 250 and a second vertical semiconductor channel 62 that is laterally surrounded by the second memory film 250 and extends through the second alternating stack (232, 246) and contacting the first vertical semiconductor channel 61.

In one embodiment, a bottommost surface of the second memory film 250 contacts a topmost surface of the first memory film 150 within a horizontal plane including a bottommost surface of the second alternating stack (232, 246), and a bottommost surface of the second vertical semiconductor channel 62 is located below the horizontal plane and physically contacts the first vertical semiconductor channel 61.

In one embodiment, an inner sidewall of the dielectric liner layer 482 contacts an outer sidewall of the first memory film 150, an annular top surface of the dielectric liner layer 482 contacts a bottom surface of the second alternating stack (232, 246), and the first memory film 150 and the second memory film 250 physically contact each other.

In one embodiment, the three-dimensional memory structure comprises a backside blocking dielectric layer 44 located between each vertically neighboring pair of an insulating layer selected from the first and second insulating layers (132, 232) and an electrically conductive layer selected from the first and second electrically conductive layers (146, 246). The backside blocking dielectric layer 44 contacts outer sidewalls of the first memory film 150 and the second memory film 250, a top surface of the horizontal portion of the annular dielectric spacer, an outer sidewall of the cylindrical vertical portion of the annular dielectric spacer, and a bottommost surface of the second alternating stack.

Referring to each of the exemplary structures of the present disclosure and alternative embodiments thereof, each three-dimensional memory device of the present disclosure can comprise a monolithic three-dimensional NAND memory device. The first and second electrically conductive layers (146, 246) can comprise, or can be electrically connected to, a respective word line of the monolithic three-dimensional NAND memory device. However, the at least one joint-level electrically conductive layers 346 does not comprise, and is not electrically connected to, any word line of the monolithic three-dimensional NAND memory device. Each of the at least one joint-level electrically conductive layers 346 is only capacitively coupled to the at least one doped semiconductor portion {(173, 179), (173, 273, 373), 173} or the first vertical semiconductor channel 61, and controls the electrical current through the vertical semiconductor channel of each vertical NAND string.

In one embodiment, a terrace region can be provided, in which each electrically conductive layer (146, 246) other than a topmost electrically conductive layer within the first and second alternating stacks (132, 146, 232, 246) laterally extends farther than any overlying electrically conductive layer within the first and second alternating stacks (132, 146, 232, 246). The terrace region includes stepped surfaces of the first and second alternating stacks (132, 146, 232, 246) that continuously extend from a bottommost layer within the first and second alternating stacks (132, 146, 232, 246) to a topmost layer within the first and second alternating stacks (132, 146, 232, 246). Each subset of the first and second support pillar structures (227, 155) extends through the stepped surfaces and through a respective retro-stepped dielectric material portion (165 or 265) that overlies the stepped surfaces.

Each of the word line contact via structures (which is a subset of the layer contact via structures 86 that contact the first and second electrically conductive layers (146, 246)) can contact a respective electrically conductive layer among the first and second electrically conductive layers (146, 246) in the terrace region.

Each of the first and second exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a memory material layer 54 at a level of an electrically conductive layer (146, 246)) in a first device level of the array of monolithic three-dimensional NAND strings can be located over another memory cell (as embodied as another portion of the memory material layer 54 at a level of another electrically conductive layer (146, 246)) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 61, 62), wherein at least one end portion 60 of each of the plurality of semiconductor channels (59, 11, 61, 62) extends substantially perpendicular to a top surface of the substrate (9, 10); and a plurality of charge storage elements (as embodied as portions of the memory material layer located at levels of the electrically conductive layers 46). Each charge storage element can be located adjacent to a respective one of the plurality of semiconductor channels (59, 11, 61, 62).

Impact of misalignment of memory stack structures in different tier structures can be alleviated by providing a joint-level electrically conductive layer 346 that functions as a dummy electrode that is not coupled to any charge storage element. The at least one doped semiconductor portion {(173, 179), (173, 273, 373), 173} or the dielectric liner layer 482 provide a robust alignment and connection scheme between each pair of a first memory opening fill structure 57 and a second memory opening fill structure 77. Further, the at least one joint-level electrically conductive layer 346 provides additional control for the channel current through each vertical semiconductor channel of the vertical NAND strings.

The methods of the present disclosure can be employed in conjunction with other integrations schemes that provide vertical stacking of multiple tier structures, each including an alternating stack of insulating layers and electrically conductive layers. For example, a subset of tier structures within a three-dimensional memory device may employ landing pads that are formed in a topmost insulating layer. In this case, tier-level memory openings can be formed through a respective alternating stack for at least one tier structure, and the top of each tier-level memory openings can be widened to provide landing pad regions. The tier-level memory openings including the widened portions can be filled with a sacrificial material, and an upper tier structure can be formed thereabove. Additional memory openings can be formed through the upper tier structure, and the sacrificial material can be removed to form inter-tier memory openings that extend through multiple tier structures. While misalignment between vertically adjacent openings are typically accumulative, use of the landing pads can be a cost-effective approach for providing multi-tier memory structures. By combining the methods of the present disclosure in combination with such integration schemes that provide vertical stacking through use of the landing pads, the advantage of the present disclosure can be further utilized.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    a first alternating stack of first insulating layers and first electrically conductive layers located over a substrate;
    a first memory opening fill structure extending through the first alternating stack and comprising a first memory film and a first vertical semiconductor channel that is laterally surrounded by the first memory film;
    a joint-level electrically conductive layer overlying the first alternating stack;
    at least one joint-level doped semiconductor portion contacting a top surface of the first vertical semiconductor channel and located within, and electrically isolated from, the joint-level electrically conductive layer;
    a second alternating stack of second insulating layers and second electrically conductive layers located over the joint-level electrically conductive layer;
    a second memory opening fill structure extending through the second alternating stack and comprising a second memory film and a second vertical semiconductor channel that is laterally surrounded by the second memory film and vertically extends into the at least one joint-level doped semiconductor portion, wherein the first memory film and the second memory film are vertically spaced from each other by the at least one joint-level doped semiconductor portion;
    a first annular dielectric spacer having a first material composition, contacting a top surface of the first memory film, and laterally surrounding the at least one joint-level doped semiconductor portion; and
    a second annular dielectric spacer having a second material composition, contacting at least one of a top surface and an outer sidewall of the first annular dielectric spacer and a bottom surface of the second alternating stack, and laterally surrounding the at least one joint-level doped semiconductor portion, wherein the second material composition is different from the first material composition.

2. The three-dimensional memory device of claim 1, wherein the first annular dielectric spacer is located at a same level as, and laterally surrounded by, the joint-level electrically conductive layer.

3. The three-dimensional memory device of claim 2, further comprising:
    a joint-level insulating layer overlying the joint-level electrically conductive layer;
    an additional joint-level electrically conductive layer overlying the joint-level insulating layer and underlying the second alternating stack,
    wherein the joint-level insulating layer and the additional joint-level electrically conductive layer are laterally spaced from the at the one joint-level doped semiconductor portion at least by a respective one of the first and second annular dielectric spacers.

4. The three-dimensional memory device of claim 3, wherein
    the at least one joint-level doped semiconductor portion comprises a first joint-level doped semiconductor portion and a second joint-level doped semiconductor portion.

5. The three-dimensional memory device of claim 3, wherein:
    the at least one joint-level doped semiconductor portion comprises a first joint-level doped semiconductor portion; a second joint-level doped semiconductor portion, and a third joint-level doped semiconductor portion;
    the first annular dielectric spacer and the first joint-level doped semiconductor portion are located at a level of the joint-level electrically conductive layer;
    the second annular dielectric spacer and the second joint-level doped semiconductor portion are located at a level of the joint-level insulator layer; and
    a third annular dielectric spacer and the third joint-level doped semiconductor portion are located at a level of the additional joint-level electrically conductive layer.

6. The three-dimensional memory device of claim 2, wherein:
    a bottommost surface of the at least one joint-level doped semiconductor portion contacts a top surface of the first vertical semiconductor channel;
    a topmost surface of the at least one joint-level doped semiconductor portion contacts a bottom surface of the second memory film;
    a recessed surface of the at least one joint-level doped semiconductor portion contacts a bottommost surface of the second vertical semiconductor channel; and
    the at least one annular dielectric spacer has greater lateral extent than the first memory film and the second memory film.

7. The three-dimensional memory device of claim 1, wherein:
    the three-dimensional memory device comprises a monolithic three-dimensional NAND memory device;
    the first and second electrically conductive layers comprise, or are electrically connected to, a respective word line of the monolithic three-dimensional NAND memory device;

the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the first and second electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate; and
a plurality of charge storage elements, each charge storage element located adjacent to a respective one of the plurality of semiconductor channels.

8. The three-dimensional memory device of claim 3, wherein:
the first annular dielectric spacer is present at a level of the joint-level electrically conductive layer and is not present at levels of the joint-level insulating layer and the additional joint-level electrically conductive layer; and
the second annular dielectric spacer continuously extends from a horizontal plane including a bottom surface of the joint-level electrically conductive layer to the bottom surface of the second alternating stack.

9. The three-dimensional memory device of claim 3, wherein:
a first-tier insulating cap layer is located between the first alternating stack and the joint-level electrically conductive layer;
the first annular dielectric spacer is present at a level of the joint-level electrically conductive layer and is not present at levels of the joint-level insulating layer and the additional joint-level electrically conductive layer; and
the second annular dielectric spacer contacts a top surface of the first annular dielectric spacer, and does not directly contact the first-tier insulating cap layer.

10. The three-dimensional memory device of claim 1, wherein:
the first annular dielectric spacer comprises a dielectric oxide of a semiconductor material of a portion of the at least one joint-level doped semiconductor portion; and
the second annular dielectric spacer comprises a material selected from a dielectric metal oxide and a silicon oxide material having a different composition from the first annular dielectric spacer.

11. The three-dimensional memory device of claim 1, wherein an entire outer sidewall of the first annular dielectric spacer is in direct contact with an inner sidewall of the second annular dielectric spacer.

12. A three-dimensional memory device comprising:
a first alternating stack of first insulating layers and first electrically conductive layers located over a substrate;
a first memory opening fill structure extending through the first alternating stack and comprising a first memory film and a first vertical semiconductor channel that is laterally surrounded by the first memory film;
a joint-level electrically conductive layer overlying the first alternating stack;
at least one joint-level doped semiconductor portion contacting a top surface of the first vertical semiconductor channel and located within, and electrically isolated from, the joint-level electrically conductive layer;
a second alternating stack of second insulating layers and second electrically conductive layers located over the joint-level electrically conductive layer; and
a second memory opening fill structure extending through the second alternating stack and comprising a second memory film and a second vertical semiconductor channel that is laterally surrounded by the second memory film and vertically extends into the at least one joint-level doped semiconductor portion, wherein the first memory film and the second memory film are vertically spaced from each other by the at least one joint-level doped semiconductor portion, wherein:
the at least one joint-level doped semiconductor portion comprises a first joint-level doped semiconductor portion and a second joint-level doped semiconductor portion that overlies the first joint-level doped semiconductor portion; and
the first joint-level doped semiconductor portion and the second joint-level doped semiconductor portion have different compositions.

13. The three-dimensional memory device of claim 12, wherein the first joint-level doped semiconductor portion and the second joint-level doped semiconductor portion include different semiconductor materials.

14. The three-dimensional memory device of claim 13, wherein each of the first joint-level doped semiconductor portion and the second joint-level doped semiconductor portion comprises a respective material selected from doped amorphous silicon, doped polysilicon, and doped silicon-germanium alloys.

15. The three-dimensional memory device of claim 12, wherein:
a top surface of a first annular dielectric spacer directly contacts a bottom surface of the second joint-level doped semiconductor portion; and
the second joint-level doped semiconductor portion has a greater lateral dimension than the first joint-level doped semiconductor portion.

16. The three-dimensional memory device of claim 12, wherein:
an inner sidewall of the first annular dielectric spacer directly contacts the first joint-level doped semiconductor portion; and
an inner sidewall of a second annular dielectric spacer laterally contacts the second joint-level doped semiconductor portion.

17. A three-dimensional memory device comprising:
a first alternating stack of first insulating layers and first electrically conductive layers located over a substrate;
a first memory opening fill structure extending through the first alternating stack and comprising a first memory film and a first vertical semiconductor channel that is laterally surrounded by the first memory film;
a joint-level electrically conductive layer overlying the first alternating stack;
at least one joint-level doped semiconductor portion contacting a top surface of the first vertical semiconductor channel and located within, and electrically isolated from, the joint-level electrically conductive layer;

a second alternating stack of second insulating layers and second electrically conductive layers located over the joint-level electrically conductive layer;

a second memory opening fill structure extending through the second alternating stack and comprising a second memory film and a second vertical semiconductor channel that is laterally surrounded by the second memory film and vertically extends into the at least one joint-level doped semiconductor portion, wherein the first memory film and the second memory film are vertically spaced from each other by the at least one joint-level doped semiconductor portion;

at least one annular dielectric spacer laterally surrounding the at least one joint-level doped semiconductor portion, and wherein each of the first annular dielectric spacer and the second annular dielectric spacer includes a respective portion located at a same level as, and laterally surrounded by, the joint-level electrically conductive layer; and conformal backside blocking dielectric layers comprising a dielectric material and located at each level of the first electrically conductive layers, the second electrically conductive layers, and the joint-level electrically conductive layer, wherein the joint-level electrically conductive layer is laterally spaced from the at least one joint-level doped semiconductor portion by a layer stack of a vertical portion of one of the conformal backside blocking dielectric layer and the at least one annular dielectric spacer.

18. The three-dimensional memory device of claim 17, wherein the at least one annular dielectric spacer comprises:
a first annular dielectric spacer having a first material composition, contacting a top surface of the first memory film, and laterally surrounding the at least one joint-level doped semiconductor portion; and
a second annular dielectric spacer having a second material composition, contacting at least one of a top surface and an outer sidewall of the first annular dielectric spacer and a bottom surface of the second alternating stack, and laterally surrounding the at least one joint-level doped semiconductor portion, wherein the second material composition is different from the first material composition.

19. The three-dimensional memory device of claim 17, wherein the joint-level electrically conductive layer comprises a material that is different from any semiconductor material in the at least one joint-level doped semiconductor portion.

20. The three-dimensional memory device of claim 17, further comprising:
a joint-level insulating layer overlying the joint-level electrically conductive layer;
an additional joint-level electrically conductive layer overlying the joint-level insulating layer and underlying the second alternating stack,
wherein the joint-level insulating layer and the additional joint-level electrically conductive layer are laterally spaced from the at the one joint-level doped semiconductor portion by the at least one annular dielectric spacer.

* * * * *